(12) United States Patent
Kawashima et al.

(10) Patent No.: US 7,087,955 B2
(45) Date of Patent: Aug. 8, 2006

(54) SEMICONDUCTOR DEVICE AND A METHOD OF MANUFACTURING THE SAME

(75) Inventors: Yoshiyuki Kawashima, Hitachinaka (JP); Fumitoshi Ito, Hamura (JP); Takeshi Sakai, Hitachinaka (JP); Yasushi Ishii, Mito (JP); Yasuhiro Kanamaru, Hitachinaka (JP); Takashi Hashimoto, Iruma (JP); Makoto Mizuno, Tokyo (JP); Kousuke Okuyama, Kawagoe (JP)

(73) Assignee: Renesas Technology Corp., Tokyo (JP)

( * ) Notice: Subject to any disclaimer, the term of this patent is extended or adjusted under 35 U.S.C. 154(b) by 231 days.

(21) Appl. No.: 10/811,830

(22) Filed: Mar. 30, 2004

(65) Prior Publication Data

US 2004/0188753 A1   Sep. 30, 2004

(30) Foreign Application Priority Data

Mar. 31, 2003   (JP) ............................. 2003-094517

(51) Int. Cl.
*H01L 29/788* (2006.01)

(52) U.S. Cl. ...................... 257/316; 257/319; 257/321; 257/324; 257/326; 257/315; 257/311; 257/322; 257/257

(58) Field of Classification Search ................ 257/316, 257/319, 321, 324, 326, 315, 311, 322
See application file for complete search history.

(56) References Cited

U.S. PATENT DOCUMENTS

| 4,495,693 | A | * | 1/1985 | Iwahashi et al. ............ 438/258 |
| 5,838,041 | A | | 11/1998 | Sakagami et al. |
| 5,872,034 | A | * | 2/1999 | Schlais et al. ............... 438/257 |
| 5,969,383 | A | | 10/1999 | Chang et al. |
| 6,135,905 | A | * | 10/2000 | Soon ........................... 474/82 |
| 6,194,270 | B1 | * | 2/2001 | Bottini et al. ............... 438/258 |
| 6,204,123 | B1 | * | 3/2001 | Mori ........................... 438/259 |
| 6,287,911 | B1 | * | 9/2001 | Nobusawa ................... 438/241 |
| 6,335,554 | B1 | * | 1/2002 | Yoshikawa ................... 257/316 |
| 6,632,715 | B1 | * | 10/2003 | Koishikawa ................. 438/258 |
| 6,717,204 | B1 | * | 4/2004 | Furuhata et al. ............. 257/316 |
| 2001/0044183 | A1 | * | 11/2001 | Io ................................ 438/257 |

FOREIGN PATENT DOCUMENTS

| JP | 05-267250 | 10/1993 |
| JP | 06-085251 | 3/1994 |
| JP | 06-125094 | 10/1994 |

(Continued)

*Primary Examiner*—B. William Baumeister
*Assistant Examiner*—Victor V Yevsikov
(74) *Attorney, Agent, or Firm*—Antonelli, Terry, Stout and Kraus, LLP.

(57) ABSTRACT

A semiconductor device has a nonvolatile memory employing a split-gate type memory cell structure, using a nitride film as a charge storage layer. An n-type semiconductor region is formed in a main surface of a semiconductor substrate, and then, a memory gate electrode of a memory cell of a split gate type and a charge storage layer are formed over the semiconductor region. Subsequently, side walls are formed on side surfaces of the memory gate electrode, and a photoresist pattern is formed over the main surface of the semiconductor substrate. The photoresist pattern serves as an etching mask, and a part of the main surface of the semiconductor substrate is removed by etching to form a dent. In the region of the dent, the n-type semiconductor region is removed. Then, a p-type semiconductor region for forming a channel of an nMIS transistor for selecting a memory cell is formed.

25 Claims, 52 Drawing Sheets

FOREIGN PATENT DOCUMENTS

| | | |
|---|---|---|
| JP | 2000-091452 | 3/2000 |
| JP | 2001-168219 | 6/2001 |
| JP | 2002-288591 | 10/2002 |
| JP | 2003-046002 | 2/2003 |

* cited by examiner

FIG. 3

|    | Vd(V) | Vcg(V) | Vmg(V) | Vs(V) | Vsub(V) |
|----|-------|--------|--------|-------|---------|
| Re | 1     | 1.5    | 0      | 0     | 0       |
| Er | 0     | 1.5    | 14     | 0     | 0       |
| Wr | 0     | 1.5    | 12     | 6     | 0       |

1Sub: SEMICONDUCTOR SUBSTRATE
  6: n-TYPE SEMICONDUCTOR REGION
  8: SIDE WALLS
CSL: CHARGE STORAGE LAYER
MG: MEMORY GATE ELECTRODE
 13: DENT

SEMICONDUCTOR DEVICE AND A METHOD OF MANUFACTURING THE SAME

CROSS-REFERENCE TO RELATED APPLICATION

The present application claims priority from Japanese patent application JP 2003-094517, filed on Mar. 31, 2003, the content of which is hereby incorporated by reference into this application.

BACKGROUND OF THE INVENTION

The present invention relates to a method of manufacturing a semiconductor device and to a semiconductor device technique; and, more particularly, the invention relates to a technique which is effective when applied to a semiconductor device having a nonvolatile memory and a method of manufacturing the same.

An electrically rewritable nonvolatile memory, such as an EEPROM (Electrically Erasable Programmable Read Only Memory) or a flash memory, can perform on-board program rewriting. Consequently, the development period of a program can be shortened and the development efficiency can be improved. In addition, a nonvolatile memory is capable of various uses, such as in the production of a variety of products, each of which is low in volume, and is subject to changes for each destination and updating of a program after shipment. Particularly, in recent years, there has been an increasing need for a microcomputer having therein an MPU (Micro Processing Unit) and an EEPROM (or flash memory). As an electrically rewritable nonvolatile memory, an EEPROM whose floating electrode is made of normal polysilicon is mainly used. In an EEPROM having this structure, however, when there is a defect in a part of the oxide film surrounding the floating gate electrode, since the charge storage layer is formed of a conductor, all of the charges stored in a storage node may escape due to abnormal leakage. Particularly, with a further reduction in the size and an increase in the packing density, as is expected in the future, it is considered that this problem will become more conspicuous.

In recent years, attention has been given to an MNOS (Metal Nitride Oxide Semiconductor) structure and an MONOS (Metal Oxide Nitride Oxide Semiconductor) structure each having a nitride film ($Si_3N_4$ and the like) as a charge storage layer. In this case, charges contributing to data storage are stored in discrete traps in the nitride film, which serves as an insulator. Consequently, even if a defect occurs in a part of an oxide film surrounding a storage node and an abnormal leakage occurs, all of the charges in the charge storage layer do not escape. Thus, the reliability of data retention can be improved.

With respect to the configuration of a memory cell, a memory cell having a single transistor structure has been proposed. Proposed writing/erasing methods include a method of writing data by FN (Fowler-Nordheim) tunneling injection from a semiconductor substrate to the whole surface, a method of erasing data by passing FN tunnel current to the semiconductor substrate and, in addition, a method of writing data by injecting hot electrons and erasing data by passing FN tunnel current to the semiconductor substrate or source/drain regions. Further, in the case of an MONOS type single transistor cell structure, the structure is disturbed more easily as compared with an EEPROM cell structure, so that a split-gate type memory cell structure of a 2-transistor configuration having a control gate electrode also has been proposed. As split-gate memory cell structures of this kind, a structure in which a control gate electrode is provided over a memory gate electrode, a structure in which the memory gate electrode is provided over the control gate electrode, a structure in which the memory gate is provided over the control gate by using a side wall, and the like, can be realized in accordance with a process.

For example, Japanese Unexamined Patent Publication No. Hei 6 (1994)-85251 discloses a technique of forming not a memory cell, but a gate electrode of an MOSFET, and etching surface layer parts of a semiconductor substrate positioned on both sides of the gate electrode, thereby forming a step between a channel region and each of the source and drain regions (Patent Document 1).

Japanese Unexamined Patent Publication No. Hei 5(1993)-267250 discloses a technique, in a process of manufacturing a flash memory, of forming side walls on side surfaces of each of neighboring gate electrodes (floating gates) and partly etching a field insulating film provided as a lower layer and a semiconductor substrate by using the gate electrode and the side walls as a mask to thereby form a trench (Patent Document 2).

Japanese Unexamined Patent Publication No. 2000-91452 discloses a configuration in which offset side walls are provided on side surfaces on the channel side of an insulating film pattern over buried regions for a source and a drain of a memory cell transistor to thereby suppress expansion of the channel of the memory cell transistor so that data is not written/read to/from a not-selected memory transistor adjacent to a selected memory cell transistor when a nonvolatile memory having the MONOS structure operates (Patent Document 3).

Japanese Unexamined Patent Publication No. Hei 6 (1994)-125094 discloses a configuration in which an offset region is provided between an ONO film of a memory cell transistor and a gate electrode and a source region (Patent Document 4).

Japanese Unexamined Patent Publication No. 2001-168219 discloses a configuration in which a step is formed in a channel of a memory cell transistor having an MONOS structure, and channel hot electron injection is performed via the step. In the paragraph number 0038 in the publication, it is described that a gate electrode of a memory cell transistor from which charges are extracted by using FN tunnel current, thereby erasing data, is made of polysilicon, which is made conductive by being highly doped with p-type or n-type impurity (Patent Document 5).

Japanese Unexamined Patent Publication No. 2002-298591 discloses a configuration in which a threshold voltage of a memory cell is set to be higher than the lower one of the voltages applied to a source and a drain at the time of reading data, and is set to be lower than the voltage applied to the gate electrode at the time of reading data, in order to suppress or prevent the destruction of data when the threshold voltage of a not-selected memory cell increases due to repetition of a reading operation of an EEPROM (Patent Document 6).

[Patent Document 1]

Japanese Unexamined Patent Publication No. Hei 6 (1994)-85251

[Patent Document 2]

Japanese Unexamined Patent Publication No. Hei 5 (1993)-267250

[Patent Document 3]

Japanese Unexamined Patent Publication No. 2000-91452

[Patent Document 4]

Japanese Unexamined Patent Publication No. Hei 6 (1994)-125094

[Patent Document 5]

Japanese Unexamined Patent Publication No. 2001-168219

[Patent Document 6]

Japanese Unexamined Patent Publication No. 2002-298591

SUMMARY OF THE INVENTION

The nonvolatile memory employing a split-gate type memory cell structure and using a nitride film as a charge storage layer is a new structure. One of the objectives of a semiconductor device having the nonvolatile memory is to provide improved electrical characteristics.

An object of the present invention is to provide a technique that is capable of improving the electrical characteristics of a semiconductor device having a nonvolatile memory employing a split-gate type memory cell structure and using a nitride film as a charge storage layer.

The above and other objects and novel features of the present invention will become apparent from the following description and the attached drawings.

An outline of representative of the invention disclosed in this specification will be briefly described as follows.

According to the invention, a nonvolatile memory cell having first and second field effect transistors disposed so as to be adjacent to each other is provided for a semiconductor substrate. A part disposed in a region for forming the second field effect transistor, of a first semiconductor region of a first conduction type of the first field effect transistor which is already formed in the semiconductor substrate is etched. After that, in the etched region, a second semiconductor region of a second conduction type opposite to the first conduction type of the second field effect transistor is formed.

According to the invention, a nonvolatile memory cell having first and second field effect transistors disposed so as to be adjacent to each other is provided for a semiconductor substrate. A second semiconductor region of a second conduction type opposite to a first conduction type is formed below a second gate electrode of the second field effect transistor so that an end portion on the side of the second field effect transistor, of a first semiconductor region of the first conduction type below the first gate electrode of the first field effect transistor is recessed from or coincides with an end portion of the second gate electrode of the second field effect transistor.

The invention provides a semiconductor device having a nonvolatile memory cell including a gate electrode and a charge storage layer, in which the gate electrode is processed and, after that, over-etching is performed so that a side surface at an end portion of the charge storage layer is positioned below a side surface at an end portion of the gate electrode.

According to the invention, a nonvolatile memory cell having a structure such that one of first and second gate electrodes of first and second field effect transistors disposed so as to be adjacent to each other is provided over the other gate electrode. Before a conductive film for forming the one of the gate electrodes is deposited, a protection film is formed on the side surface of the other gate electrode and over a main surface of the semiconductor substrate on the side where the one of gate electrodes is not provided over the other gate electrode.

The invention provides a semiconductor device having a nonvolatile memory cell in which data is erased by extracting charges stored in a charge storage layer to the side of an n-type gate electrode, wherein concentration of n-type impurity in a first region on the side of the charge storage layer in the n-type gate electrode is set to be lower than the concentration of n-type impurity in a second region other than the first region in the n-type gate electrode.

The invention provides a semiconductor device having a nonvolatile memory cell in which data is erased by extracting charges stored in a charge storage layer to a gate electrode side, wherein the lowest write level is higher than an initial threshold voltage of the nonvolatile memory cell.

BRIEF DESCRIPTION OF THE DRAWINGS

FIG. 3 is a table showing an example of values of voltages applied to components in operations of reading, erasing and writing data from/to the memory cell shown in FIGS. 1 and 2;

DETAILED DESCRIPTION OF THE PREFERRED EMBODIMENTS

Figure 1:
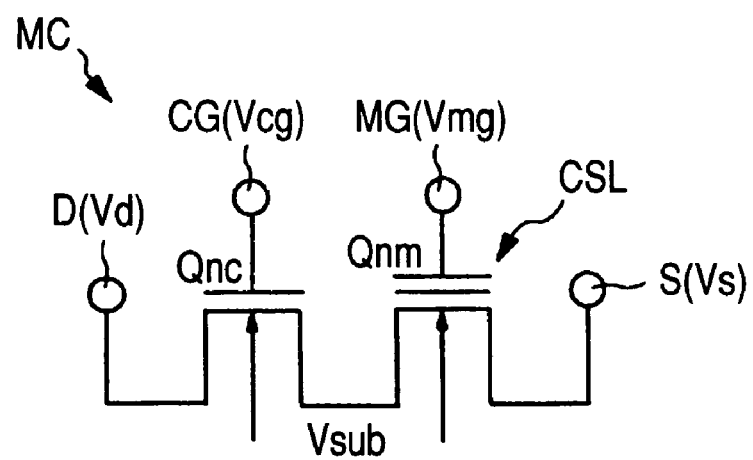
FIG. 1 is a circuit diagram of a memory cell in a semiconductor device according to an embodiment of the invention.

Prior to presenting a detailed description of the embodiments of the invention, the terms used in describing the embodiments will be explained as follows.

"Silicon nitride" includes not only $Si_3N_4$ but also an insulating film having a composition similar to a silicon nitride.

The embodiments of the invention will be described in detail hereinbelow with reference to the drawings. In the following description of the embodiments, as necessary, an embodiment may be described as being divided into a plurality of sections or a plurality of embodiments. Unless otherwise specified, they are not independent of each other. One of the embodiments may represent a modification, the details, a complementary explanation, and the like of a part or all of the other embodiments.

In the following description of the embodiments, in the case of mentioning a number of elements and the like (including the number of pieces, a numerical value, an amount, a range and the like), except for the case where it is explicitly written and in the case where it is clearly limited to a specific number in theory, the number is not limited to the specific number, but may be larger or smaller than the specific number.

Further, in the following description of the embodiments, obviously, the components (including steps and the like) are not always indispensable, except for the case where the components are explicitly described or considered to be clearly indispensable in theory. Similarly, in the case of referring to a shape, a positional relation, and the like of the components in the embodiments, except for the case where it is explicitly written or the case where it is clearly considered to be different, a similar shape and the like are also included. The numerical values and ranges also include similar ones. In all of the drawings, the same reference numeral is appended to components having the same function, and a repetitive description thereof will not be given. In the drawings, hatching is sometimes provided even in a plan view for easier understanding.

In the following description of the embodiments, an MISFET (Metal Insulator Semiconductor Field Effect Transistor) as a representative field effect transistor will be simply written as MIS. A p-channel type MISFET and an n-channel type MISFET will be simply written as pMIS and nMIS, respectively. An MOSFET (Metal Oxide Semiconductor FET) is a field effect transistor in which a silicon oxide (such as $SiO_2$) film is used as a gate insulating film. It is assumed here that the MOSFET is included in the subordinate concept of the MIS.

First Embodiment

The inventors of the present invention have examined a semiconductor device having a nonvolatile memory, such as an EEPROM or a flash memory. Each of a plurality of memory cells of the nonvolatile memory has, for example, a two-transistor split-gate electrode structure, and an MONOS (Metal Oxide Nitride Oxide Semiconductor) structure using a nitride film (such as a silicon nitride film) as a charge storage layer for storing data is provided on the side of one of the transistors. In the case of employing the MONOS structure, a single-transistor memory cell is influenced by a disturbance more easily as compared with the case of the EEPROM structure. Consequently, in order to prevent the disturbance, the 2-transistor split-gate electrode structure is employed.

In the split-gate memory cell structure, at the time of erasing data, holes are injected from a semiconductor substrate into a charge storage layer or electrons are moved from the charge storage layer to the semiconductor substrate. Therefore, a negative power source circuit for applying a negative voltage to a memory gate electrode is necessary; it reduces the memory occupation ratio; and the manufacturing yield deteriorates. In the case of writing data with the FN tunnel current, there is a problem in that it is difficult to increase the writing speed. Therefore, at the time of writing data, write time is shortened by injecting electrons from the semiconductor substrate into a nitride film for storing charges by a hot electron injection method. At the time of erasing data, a positive voltage is applied to the memory gate electrode side to move electrons in the nitride film for storing charges to the memory gate electrode side, thereby enabling a power source circuit to be simplified. The memory cell structure capable of performing such a circuit operation, however, has not been specifically examined. In this embodiment, therefore, a case in which the invention is applied to a memory cell configuration capable of performing this circuit operation will be described. In the following embodiments, however, the invention is not limited to application to the memory cell structure having the circuit operation as described above, but can also be applied to memory cells performing various circuit operations.

FIG. 1 is a circuit diagram showing the memory cell MC. The memory cell MC has, for example, two transistors, including a transistor nMISQnc for selecting a memory cell (hereinbelow, simply called nMISQnc for selection) and a transistor nMISQnm for memory, connected between a drain electrode D and a source electrode S of the memory cell MC. The transistor nMISQnc for selection has a control gate electrode CG, and the transistor nMISQnm for memory has a memory gate electrode MG and a charge storage layer CSL. Reference numeral Vd indicates a drain voltage, Vcg indicates a control gate voltage, Vmg indicates a memory gate voltage, Vs denotes a source voltage, and Vsub denotes a substrate voltage.

Figure 2:
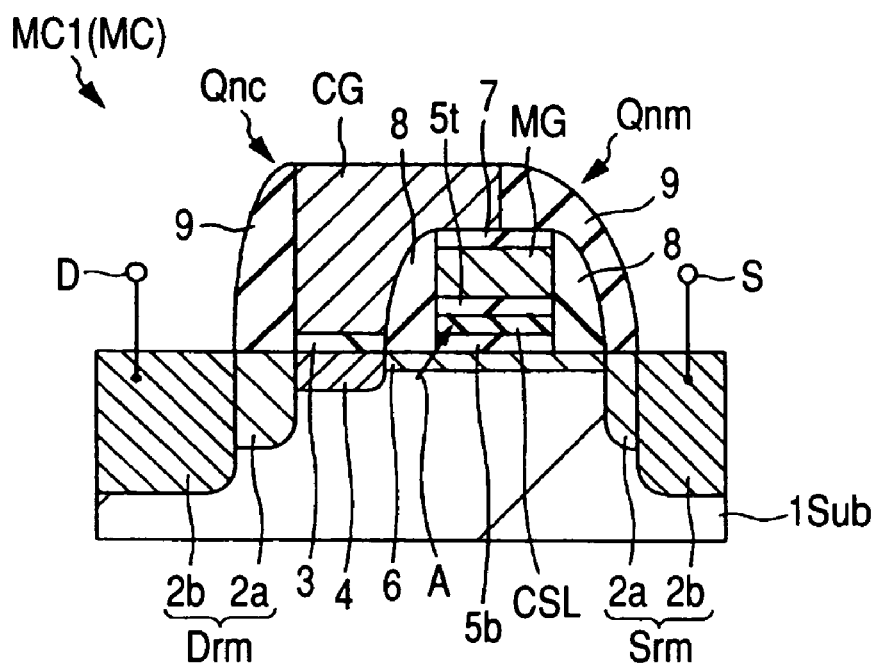
FIG. 2 is a cross section of a main portion of a device basic structure of the memory cell of FIG. 1.

FIG. 2 shows an example of a section of the basic device of the memory cell MC. A memory cell MC1 (MC) of a type in which a control gate electrode is provided over a memory gate electrode is illustrated. A semiconductor substrate (hereinbelow simply called a substrate) 1Sub is formed of, for example, p-type silicon (Si) single crystal. In the main surface (device formation surface) of the substrate, the transistor nMISQnc for selection and the transistor nMISQnm for memory of the memory cell MC1 are arranged. Each of a drain region Drm and a source region Srm of the memory cell MC1 has, for example, an n$^-$ type semiconductor region 2a and an n$^+$ type semiconductor region 2b having an impurity concentration higher than that of the semiconductor region 2a (an LDD (Lightly Doped Drain) structure). The n$^-$ type semiconductor region 2a is disposed on the channel region side of the memory cell MC, and the n$^+$ type semiconductor region 2b is disposed in a position spaced from the channel region side of the memory cell MC by an amount corresponding to the n$^-$ type semiconductor region 2a. Over the main surface of the substrate 1Sub, between the drain region Drm and the source region Srm, the control gate electrode CG of the transistor nMISQnc for selection and the memory gate electrode MG of the transistor nMISQnm for memory are disposed, so as to be adjacent to each other.

The control gate electrode CG and the memory gate electrode MG are made of, for example, n-type low-resistive polysilicon. A part of the control gate electrode CG is provided over the memory gate electrode MG side. Between the control gate electrode CG and the main surface of the substrate 1Sub, there is a gate insulating film 3, which is made of silicon oxide (SiO$_2$ and the like) and is as thin as about 2 to 3 nm. A p-type semiconductor region 4 is formed in the main surface of the substrate 1Sub below the gate insulating film 3. The semiconductor region 4 serves as a semiconductor region for forming the channel of the transistor nMISQnc for selection. By the semiconductor region 4, the threshold voltage of the transistor nMISQnc for selection is set to a predetermined value. The semiconductor region 4 has a function of increasing the threshold voltage of the transistor nMISQnc for selection. The semiconductor region 4 is doped with boron (B).

On the other hand, between the memory gate electrode MG and the main surface of the substrate 1Sub, the charge storage layer CSL is provided so as to be sandwiched by upper and lower insulating films 5t and 5b. The charge storage layer CSL is made of, for example, silicon nitride and has a thickness of, for example, 50 nm or less. The material of the charge storage layer CSL is not limited to silicon nitride and can be variously changed. For example, an insulating material that is capable of generating a trap level, such as alumina (Al$_2$O$_3$), can be used. The insulating films 5b and 5t are made of, for example, silicon oxide. The thickness of the insulating film 5b is, for example, about 2 to 6 nm. The thickness of the insulating film 5t is, for example, about 10 to 17 nm. The insulating film 5t may be made of silicon oxinitride (SiON).

Each of the insulating films 5b and 5t can be formed as a silicon oxide film containing nitrogen. This method has, however, a problem. In an oxidizing process for forming a silicon oxide film as a gate insulating film of an MIS formed in an MIS formation region around the transistor nMISQnc for selection or a memory cell after the transistor nMISQnm for memory is formed, the substrate 1Sub made of silicon and the memory gate electrode MG made of polysilicon are oxidized, thereby increasing the film thickness in end portions of the insulating films 5b and 5t. The transistor nMISQnm for memory, as in this embodiment, performs a writing operation by injecting electrons from the substrate 1Sub to the charge storage layer CSL and an erasing operation by moving the electrons from the charge storage layer CSL to the memory gate electrode MG. Consequently, an increase in the thickness of the insulating films 5b and 5t in the end portions of the memory gate electrode MG causes erroneous writing/erasing. By forming each of the insulating films 5b and 5t as a silicon oxide film containing nitrogen, excessive formation of the silicon oxide film in end portions of the insulating films 5b and 5t can be prevented.

As a specific method, after formation of the insulating film 5b, for example, oxynitride (NO) annealing is performed to introduce nitrogen to the substrate 1Sub side of the insulating film 5b. It can prevent an increase in the thickness of the end portion of the insulating film 5b in another oxidizing process. By performing either a nitrogen plasma process after formation of the insulating film 5t or oxynitride (NO) annealing after deposition of a conductive film, which becomes the memory gate electrode MG, nitrogen can be introduced to the conductive film side of the insulating film 5t. It can prevent an increase in the thickness of the end portion of the insulating film 5t at the time of another oxidizing process.

Further, by forming the transistor nMISQnc for selection or a gate insulating film (silicon oxide film) of the MIS near a memory cell by CVD, the temperature of film formation can be made lower than that in a thermal oxidizing process. Thus, excessive formation of a silicon oxide film in end portions of the insulating films 5b and 5t can be further prevented.

An n-type semiconductor region 6 is formed below the insulating film 5b and on the main surface of the substrate 1Sub between the p-type semiconductor region 4 and the source region Srm. The semiconductor region 6 serves as a semiconductor region for forming the channel of the transistor nMISQnm for memory. By the semiconductor region 6, the threshold voltage of the transistor nMISQnm for memory is set to a predetermined value. The semiconductor region 6 has a function of decreasing the threshold voltage of the transistor nMISQnm for memory. The semiconductor region 6 is doped with, for example, arsenic (As) or phosphorus (P). An insulating film 7 made of, for example, silicon oxide is provided on the top surface of the memory gate electrode MG.

On side surfaces of the memory gate electrode MG, the insulating films 5t and 5b, and the charge storage layer CSL, side walls 8 made of, for example, silicon oxide are formed to thereby provide insulation between the memory gate electrode MG and the control gate electrode CG. Side walls 9 are formed so as to cover both side faces of the control gate electrode CG of the memory cell MC1, a part of the top surface of the insulating film 7, and the surface of the side wall 8 on the source region Srm side. The side walls 9 are made of, for example, silicon oxide and are members for mainly forming the n⁻ type semiconductor region 2a.

In the memory cell MC1, charges contributing to storage of data are injected from the substrate 1Sub to the trap level in the charge storage layer CSL in a position indicated by the arrow A. Since the charges are stored discretely, even if a defect occurs in a part of the oxide film (the insulating films 5b and 5t and the side walls 8) surrounding the charge storage layer CSL and abnormal leakage occurs, all of the charges in the charge storage layer CSL do not escape. Thus, the reliability of the data retention can be improved. Since the thickness of the upper and lower insulating films 5b and 5t of the charge storage layer CSL can be reduced, the voltage of the writing and erasing operations can be decreased. Since electrons are injected from the substrate 1Sub into the charge storage layer CSL by hot electron injection at the time of writing data, the electron injection efficiency is excellent, and high-speed writing with low current can be performed. On the other hand, at the time of erasing data, a positive voltage is applied to the memory gate electrode MG side and the electrons in the charge storage layer CSL are moved to the memory gate electrode MG side. Therefore, the control of the writing and erasing operations is easy, and the power source circuit and the peripheral circuit can be simplified (the scale can be reduced).

FIG. 3 shows an example of the values of the voltages applied to components in a reading operation Re, an erasing operation Er and a writing operation Wr of data from/to the memory cell MC in FIGS. 1 and 2.

In the data reading operation Re, for example, about 1V is applied to the drain electrode D (drain region Drm) of the selected memory cell MC, about 1.5V is applied to the control gate electrode CG, and about 0V is applied to the source electrode S (source region Srm) of the selected memory cell MC, the memory gate electrode MG, and the substrate 1Sub so as to turn on the transistor nMISQnc for selection of the memory cell MC. At this time, the threshold voltage of the transistor nMISQnm for memory changes according to the presence or absence of electrons in the charge storage layer CSL in the transistor nMISQnm for memory. Accordingly, current flows or does not flow between the drain region Drm and the source region Srm. On the basis of the current, the stored data is read.

In the data erasing operation Er, for example, 0V is applied to the drain electrode D (drain region Drm) and the source electrode S (source region Srm) in the selected memory cell MC and the substrate 1Sub in the selected memory cell MC, about 1.5V is applied to the control gate electrode CG, and about 14V is applied to the memory gate electrode MG. By the application of these voltages, the electrons in the charge storage layer CSL escape to the memory gate electrode MG side by tunnel discharge to thereby erase the data.

Further, for writing data, a source-side hot electron injecting method is employed. In the data writing operation Wr, for example, 0V is applied to the drain electrode D (drain electrode Drm) of the selected memory cell MC and the substrate 1Sub, about 1.5V is applied to the control gate electrode CG, about 12V is applied to the memory gate electrode MG, and about 6V is applied to the source electrode S (source region Srm) of the selected memory cell MC. By this operation, hot electrons generated in the channel in the memory cell MC are injected into the charge storage layer CSL to thereby write data.

Figure 4:
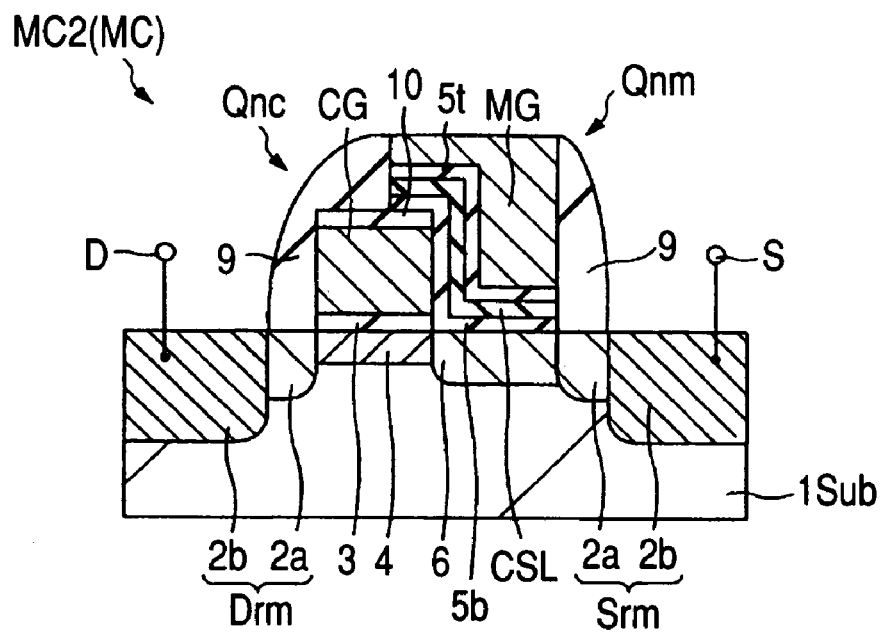
FIG. 4 is a cross section of a main portion of another example of a device basic structure of the memory cell of FIG. 1.
Figure 5:
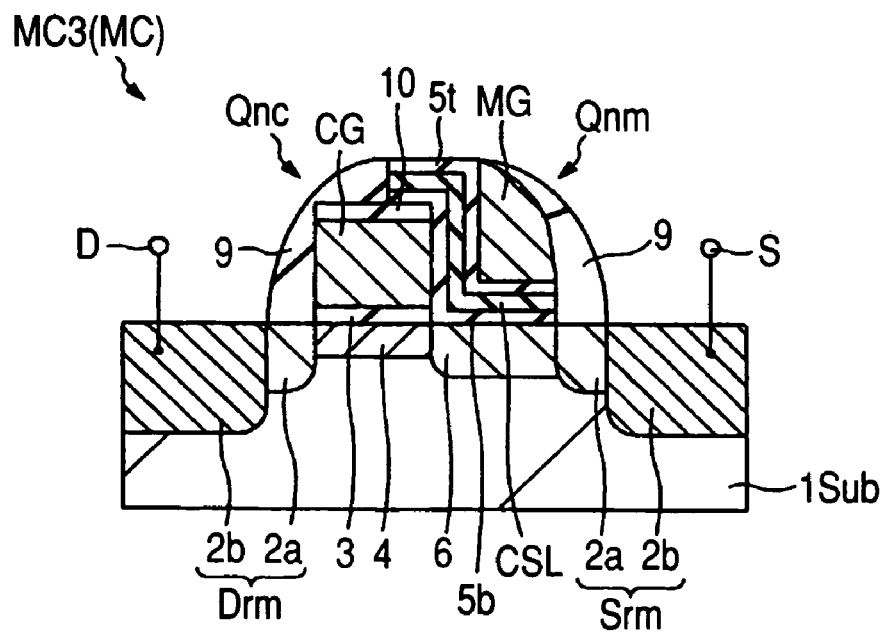
FIG. 5 is a cross section of a main portion of still another example of the device basic structure of the memory cell of FIG. 1.

FIGS. 4 and 5 show another example of a basic device section of the memory cell MC of the split-gate electrode type. FIG. 4 illustrates a memory cell MC2 (MC) of a type in which the memory gate electrode is formed over the control gate electrode. FIG. 5 illustrates a memory cell MC3 (MC) of a side-wall type in which the memory gate electrode is formed over the control gate electrode. In each of the memory cells MC2 and MC3 of FIGS. 4 and 5, a part of the memory gate electrode MG is formed over the control gate electrode CG. The control gate electrode CG and the memory gate electrode MG are insulated from each other by an insulating film 10 made of silicon oxide and the like on the top surface of the control gate electrode CG, the insulating films 5b and 5t, the charge storage layer CSL, and the like. Since the data reading, writing, and erasing operations in this case are similar to the above-described ones, the description thereof will not be repeated. A semiconductor device having such a memory cell is used for, for example, in an IC (Integrated Circuit) card (memory card).

The problem of the memory cells MC (MC1 to MC3) of the split-gate type shown in FIGS. 2, 4, and 5, which has been found by the inventors herein for the first time, will be described with reference to FIGS. 6 and 7.

Figure 6:
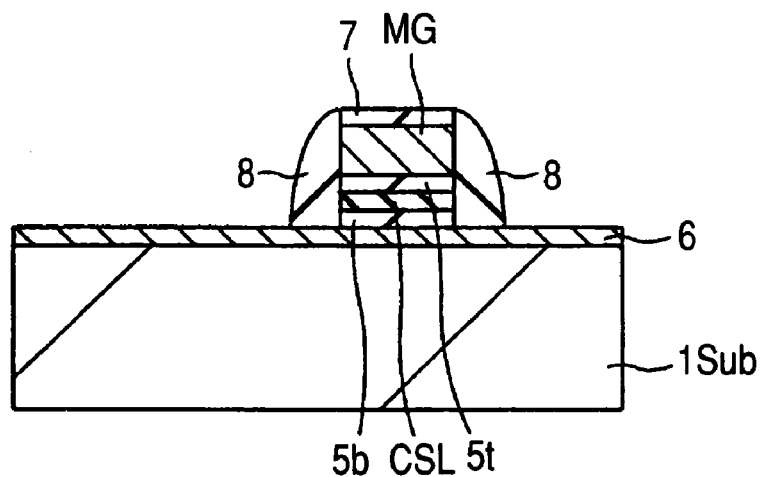
FIG. 6 is a cross section of a main portion during a process of manufacturing a semiconductor device, illustrating a problem which occurs in a process of forming the memory cell of FIG. 1.
Figure 7:
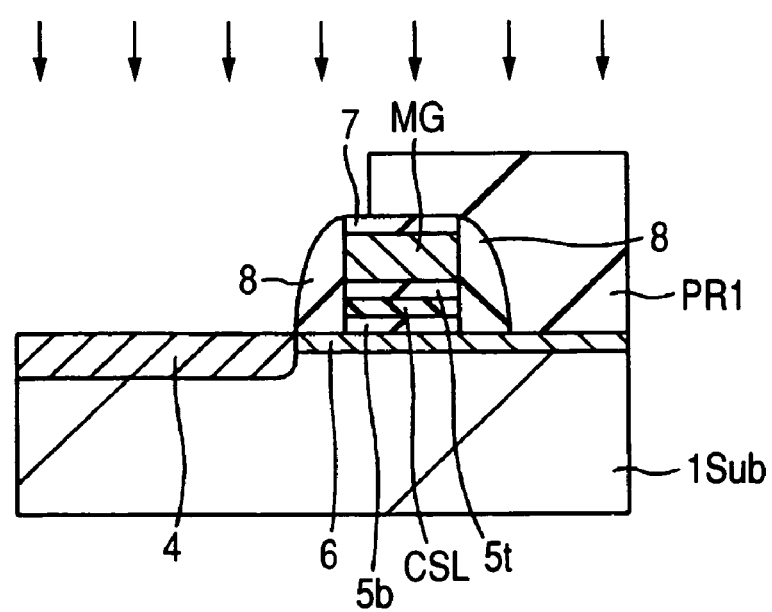
FIG. 7 is a cross section of a main portion during a process of manufacturing a semiconductor device, illustrating a problem which occurs in a process of forming the memory cell of FIG. 1.

FIG. 6 is a cross section of a main portion of the substrate 1Sub in a process of forming the memory cell MC1 of the split-gate electrode type of FIG. 2. In the main surface of the substrate 1Sub (at this stage, a wafer having an almost circular shape in top view), the n-type semiconductor region 6 is formed. On the main surface of the substrate 1Sub, a stacked pattern of the insulating film 5b, charge storage layer CSL, insulating film 5t, memory gate electrode MG, and the insulating film 7 is also formed. On side faces of the stacked pattern, the side walls 8 made of, for example, silicon oxide are formed. In the process of forming the memory cell MC1, first, on the main surface of the substrate 1Sub, as shown in FIG. 7, a photoresist pattern (hereinbelow, simply called resist pattern) PR1 is formed so as to expose a region for forming the transistor nMISQnc for selection (refer to FIG. 2) and cover the other region. Subsequently, the resist pattern PR1, the side wall 8, and a part of the memory gate electrode MG are used as a mask, and, for example, boron (B) is implanted in the main surface of the substrate 1Sub by ion implantation. By this operation, the p-type semiconductor region 4 is formed in the main surface of the substrate 1Sub so as to be self-aligned with the memory gate electrode MG. At this time, since the threshold voltage of the transistor nMISQnc for selection is preferably held high from the viewpoint of stability of operation of the memory cell MC1, the dose of boron has to be determined to an extent that the conduction type of the n-type semiconductor region 6 already formed in the main surface of the substrate 1Sub is cancelled out. Consequently, a large amount of impurity is implanted in the p-type semiconductor region 4, so that the total concentration of the impurity in the semiconductor region 4 (total of impurity concentrations for forming the semiconductor regions 4 and 6) becomes high.

As described above, in the memory cells MC1 to MC3 of the split-gate electrode type of FIGS. 2, 4, and 5, the transistor nMISQnc for selection and the transistor nMISQnm for memory are disposed adjacent to each other. In order to form semiconductor regions for forming the channels of the transistors nMISQnm and nMISQnm, an impurity for forming the semiconductor region for forming the channel of one of the transistors is implanted in the substrate 1Sub; and, after that, an impurity of the opposite conduction type has to be implanted so as to cancel out the conduction type to thereby form the semiconductor region for forming the other channel. Consequently, a large amount of impurity is implanted in the semiconductor region for the channel of one of the transistors, so that the total impurity concentration of the semiconductor region for forming the channel, into which the large amount of impurity is implanted, is high. As a result, the electrical characteristics deteriorate, such as by a drop in the mobility of the carriers (drop of the drain current Ids) and an increase in variations in the threshold voltage.

In the first embodiment, therefore, in the process of forming the memory cell MC of the split-gate electrode type having two MISs of the MIS for selection and the MIS for memory, the semiconductor region for forming the channel of one of the MISs is etched, and, after that, the semiconductor region for forming the channel of the other MIS is formed. By the method, the impurity concentration of the semiconductor region for forming the channel of the other MIS can be decreased. Thus, the mobility of carriers can be improved and the drain current Ids in the memory cell MC can be increased. Therefore, the operation speed (data reading speed) of the memory cell MC of the split gate electrode type can be improved. Since variations in the threshold voltage can be reduced, the operation reliability of the split-gate type memory cell MC can be improved.

A specific example will be described with reference to the cross sections of the main portion in the semiconductor substrate 1Sub in the memory region in the process for manufacturing the semiconductor device, as provided in FIGS. 8 to 19. An example of application of the invention to the memory cell MC1 of FIG. 2 will be described here.

Figure 8:
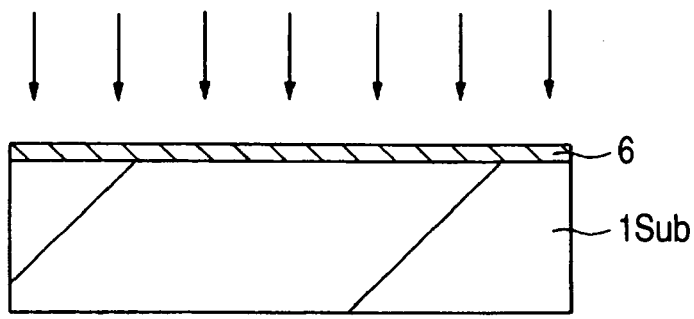
FIG. 8 is a cross section of a main portion during a step in the process of manufacturing a semiconductor device representing an embodiment of the invention.

First, as shown in FIG. 8, arsenic (As) is implanted by an ion implantation method into the main surface of the substrate 1Sub (at this stage, the semiconductor wafer having an almost circular shape in plan view) made of, for example, p-type silicon (Si) single crystal. By ion implantation, the n-type semiconductor region 6 for forming the channel of the transistor nMISQnm for memory (refer to FIG. 2) is formed in the main surface of the substrate 1Sub. In the first embodiment, as will be described later, an etching process is performed for slightly etching the main surface of the substrate 1Sub to partly remove the n-type semiconductor region 6. If the impurity ions for forming the semiconductor region 6 are doped too deeply, the amount of etching of the substrate 1Sub has to be increased in the etching process. Consequently, it is preferable to make the implantation depth of impurity ions for forming the semiconductor region 6 shallow. The implantation energy of the impurity ions at this time is, for example, about 20 to 40 keV. The depth of impurity ion implantation (depth where the impurity concentration is the highest) is, for example, about 10 to 20 nm. The dose of the impurity ions is, for example, about $1\times10^{14}/cm^2$. Although phosphorus can be used as an impurity, arsenic is used for the reason that, by using arsenic, whose atomic weight (mass) is heavier than that of phosphorus, the semiconductor region 6 can be formed in a shallower position in the substrate 1Sub with the same implantation energy, and it is easier to form the semiconductor region 6 in a shallow position.

Figure 9:
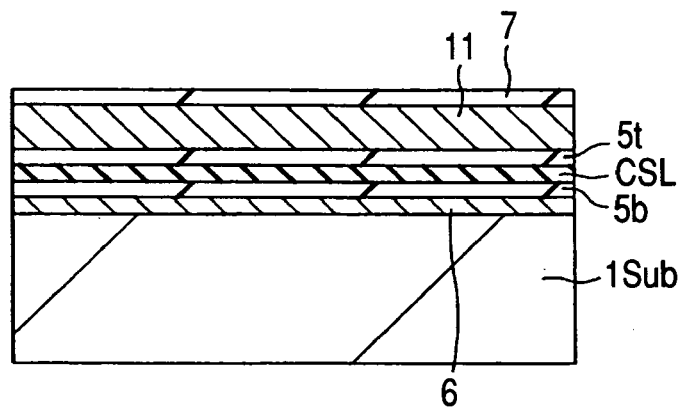
FIG. 9 is a cross section of the main portion during a step in the process of manufacturing the semiconductor device, subsequent to the step of FIG. 8.
Figure 10:
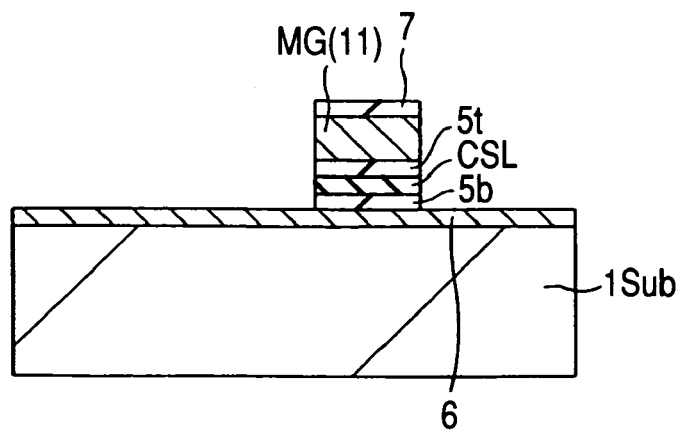
FIG. 10 is a cross section of the main portion during a step in the process of manufacturing the semiconductor device, subsequent to the step of FIG. 9.
Figure 11:
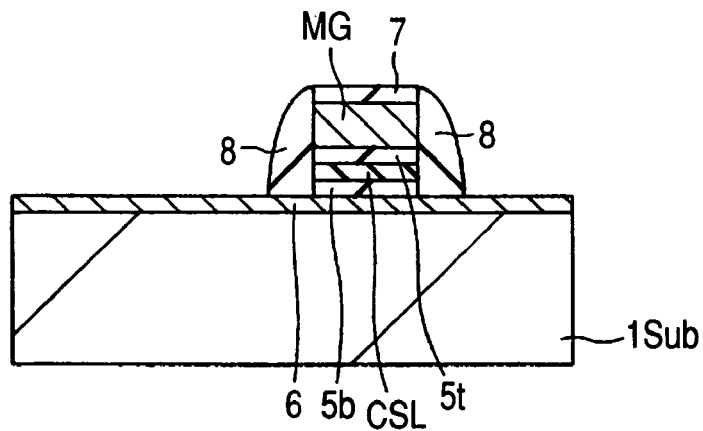
FIG. 11 is a cross section of the main portion during a step in the process of manufacturing the semiconductor device, subsequent to the step of FIG. 10.

As shown in FIG. 9, for example, the insulating film 5b made of silicon oxide, the charge storage layer CSL made of silicon nitride, the insulating film 5t made of silicon oxide, the conductive film 11 for forming the memory gate made of low-resistive polysilicon, and the insulating film 7 made of silicon oxide are oxidized or deposited in order on the main surface of the substrate 1Sub by CVD (Chemical Vapor Deposition). After that, the resultant stacked film is patterned by a photolithography (hereinbelow simply called lithography) technique or an etching technique, thereby forming a stacked pattern of the insulating film 5b, charge storage layer CSL, insulating film 5t, memory gate electrode MG(11), and insulating film 7, as shown in FIG. 10. Subsequently, an insulating film made of, for example, silicon oxide is deposited on the main surface of the substrate 1Sub by CVD and the like and is etched back by anisotropic dry etching, thereby forming the side walls 8 on the side surfaces of the stacked-layer pattern, as shown in FIG. 11.

Figure 12:
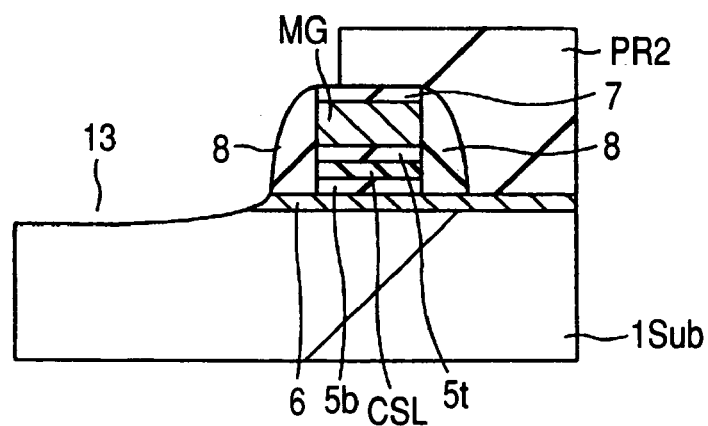
FIG. 12 is a cross section of the main portion during a step in the process of manufacturing the semiconductor device, subsequent to the step of FIG. 11.

Subsequently, as shown in FIG. 12, a resist pattern PR2, from which the region for forming the nMIS transistor for selection is exposed, is formed on the main surface of the substrate 1Sub. After that, an etching process is performed under conditions of increasing the etch selectivity between the material of the side wall 8 and the material of the substrate 1Sub by using the resister pattern PR2, side walls 8, and insulating film 7 as an etching mask. By the etching process, the main surface of the substrate 1Sub in the nMIS transistor for selection is partly etched, thereby forming a dent 13. In such a manner, the n-type semiconductor region 6 in the formation region of the n-MIS transistor for selection is removed. Since the side walls 8 are used as an etching mask, a part of the substrate 1Sub can be selectively etched with precision. As the etching method at this time, for example, dry etching is used. Alternately, wet etching may be used. In the case of using wet etching, a part of the substrate 1Sub can be etched without producing much damage on the substrate 1Sub. Alternately, by performing a dry etching process and, after that, performing a little of the wet etching process, a layer in the substrate 1Sub, which is damaged in the dry etching, may be removed. In such a manner, the electrical characteristics of the nMIS transistor for selection can be improved. When the dent 13 is too deep, it causes a step. Consequently, the depth of the dent 13 is, for example, preferably 50 nm or less, and specifically about 20 nm.

Figure 13:
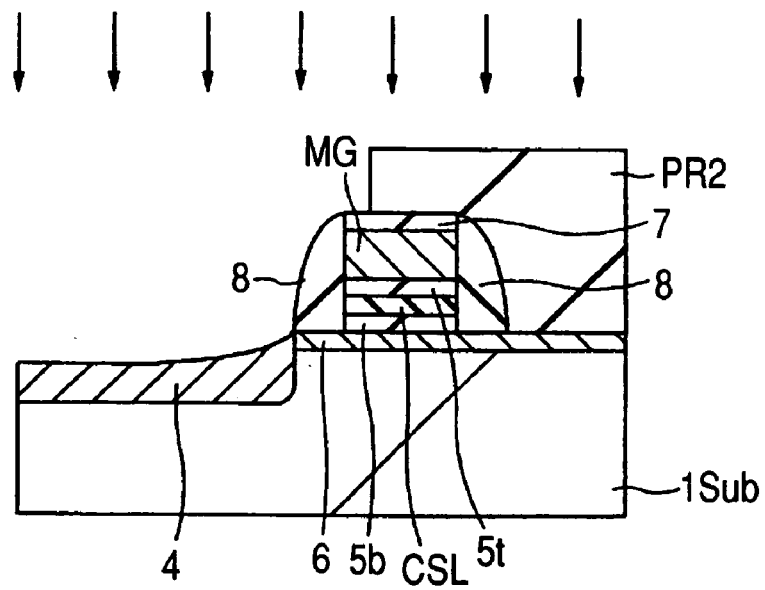
FIG. 13 is a cross section of the main portion during a step in the process of manufacturing the semiconductor device, subsequent to the step of FIG. 12.

As shown in FIG. 13, by ion implanting boron difluoride ($BF_2$) in the main surface of the substrate 1Sub by using the resist pattern PR2, side walls 8, and memory gate electrode MG as a mask, the p-type semiconductor region 4 for forming the channel of the nMIS transistor for selection is formed. The implantation energy of the impurity ions is, for example, about 40 to 100 keV. In the first embodiment, the main surface of the substrate 1Sub in the formation region of the nMIS transistor for selection is etched and the n-type semiconductor region 6 is removed. Therefore, as compared with the case where the dent 13 is not formed, the impurity concentration of the p-type semiconductor region 4 for forming the channel of the nMIS transistor for selection can be decreased. Consequently, the mobility of carriers (electrons) can be improved, and the drain current Ids in the memory cell MC1 can be increased. Therefore, the operating speed (data read speed) of the memory cell MC1 of the split-gate electrode type can be improved. Since variations in the threshold voltage of the nMIS transistor for selection can be reduced, the operation reliability of the memory cell MC1 of the split-gate electrode type can be improved.

Figure 14:
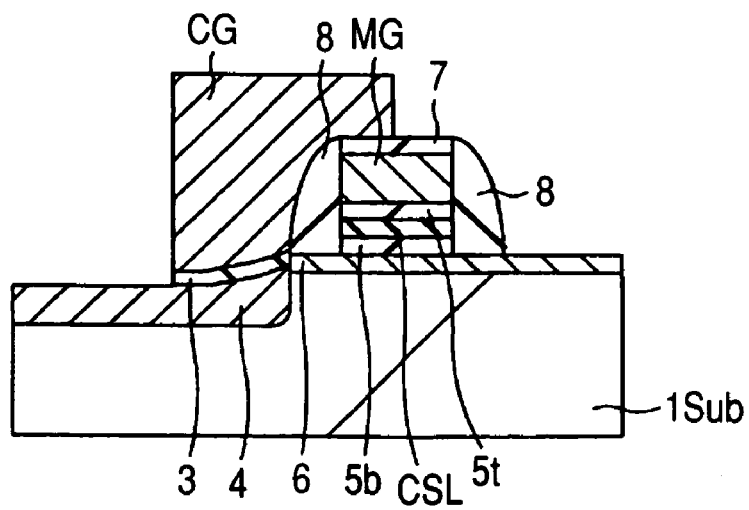
FIG. 14 is a cross section of the main portion during a step in the process of manufacturing the semiconductor device, subsequent to the step of FIG. 13.
Figure 15:
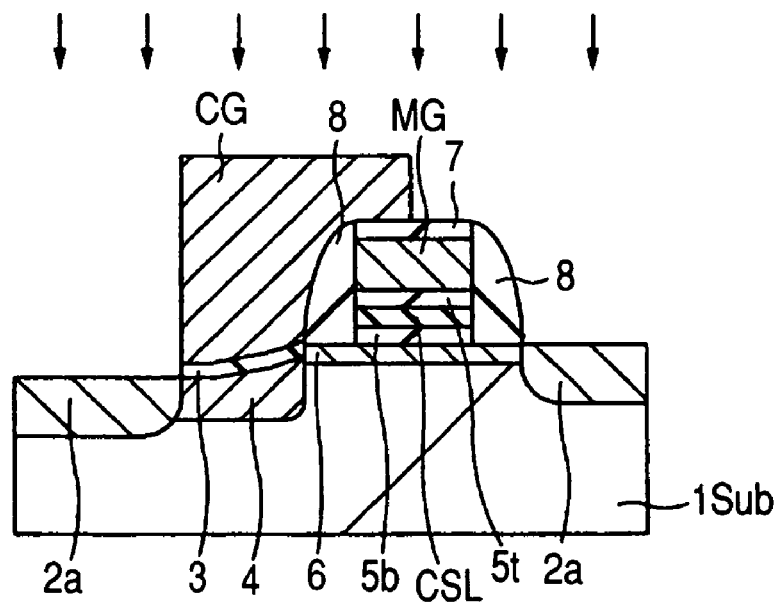
FIG. 15 is a cross section of the main portion during a step in the process of manufacturing the semiconductor device, subsequent to the step of FIG. 14.

As shown in FIG. 14, a gate insulating film 3, which is made of, for example, silicon oxide, is formed over the main surface of the substrate 1Sub by performing an oxidizing process on the substrate 1Sub. After that, a conductive film made of, for example, low-resistive polysilicon is deposited over the main surface of the substrate 1Sub by CVD and is patterned by a lithography technique and a dry etching technique, thereby forming the control gate electrode CG. Subsequently, as shown in FIG. 15, by ion implanting, for example, arsenic or phosphorus into the main surface of the substrate 1Sub, while using the control gate electrode CG and the memory gate electrode MG as a mask, the n⁻ type semiconductor region 2a is formed in the main surface of the substrate 1Sub so as to be self-aligned with the control gate electrode CG and the memory gate electrode MG.

Figure 16:
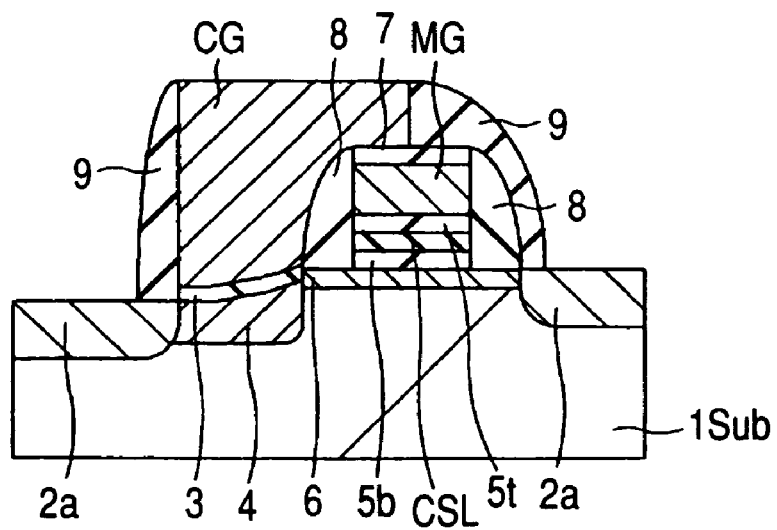
FIG. 16 is a cross section of the main portion during a step in the process of manufacturing the semiconductor device, subsequent to the step of FIG. 15.
Figure 17:
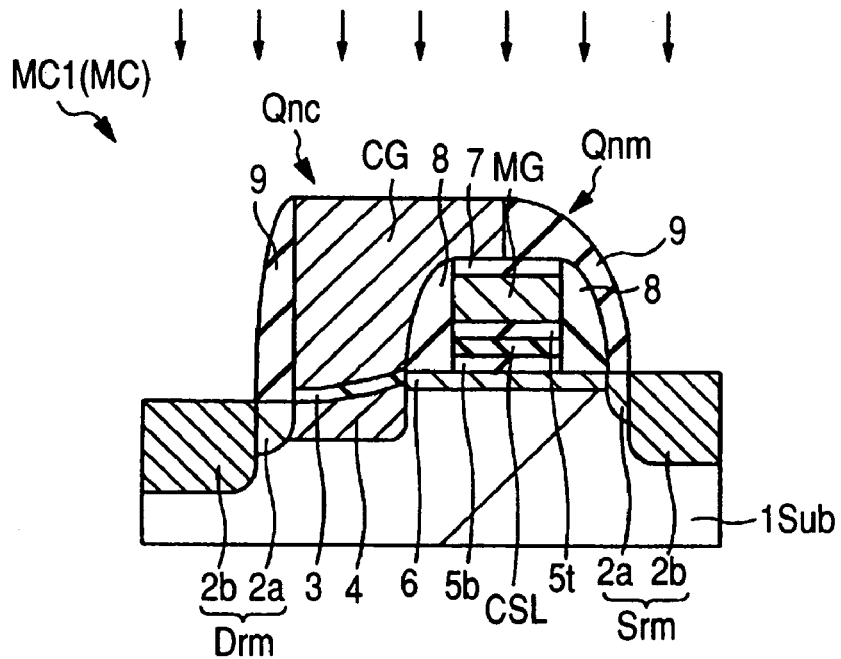
FIG. 17 is a cross section of the main portion during a step in the process of manufacturing the semiconductor device, subsequent to the step of FIG. 16.
Figure 18:
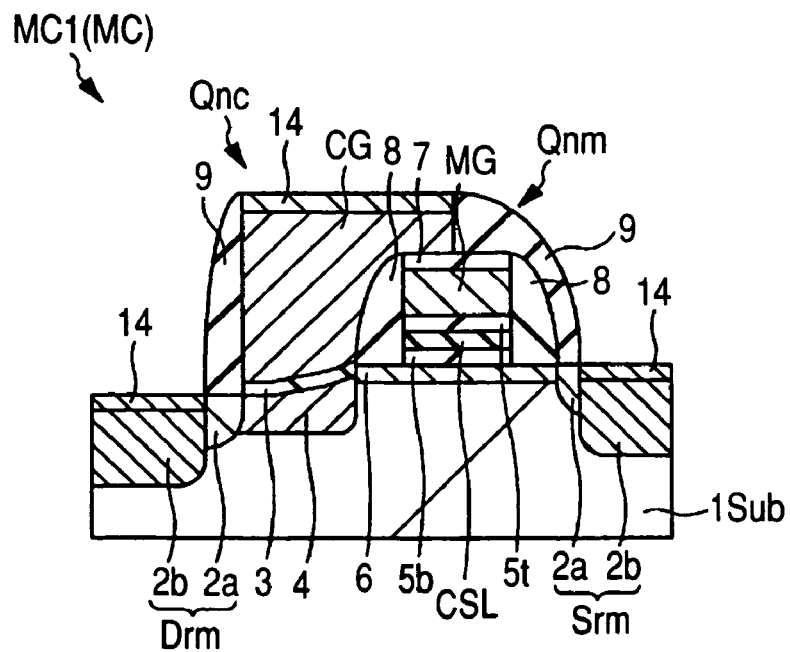
FIG. 18 is a cross section of the main portion during a step in the process of manufacturing the semiconductor device, subsequent to the step of FIG. 17.

After that, an insulating film made of, for example, silicon oxide is deposited on the main surface of the substrate 1Sub by CVD, and it is etched by the anisotropic dry etching method, thereby forming the side walls 9 on both side surfaces of the control gate electrode CG and on the surfaces of the insulating film 7 and the side walls 8, as shown in FIG. 16. Subsequently, as shown in FIG. 17, the side walls 9 and the control gate electrode CG are used as a mask, and, for example, arsenic or phosphorus is ion implanted into the main surface of the substrate 1Sub, thereby forming the n⁺ type semiconductor region 2b in the main surface of the substrate 1Sub so as to be self-aligned with the control gate electrode CG and the memory gate electrode MG. In such a manner, the drain region Drm and the source region Srm of the memory cell MC1 are formed, and the nMISQnc transistor for selection and the nMISQnm transistor for memory are formed. After that, as shown in FIG. 18, a silicide layer 14, which is made of, for example, cobalt silicide ($CoSi_x$), is formed on the main surface of the substrate 1Sub and the top face of the control gate electrode CG by a salicide (Self Align silicide) process.

Figure 19:
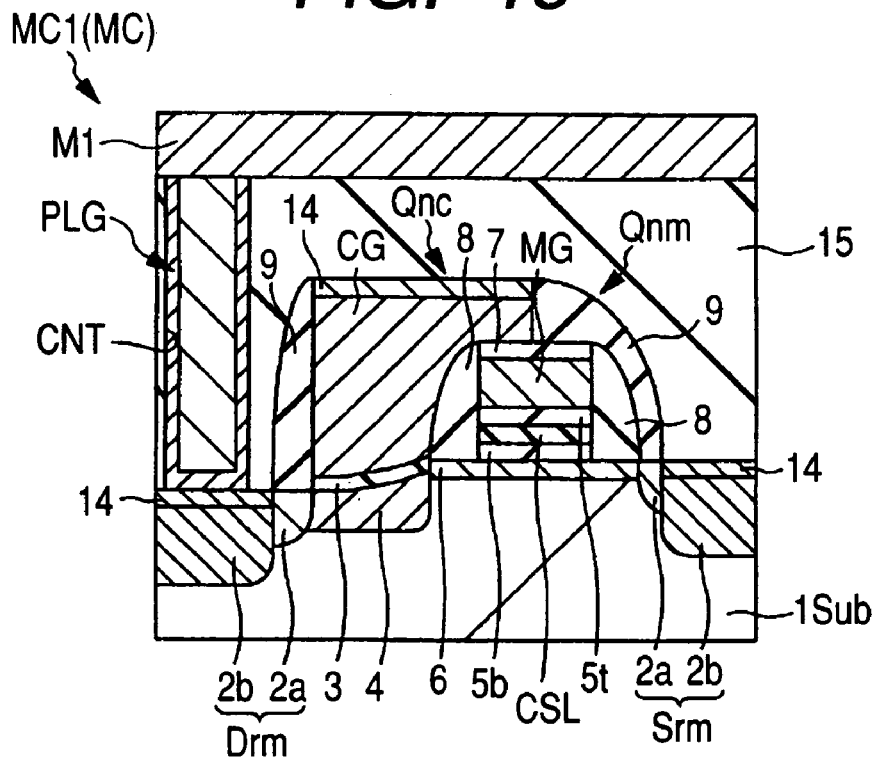
FIG. 19 is a cross section of the main portion during a step in the process of manufacturing the semiconductor device, subsequent to the step of FIG. 18.

Subsequently, as shown in FIG. 19, an insulating film 15, which is made of, for example, silicon oxide, is deposited over the main surface of the substrate 1Sub by CVD, and, after that, a contact hole CNT is formed in the insulating film 15. After that, a plug PLG is formed in the contact hole CNT. The plug PLG has, for example, a thin barrier layer constructed by stacked layers made of titanium (Ti) and titanium nitride (TiN) and a relatively thick conductive film made of tungsten (W), aluminum (Al) and the like formed so as to be surrounded by the barrier film. After that, a first wiring line M1, which is made of tungsten, aluminum (Al), and the like, is formed on the insulating film 15. Subsequently, a normal process for manufacturing a semiconductor device is performed to thereby manufacture a semiconductor device having a nonvolatile memory.

Second Embodiment

Figure 20:
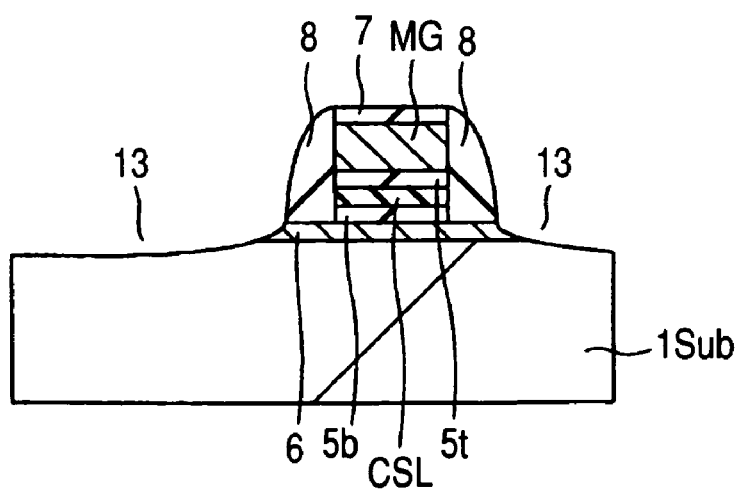
FIG. 20 is a cross section of a main portion during a step in a process of manufacturing a semiconductor device representing another embodiment of the invention.
Figure 21:
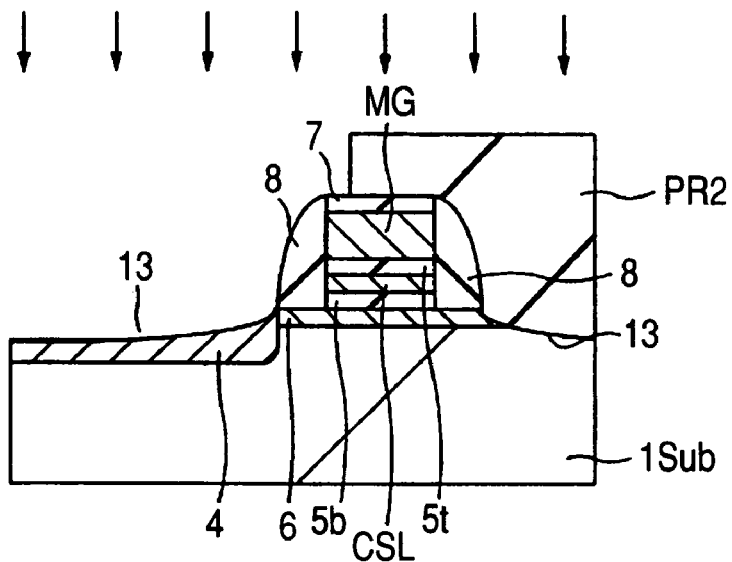
FIG. 21 is a cross section of the main portion during a step in the process of manufacturing the semiconductor device, subsequent to the step of FIG. 20.
Figure 22:
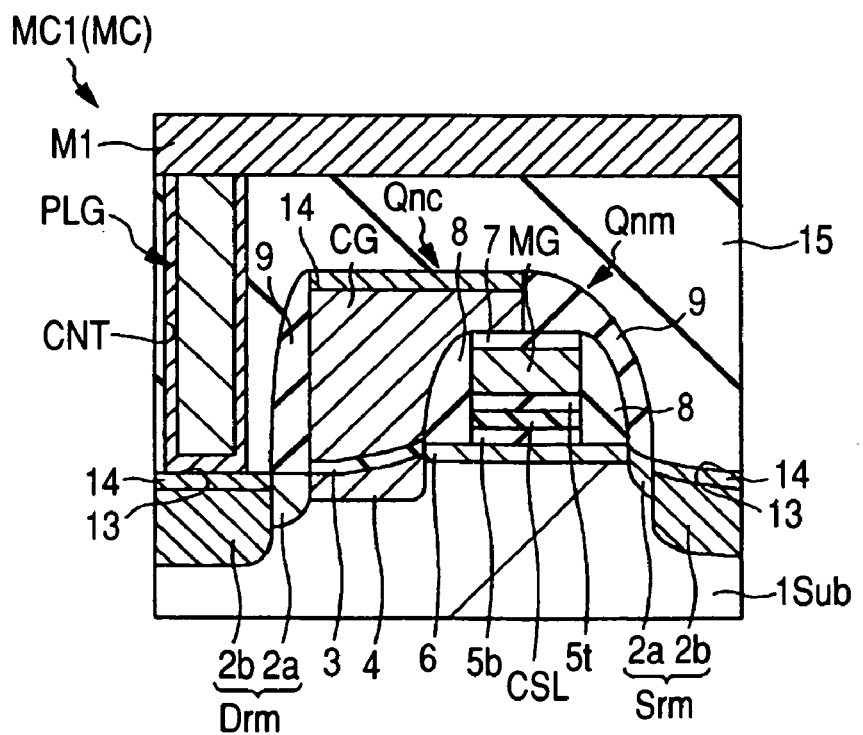
FIG. 22 is a cross section of the main portion during a step in the process of manufacturing the semiconductor device, subsequent to the step of FIG. 21.

As a second embodiment which represents a modification of the foregoing first embodiment, an example of etching the substrate 1Sub parts on both sides of the memory gate electrode will be described by using cross sections each showing the main portion of the substrate 1Sub in a process for manufacturing the semiconductor device, with reference to FIGS. 20 to 22.

First, an etching process, which is similar to that of FIG. 12, is performed on the substrate 1Sub after the processes described in FIGS. 8 to 11 of the first embodiment, thereby forming the dent 13 in the main surface portion of the substrate 1Sub, which is exposed from the formation regions of the memory gate electrode MG and the side walls 8. In this case, both sides of the formation regions of the memory gate electrode MG and the side walls 8 are removed. That is, the semiconductor region 6 in the formation part of the source region of the memory cell is also removed. Subsequently, as shown in FIG. 21, the resist pattern PR2 is formed over the main surface of the substrate 1Sub so that the side of the formation region of the nMIS for selection is exposed. After that, by ion implanting, for example, boron difluoride ($BF_2$) into the main surface of the substrate 1Sub, while using the resist pattern PR2, side wall 8, and insulating film 8 as a mask, the p-type semiconductor region 4 for forming the channel of the nMIS for selection is formed. The conditions in this case are the same as those described with reference to FIG. 13. Also, with this second embodiment, effects similar to those described in FIG. 13 can be obtained. After that, in a manner similar to the first embodiment, as shown in FIG. 22, the memory cell MC1 (MC) is formed.

In the second embodiment, the dent 13 is formed also in the course of forming the source region Srm in the memory cell MC1, and the layer of the n-type semiconductor region 6 is removed. Thus, the impurity concentration in the n⁻ type semiconductor region 2a and the n⁺ type semiconductor region 2b in the drain region Drm and the source region Srm can be reduced. As compared with the case where the dent 13 is not formed, the concentration in the n⁻ type semiconductor region 2a and the n⁺ type semiconductor region 2b can be easily adjusted.

Third Embodiment

The methods of the first and second embodiments can also be applied to the memory cells MC2 and MC3 of FIGS. 4 and 5. In connection with a third embodiment, an example of applying the method of the second embodiment to the memory cell MC2 of FIG. 4 will be described with reference to the cross sections of the main portion in the process for manufacturing the semiconductor device of FIGS. 23 to 31.

Figure 23:
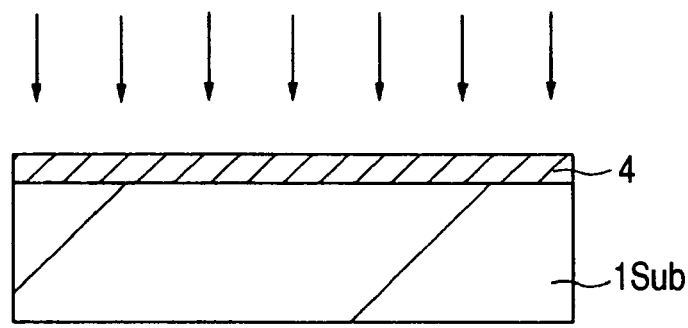
FIG. 23 is a cross section of a main portion during a step in a process of manufacturing a semiconductor device representing another embodiment of the invention.

First, as shown in FIG. 23, for example, the main surface of the substrate 1Sub (the semiconductor wafer), which is made of p-type silicon (Si) single crystal, is doped with boron difluoride ($BF_2$) by ion implantation. By this operation, the p-type semiconductor region 4 for forming the channel of the nMISQnc transistor (FIG. 4) is formed in the main surface of the substrate 1Sub. In this third embodiment, an etching process for slightly etching the main surface of the substrate 1Sub and partly removing the p-type semiconductor region 4 is performed later. For a reason similar to that in the case of the n-type semiconductor region 6 of the first embodiment, it is preferable to make the implantation depth of the impurity ions for forming the p-type semiconductor region 4 shallow. The implantation energy of impurity ions at this time is, for example, about 40 to 100 keV. The depth of impurity ion implantation (depth where the impurity concentration is the highest) is, for example, about 40 to 100 nm. The dose of the impurity ions is, for example, about $1\times10^{14}/cm^2$. Although boron can be used as an impurity, boron difluoride, is used for the reason that, by using boron difluoride whose atomic weight (mass) is heavier than that of boron, the semiconductor region 4 can be formed in a shallower position in the substrate 1Sub with the same implantation energy, and it is easier to form the semiconductor region 4 in a shallow position.

Figure 24:
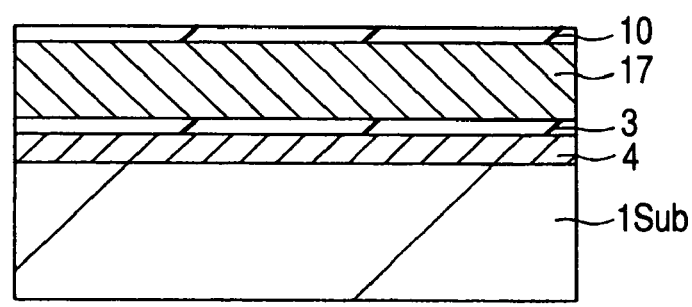
FIG. 24 is a cross section of the main portion during a step in the process of manufacturing the semiconductor device, subsequent to the step of FIG. 23.
Figure 25:
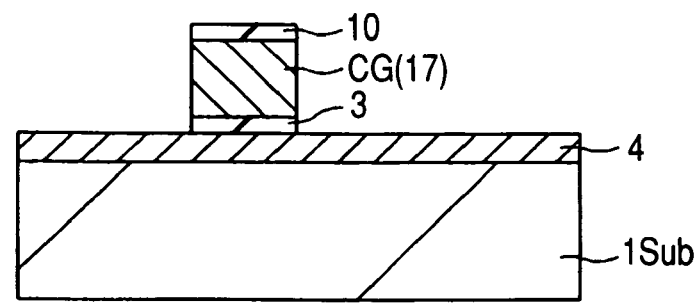
FIG. 25 is a cross section of the main portion during a step in the process of manufacturing the semiconductor device, subsequent to the step of FIG. 24.

As shown in FIG. 24, by performing the oxidizing process on the substrate 1Sub, the gate insulating film 3, which is made of, for example, silicon oxide, is formed over the main surface of the substrate 1Sub. A conductive film 17 of low-resistive polysilicon is deposited by CVD over the main surface of the substrate 1Sub. Further, on the conductive film 17, the insulating film 10 of, for example, silicon oxide is deposited. After that, the resultant stacked film, which is formed of the gate insulating film 3, conductive film 17, and insulating film 10, is patterned by a lithography technique and dry etching technique, thereby forming the control gate electrode CG, as shown in FIG. 25.

Figure 26:
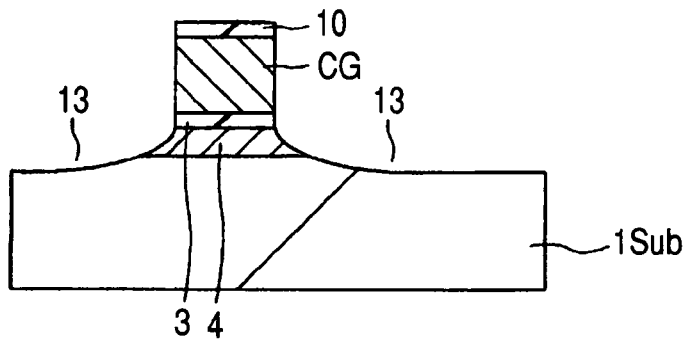
FIG. 26 is a cross section of the main portion during a step in the process of manufacturing the semiconductor device, subsequent to the step of FIG. 25.
Figure 27:
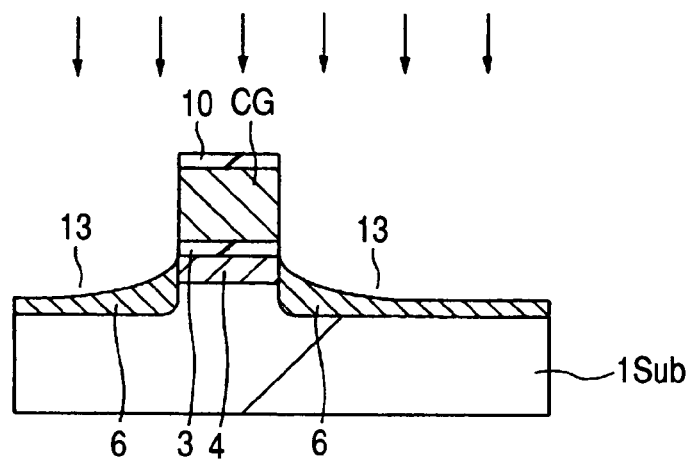
FIG. 27 is a cross section of the main portion during a step in the process of manufacturing the semiconductor device, subsequent to the step of FIG. 26.

Subsequently, by performing an etching process similar to that described with reference to FIG. 12 on the substrate 1Sub, as shown in FIG. 26, the dent 13 is formed in the main surface part of the substrate 1Sub, which is exposed from the region for forming the control gate electrode CG. In this case, the surface layer of the substrate 1Sub on both sides of the formation region of the control gate electrode CG is removed. That is, the p-type semiconductor regions 4 in the formation region of the nMIS transistor for memory in the memory cell and the formation portions of the source and drain regions are also removed. Subsequently, as shown in FIG. 27, by ion implanting, for example, arsenic or phosphorus into the main surface of the substrate 1Sub, while using the control gate electrode CG as a mask, the n-type semiconductor region 6 for forming the channel of the nMIS for memory is formed. The implantation energy of the impurity ions is, for example, about 20 to 40 keV. In the third embodiment, the main surface of the substrate 1Sub in the formation region of the nMIS for memory is etched and the p-type semiconductor region 4 is removed. Thus, the impurity concentration of the n-type semiconductor region 6 for forming the channel of the nMIS for memory can be decreased. Consequently, the mobility of carriers (electrons) can be improved, and the drain current Ids in the memory cell MC2 can be increased. Therefore, the operating speed (data read speed) of the memory cell MC2 of the split-gate electrode type can be improved. Since variations of the threshold voltage of the nMIS for memory can be reduced more than the case where the dent 13 is not formed, the operation reliability of the memory cell MC2 of the split-gate type can be improved.

Figure 28:
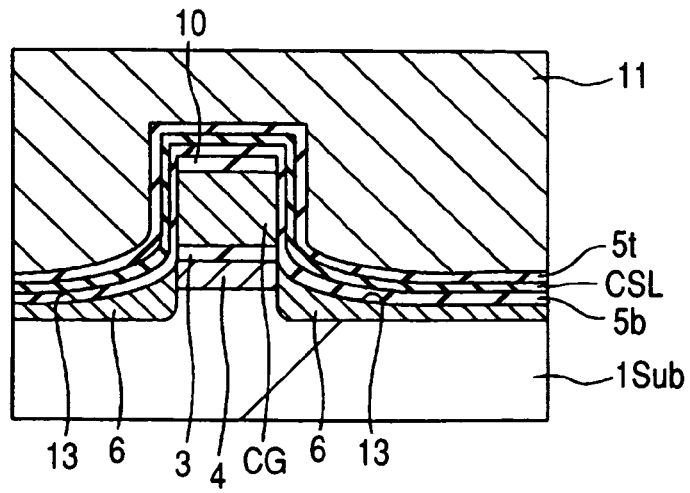
FIG. 28 is a cross section of the main portion during a step in the process of manufacturing the semiconductor device, subsequent to the step of FIG. 27.
Figure 29:
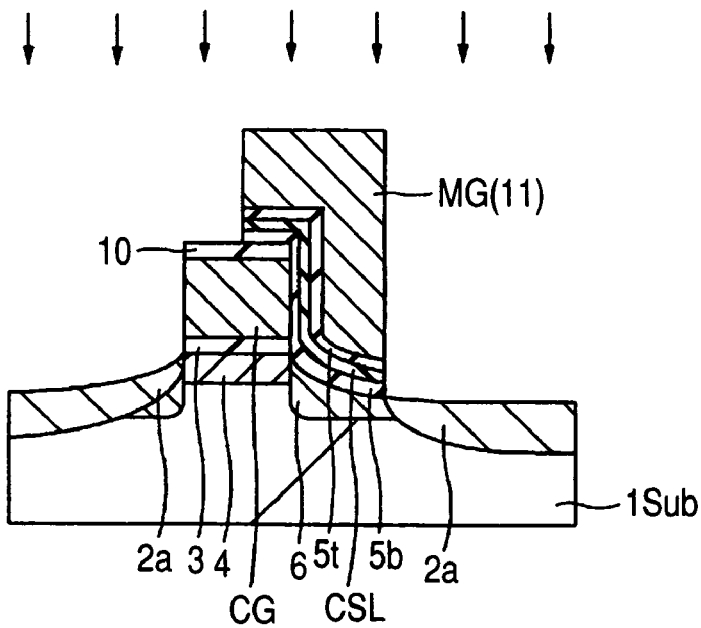
FIG. 29 is a cross section of the main portion during a step in the process of manufacturing the semiconductor device, subsequent to the step of FIG. 28.
Figure 30:
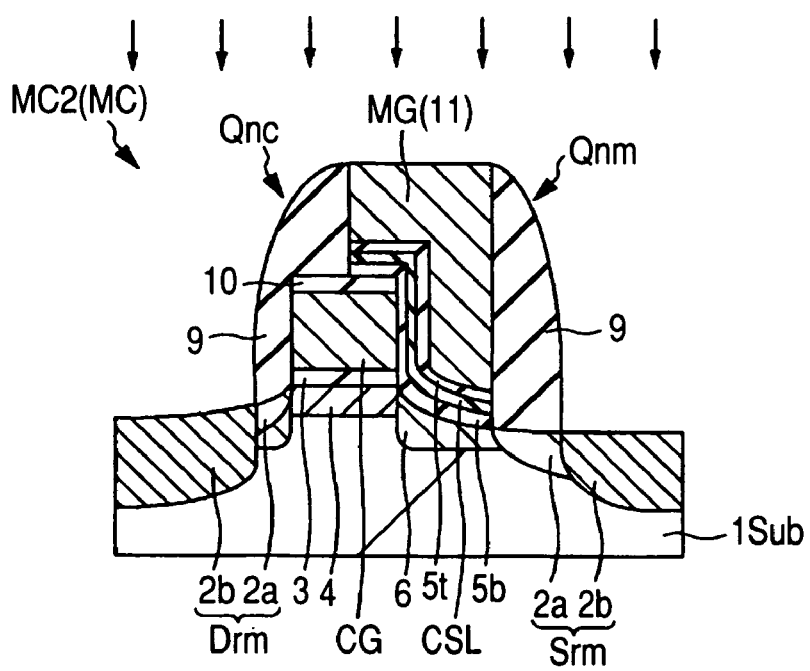
FIG. 30 is a cross section of the main portion during a step in the process of manufacturing the semiconductor device, subsequent to the step of FIG. 29.
Figure 31:
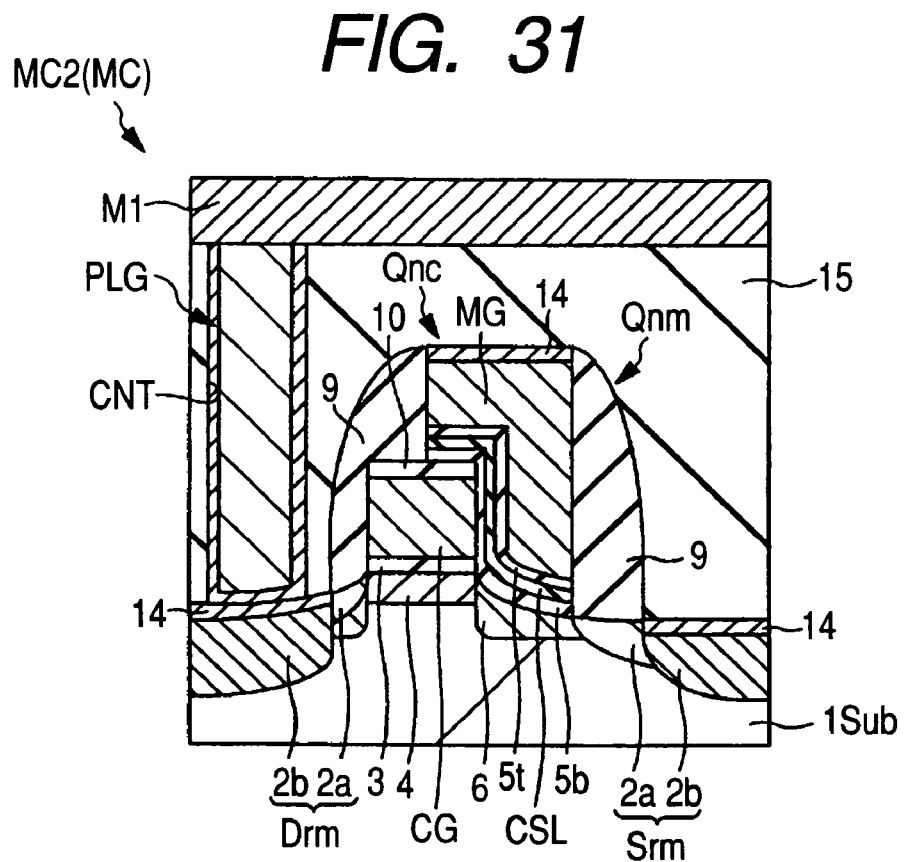
FIG. 31 is a cross section of the main portion during a step in the process of manufacturing the semiconductor device, subsequent to the step of FIG. 30.

As shown in FIG. 28, the insulating film 5b, the charge storage layer CSL, the insulating film 5t, and the conductive film 11 for forming the memory gate are deposited in order over the main surface of the substrate 1Sub by CVD. After that, the resultant stacked film is patterned by a lithography technique and an etching technique, thereby forming a stacked pattern of the insulating film 5b, charge storage layer CSL, insulating film 5t, and memory gate electrode MG(11), as shown in FIG. 29. Subsequently, by ion implanting, for example, arsenic or phosphorus into the main surface of the substrate 1Sub, while using the control gate electrode CG and the memory gate electrode MG as a mask, the n⁻ type semiconductor region 2a is formed in the main surface of the substrate 1Sub so as to be self-aligned with the control gate electrode CG and the memory gate electrode MG. After that, an insulating film, which is made of, for example, silicon oxide is deposited on the main surface of the substrate 1Sub by CVD. By etching back the resultant by anisotropic dry etching, as shown in FIG. 30, the side walls 9 are formed on one side face of the control gate electrode CG, on the top surface of the insulating film 10, and on both side faces of the memory gate electrode MG. Subsequently, by ion implanting, for example, arsenic or phosphorus into the main surface of the substrate 1Sub, while using the side walls 9 and the memory gate electrode MG as a mask, the n⁺ type semiconductor region 2b is formed in the main surface of the substrate 1Sub so as to be self-aligned with the control gate electrode CG and the memory gate electrode MG. In such a manner, the drain region Drm and the source region Srm of the memory cell MC2 are formed, and the nMISQnc transistor for selection and the nMISQnm for memory are formed. After that, as shown in FIG. 31, in a manner similar to the first embodiment, by the salicide process, the suicide layer 14 is formed on the main surface of the substrate 1Sub and the top surface of the control gate electrode CG. The insulating film 15 is deposited, the contact hole CNT is formed, the plug PLG is formed, and the first wiring line M1 is formed.

In this third embodiment, the dent 13 is formed also in the formation part of the drain region Drm and the source region Srm of the memory cell MC2, and the layer of the p-type semiconductor region 4 is removed. Thus, the impurity concentration in the n⁻ type semiconductor region 2a and the n⁺ type semiconductor region 2b of the drain region Drm and the source region Srm can also be reduced. As compared with the case where the dent 13 is not formed, the concentration of the n⁻ type semiconductor region 2a and the n⁺ type semiconductor region 2b can be adjusted more easily.

Fourth Embodiment

As a fourth embodiment, an example for solving another problem of the split-gate electrode type memory cell, which has been found for the first time by the inventors of the present invention, will be described. The problem is that semiconductor regions for a source and a drain of the MIS transistor for selection of a memory cell are offset from the control gate electrode.

Figure 32:
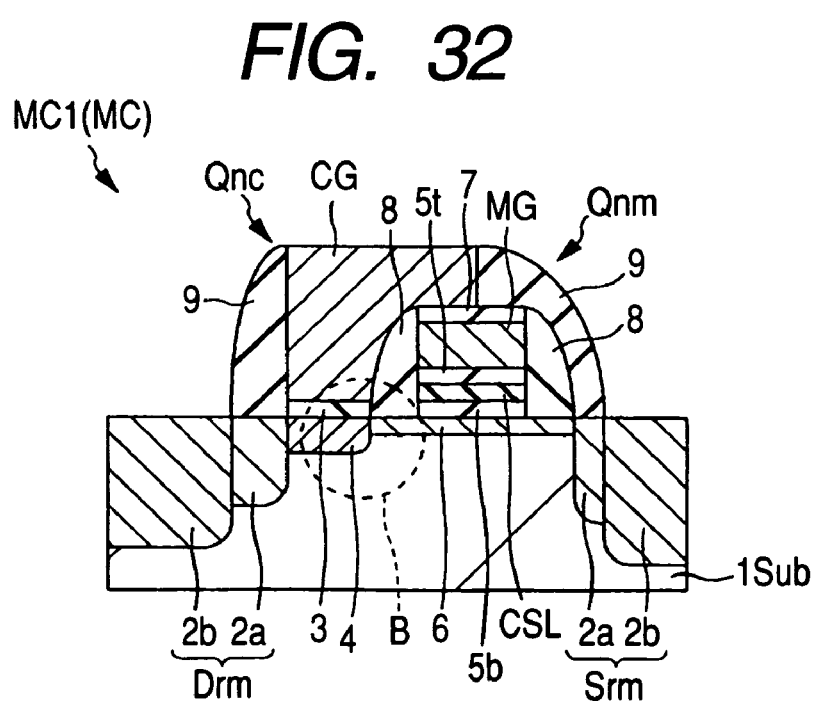
FIG. 32 is a cross section of a main portion during a step in the process of manufacturing a semiconductor device, illustrating another problem which occurs in a process of forming the memory cell of FIG. 1.
Figure 33:
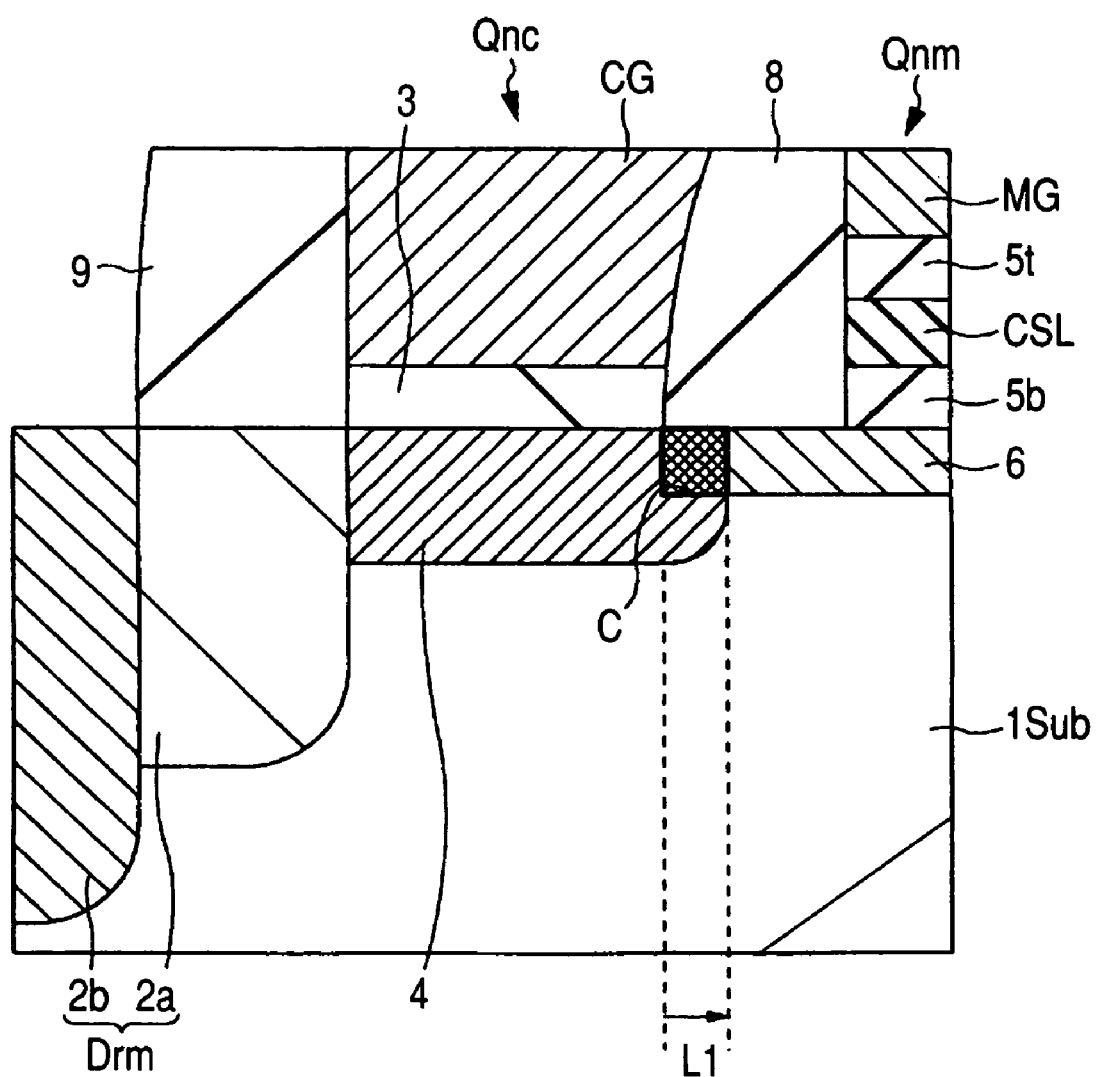
FIG. 33 is an enlarged cross section of a region B in FIG. 32.

First, the problem will be described with reference to FIGS. 32 and 33. FIG. 32 is a cross section of a main portion of the memory cell MC1, and FIG. 33 is an enlarged cross section of a region B surrounded by a broken line in FIG. 32. In the case of the memory cell MC1, the p-type semiconductor region 4 for forming the channel of the nMISQnc transistor for selection is formed after formation of the n-type semiconductor region 6 for forming the channel for the nMISQnm transistor for memory. Consequently, in a boundary region between the nMISQnm transistor for selection and the nMISQnm transistor for memory, a part of the p-type semiconductor region 4 is diffused into the n-type semiconductor region 6 side. In a region C into which the p-type semiconductor region 4 is diffused into the n-type semiconductor region 6 side, there is a case where a region which is inherently of the n type is changed to a region of the p type or a conduction type close to the p type. As a result, when seen from the control gate electrode CG of the nMISQnc transistor for selection, the n-type semiconductor region 6 serving as the source/drain regions of the nMISQnc transistor for selection is spaced only by the length L1. In other words, there is a portion (region C) on which the control gate electrode CG for controlling the drain current Ids does not overlap as seen in plane view via the gate insulating film 3. When such an offset region is created, the drain current Ids decreases and it causes a problem in that the operating speed of the memory cell MC1 decreases.

In the fourth embodiment, therefore, a spacer by which an end portion of the semiconductor region for forming the channel of the MIS transistor for selection is spaced from the side surface of a side wall formed on the side surface of the memory gate electrode of the MIS transistor for memory is formed on the side surface of the side wall on the side surface of the memory gate electrode. After that, an impurity for forming the semiconductor region for forming the channel of the MIS transistor for selection is implanted into the substrate 1Sub. By this operation, an end portion of the semiconductor region (semiconductor region for forming the channel of the MIS transistor for memory) serving as the source/drain regions of the MIS transistor for selection can be overlapped below the control gate electrode with reliability. Thus, the drain current Ids in the split-gate type memory cell can be improved. Therefore, the operating speed (data reading speed) of the split-gate memory cell can be improved. A concrete example will be described with reference to FIGS. 34 to 39, each showing a cross section of a main portion of the substrate 1Sub in the memory region in the process of manufacturing the semiconductor device.

Figure 34:
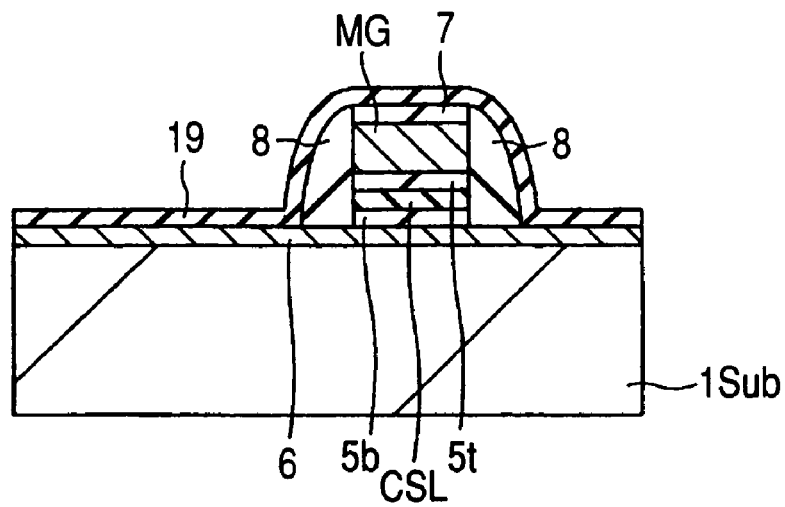
FIG. 34 is a cross section of a main portion during a step in a process of manufacturing a semiconductor device representing another embodiment of the invention.

First, after performing the processes described with reference to FIGS. 8 to 11 of the first embodiment, an insulating film 19 for the spacer is deposited over the main surface of the substrate 1Sub (semiconductor wafer), as seen in FIG. 34. The insulating film 19 is made of, for example, silicon oxide, and its thickness is, for example, about 30 nm. In this fourth embodiment, for example, the insulating film 19 is deposited by CVD using a mixture gas of TEOS (Tetraethoxysilane) and oxygen ($O_2$). The insulating film 7 as a lower layer and a silicon oxide film for forming the side wall 8 are deposited by CVD using a mixture gas of monosilane ($SiH_4$) and oxygen ($O_2$), and, after that, it is subjected to an annealing process so as to make the silicon oxide film dense. In such a manner, the etching rate when the insulating film 19 is removed by the wet etching process can be increased to twice as high as that of the insulating film 7 and the side wall 8 made of the same silicon oxide, so that the insulating film 19 can be selectively removed. As the material of the insulating film 19, silicon nitride may be used. In this case as well, the etch selectivity with silicon oxide can be made high when the insulating film 19 is removed by etching.

Figure 35:
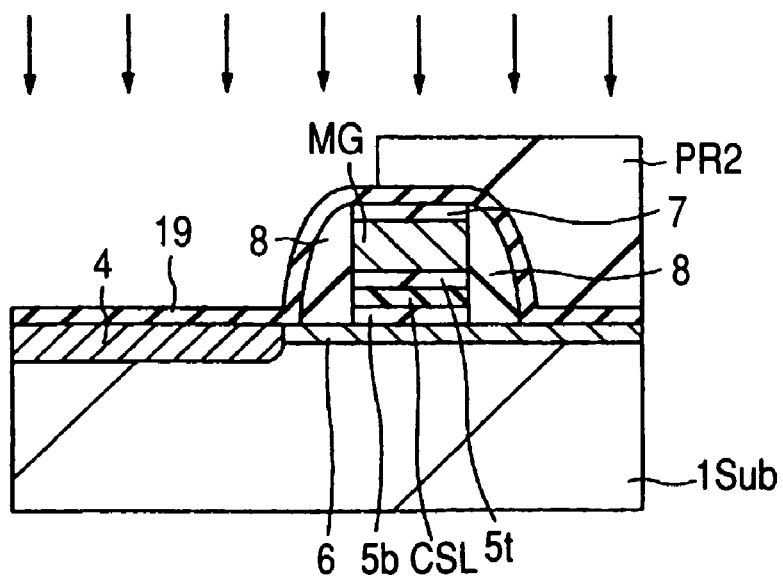
FIG. 35 is a cross section of the main portion during a step in the process of manufacturing the semiconductor device, subsequent to the step of FIG. 34.

Subsequently, as shown in FIG. 35, the resist pattern PR2 is formed in a manner similar to the first embodiment over the main surface of the substrate 1Sub. After that, in a manner similar to the first embodiment, with reference to FIG. 13, for example, by ion implanting boron difluoride ($BF_2$) or boron (B), the p-type semiconductor region 4 for forming the channel of the nMIS for selection is formed. At this time, in this fourth embodiment, the insulating film 19 formed on the side surfaces of the side wall 8 on the side of the formation region of the nMIS transistor for selection serves as a mask, and an end portion on the memory gate electrode CG side of the p-type semiconductor region 4 is positioned so as to be spaced from the side surface of the side wall 8 on the side of the formation region of the nMIS for selection only by the amount of the thickness of the insulating film 19.

Figure 36:
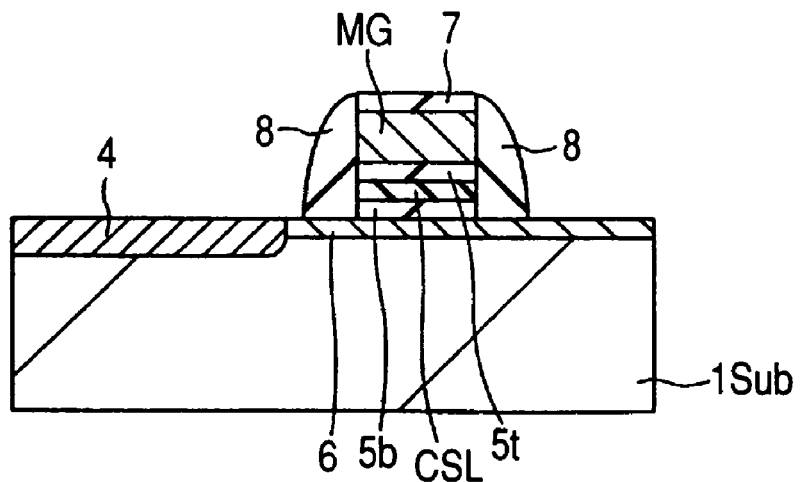
FIG. 36 is a cross section of the main portion during a step in the process of manufacturing the semiconductor device, subsequent to the step of FIG. 35.
Figure 37:
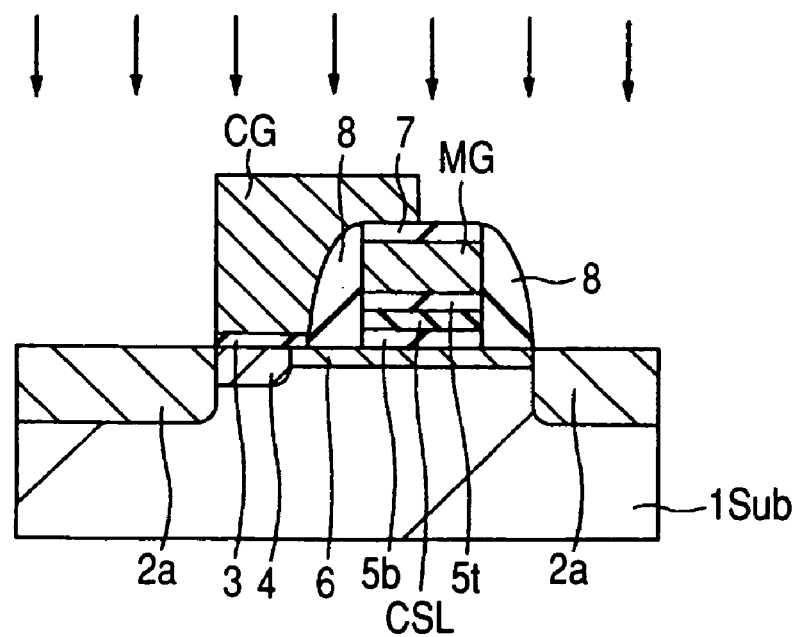
FIG. 37 is a cross section of the main portion during a step in the process of manufacturing the semiconductor device, subsequent to the step of FIG. 36.
Figure 38:
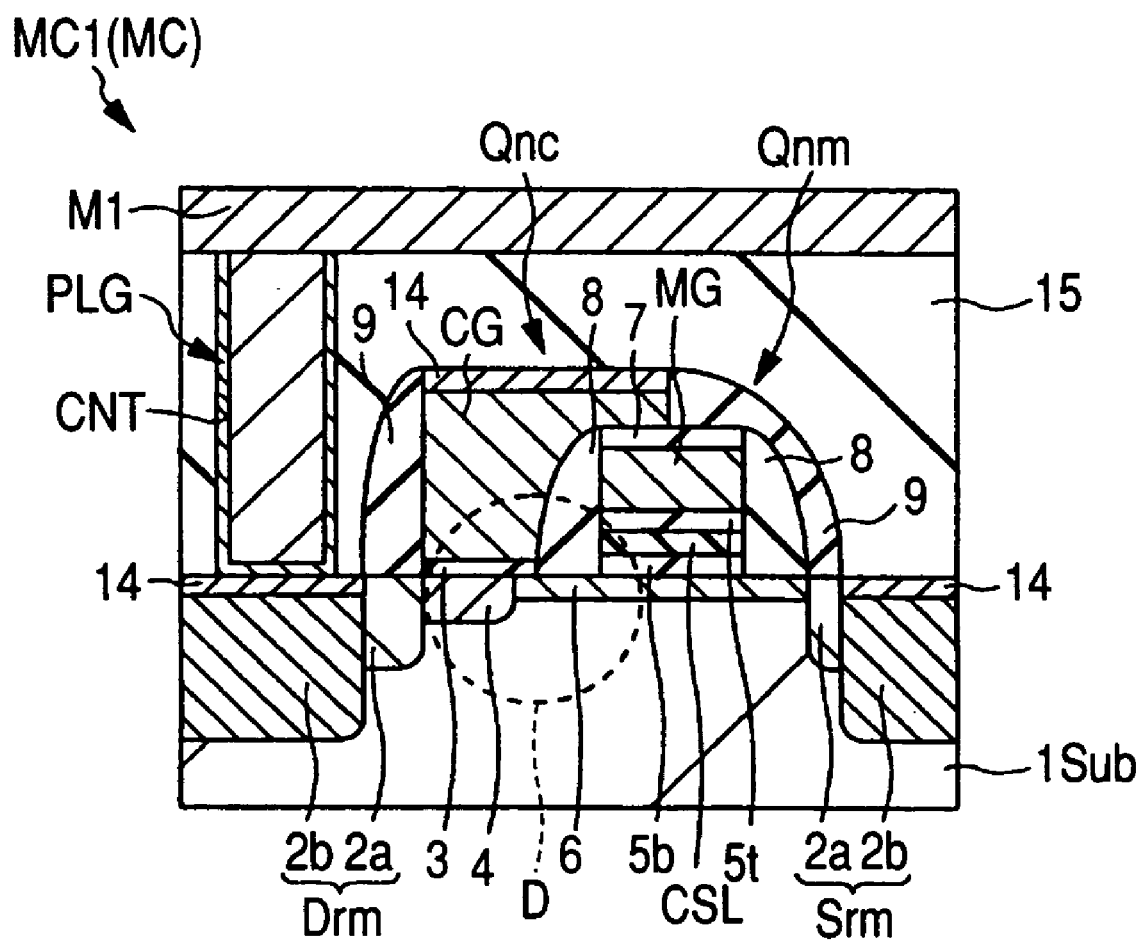
FIG. 38 is a cross section of the main portion during a step in the process of manufacturing the semiconductor device, subsequent to the step of FIG. 37.

After that, the resist pattern PR2 is removed and the insulating film 19 is selectively removed by the wet etching method, as shown in FIG. 36. As shown in FIG. 37, in a manner similar to the first embodiment, the gate insulating film 3 and the control gate electrode CG are formed; and, for example, by ion implanting arsenic or phosphorus into the substrate 1Sub, the $n^{-1}$ type semiconductor region 2a is formed. After that, as shown in FIGS. 38 and 39, in a manner similar to the first embodiment, the nMISQnc transistor for selection and the nMISQnm transistor for memory are formed, thereby forming the split-gate electrode type memory cell MC1.

Figure 39:
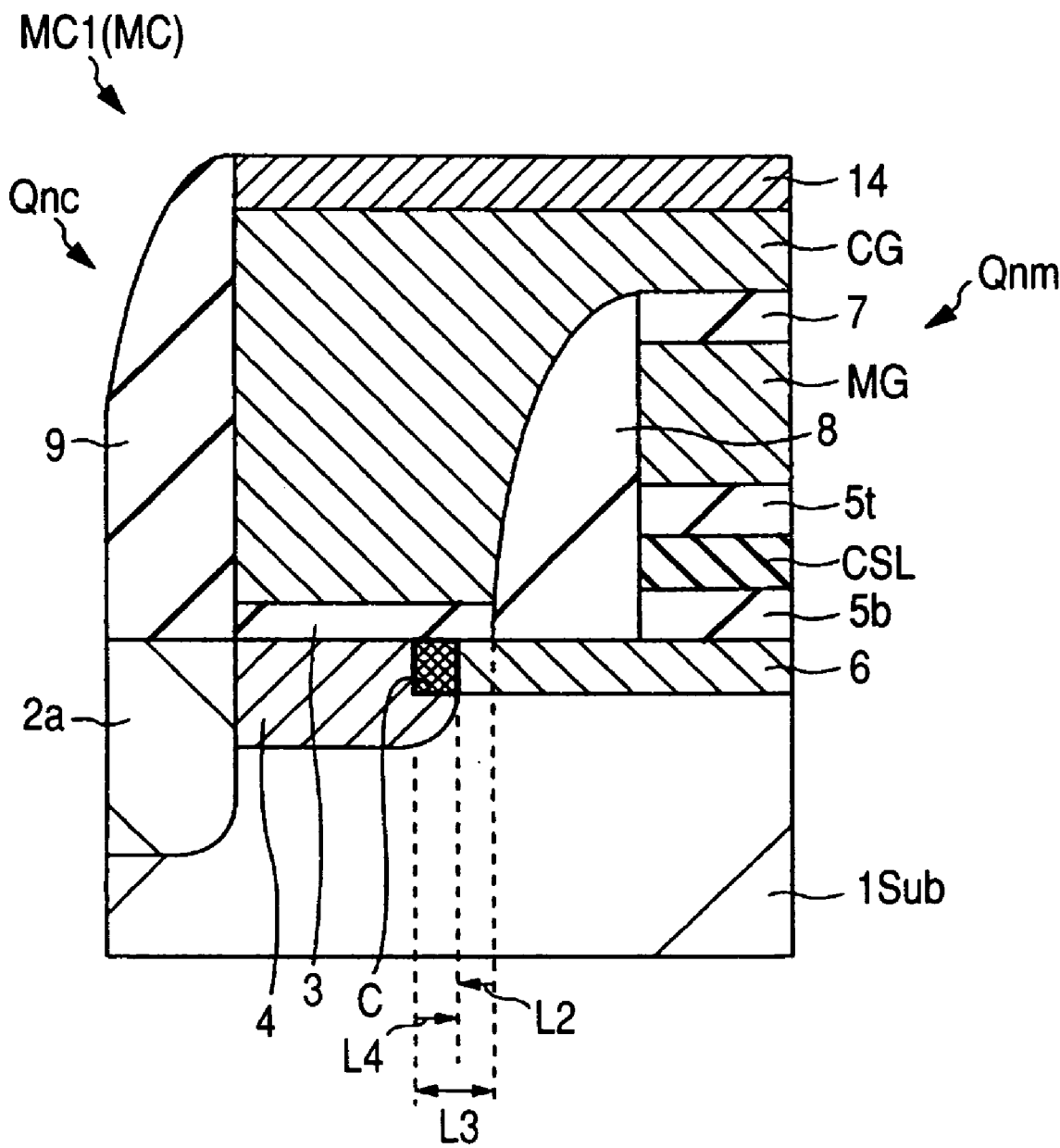
FIG. 39 is an enlarged cross section of a region D in FIG. 38.

In this fourth embodiment, as shown in FIG. 39, an end portion of the n-type semiconductor region 6 extends from the side surface of the side wall 8 to the lower side of the control gate electrode CG only by the length L2. That is, the control gate electrode CG for controlling the current of the memory cell MC1 reliably overlaps an end portion of the n-type semiconductor region 6 (source/drain regions of the nMISQnc transistor for selection) via the gate insulating film 3. Therefore, the drain current Ids of the memory cell MC1 of the split-gate electrode type can be improved, so that the operation speed (data read speed) of the memory cell MC1 of the split-gate electrode type can be improved. The length L2 can be controlled by the thickness of the insulating film 19. Therefore, the overlap amount of the control gate electrode CG with the end portion of the n-type semiconductor region 6 via the gate insulating film 3 can be set relatively easily. The length L3 indicates the thickness of the insulating film 19. The thickness L4, obtained by subtracting the length L2 from the length L3, indicates the length of diffusion into the n-type semiconductor region 6 side from the p-type semiconductor region 4.

Figure 40:
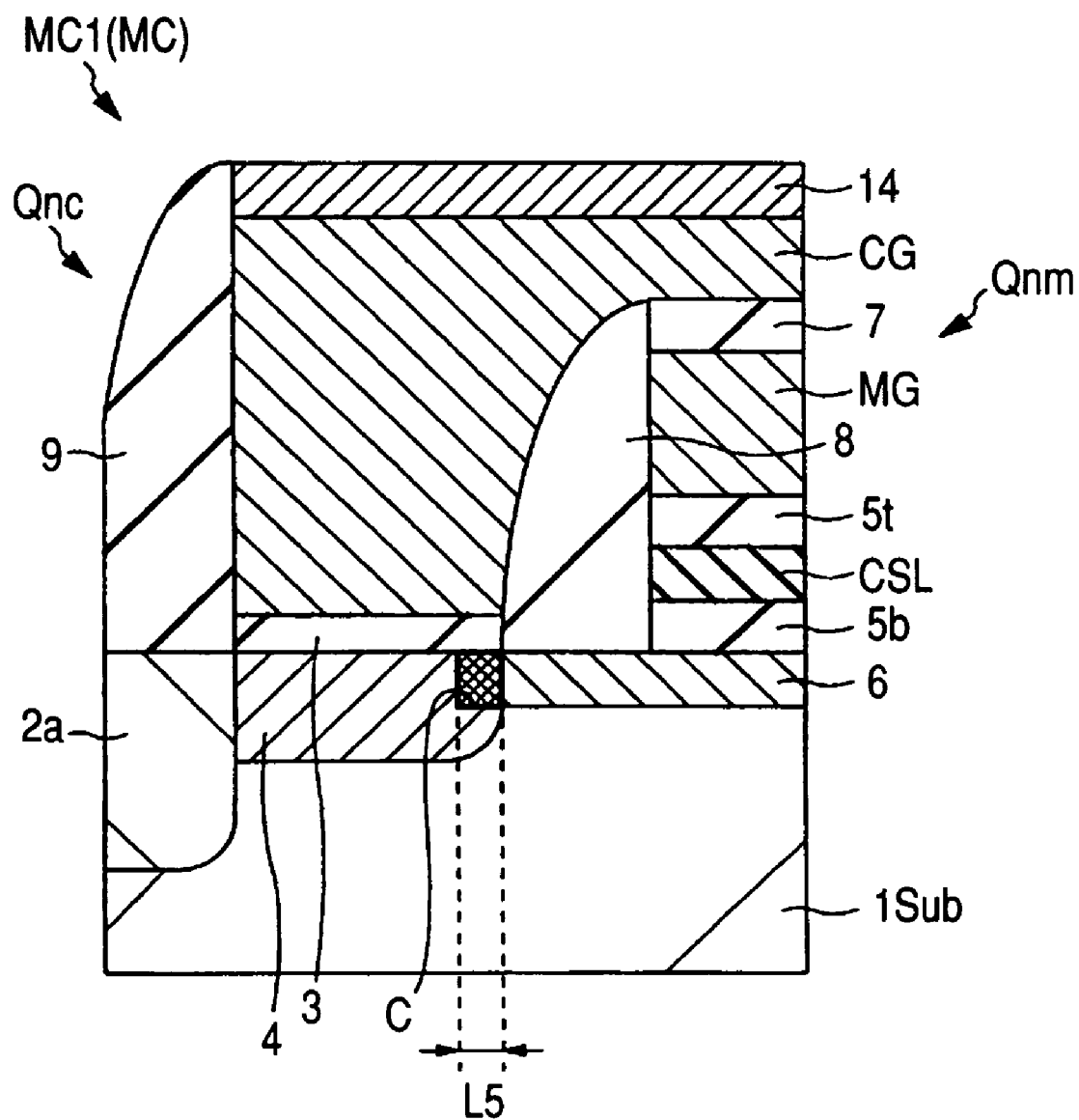
FIG. 40 is an enlarged cross section of a main portion of a semiconductor device representing another embodiment of the invention.

In connection with the fourth embodiment, the case where the n-type semiconductor region 6 extends below the control gate electrode CG and the control gate electrode CG overlaps the end portion of the n-type semiconductor region 6 via the gate insulating film 3 has been described. In the fourth embodiment, it is sufficient if the end portion of the n-type semiconductor region 6 as the source and drain regions of the nMISQnc transistor for selection is not spaced from the end portion of the control gate electrode CG. As shown in FIG. 40, the control gate electrode CG does not overlap the end portion of the n-type semiconductor region 6 via the gate insulating film 3, but an end portion of the n-type semiconductor region 6 almost coincides with the side surface position of the side wall 8. A structure in which the end portion of the n-type semiconductor region 6 is not spaced from the end portion of the control gate electrode CG is not eliminated. The thickness L5 of FIG. 40 is the thickness of the insulating film 19 and is also the length of diffusion to the n-type semiconductor region 6 side of the p-type semiconductor region 4.

The fourth embodiment may be combined with the first and second embodiments. Specifically, the dent 13 is formed in the main surface of the substrate 1Sub, the insulating film 19 is deposited, and, after that, impurities for forming the p-type semiconductor region 4 are implanted.

As the insulating film 19, an insulating film used in another process may be used. In this case, the insulating film can be used commonly in processes, the manufacturing time of the semiconductor device can be shortened and the cost can be reduced.

Fifth Embodiment

As a fifth embodiment, an example for solving another problem which has been found out by the inventors of the present invention, in connection with a split-gate electrode type memory cell will be described. The problem is that, in a process of patterning a gate electrode formed over another gate electrode, a part of the gate electrode which is formed over another gate electrode remains on the side surface of the other gate electrode, and, at the time of removing the part, the main surface of the substrate is etched.

Figure 41:
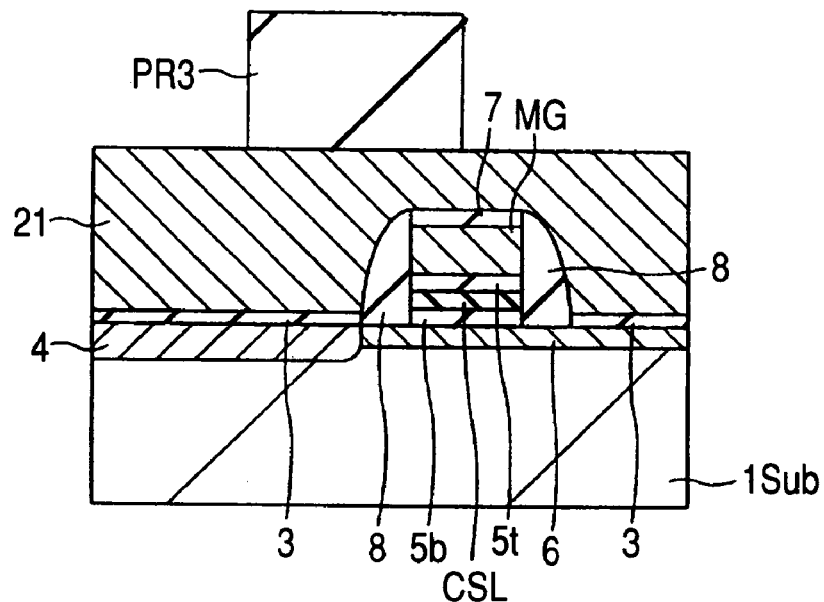
FIG. 41 is a cross section of a main portion during a step in the process of manufacturing a semiconductor device, illustrating another problem which occurs in a process of forming the memory cell of FIG. 1.
Figure 42:
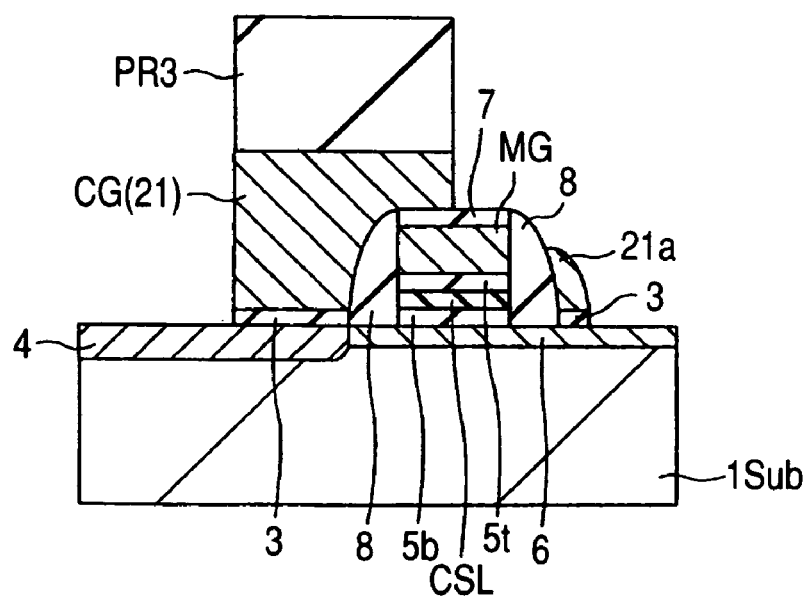
FIG. 42 is a cross section of the main portion during a step in the process of manufacturing the semiconductor device, subsequent to the step of FIG. 41.
Figure 43:
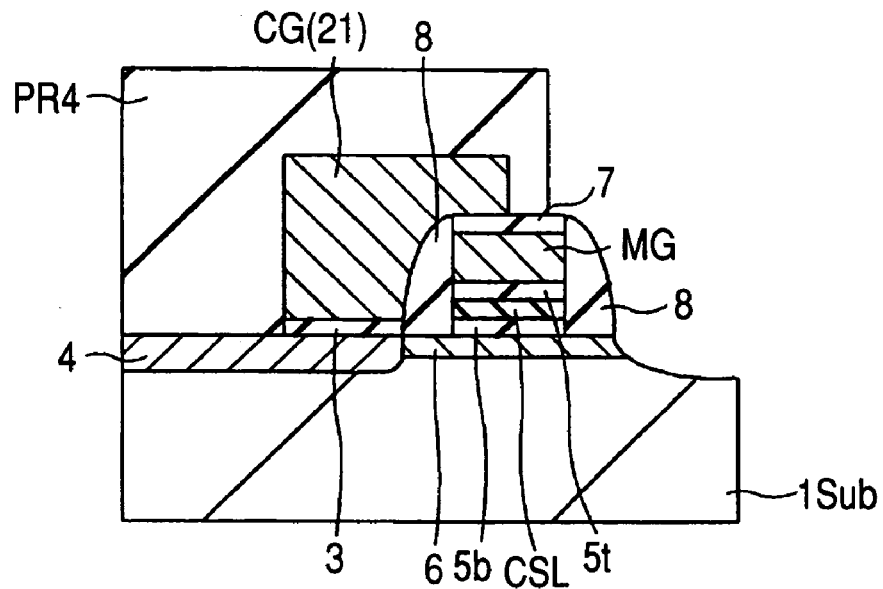
FIG. 43 is a cross section of the main portion during a step in the process of manufacturing the semiconductor device, subsequent to the step of FIG. 42.

The problem will be described first with reference to FIGS. 41 to 43. FIGS. 41 to 43 are cross sections each showing a main portion of the substrate 1Sub in the process of patterning the control gate electrode. As shown in FIG. 41, the gate insulating film 3 is formed on the main surface of the substrate 1Sub. After that, over the main surface of the substrate 1Sub, a conductive film 21 made of low-resistive polysilicon and the like for forming the control gate electrode is deposited by CVD and the like. Further, a resist pattern PR3 for forming the control gate electrode is formed on the conductive film 21. Subsequently, by performing an anisotropic dry etching process, while using the resist pattern PR3 as an etching mask, the control gate electrode CG is formed, as shown in FIG. 42. At this time, there is the possibility that a conductive film 21a will remain on the side surface of the side wall 8 on the side surface of the memory gate electrode MG. To remove the remaining conductive film 21a, as shown in FIG. 43, a resist pattern PR4 to expose the conductive film 21a is formed, and the conductive film 21a is removed by etching process. At this time, however, since the conductive film 21a is made of polysilicon, the main surface of the substrate 1Sub made of silicon as a lower layer is also partly etched and becomes rough. As a result, a situation exists where the drain current Ids of the memory cell decreases.

In the fifth embodiment, therefore, there is a process of forming a protection film over the substrate on the side where the upper gate electrode is not provided. Therefore, at the time of removing the residual gate electrode which is provided over the other gate electrode, the main surface of the substrate 1Sub is protected by the protection film, so that the main surface of the substrate 1Sub can be prevented from being etched. A specific example will be described with reference to FIGS. 44 to 52, which are cross sections each showing a main portion of the substrate 1Sub of the memory region in the process of manufacturing the semiconductor device.

Figure 44:
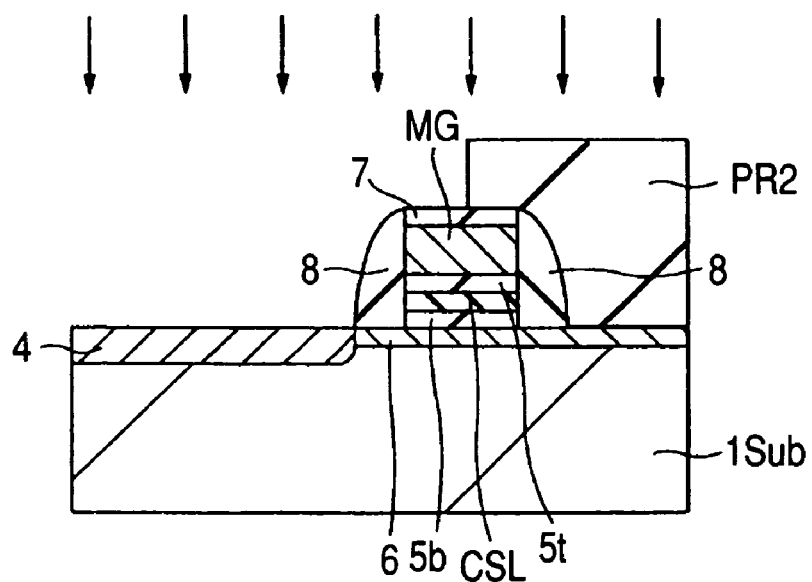
FIG. 44 is a cross section of a main portion during a step in the process of manufacturing a semiconductor device representing another embodiment of the invention.
Figure 45:
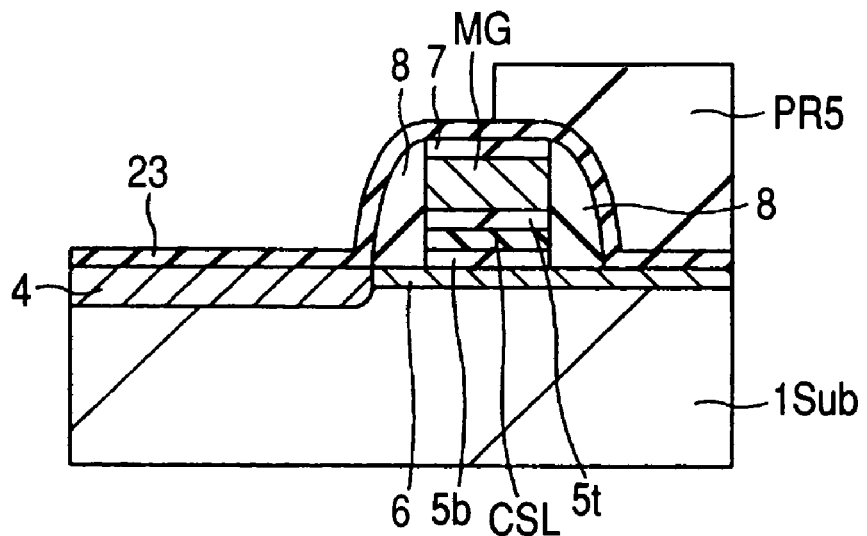
FIG. 45 is a cross section of the main portion during a step in the process of manufacturing the semiconductor device, subsequent to the step of FIG. 44.
Figure 46:
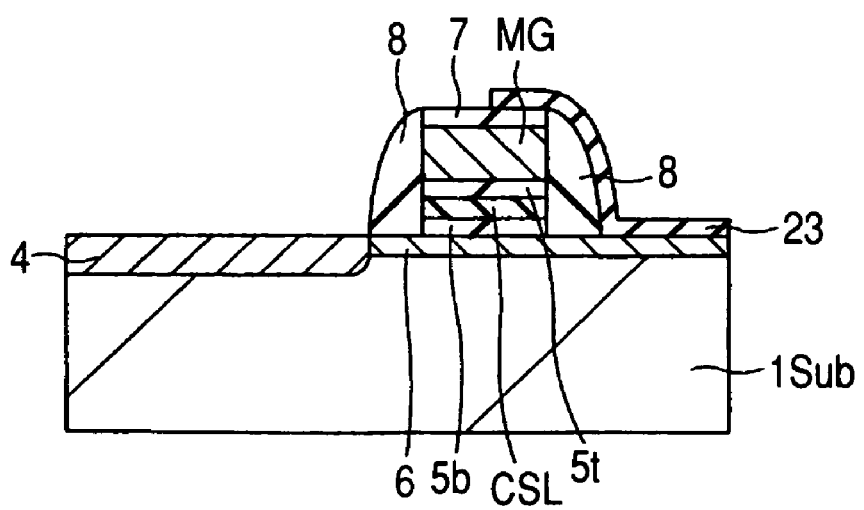
FIG. 46 is a cross section of the main portion during a step in the process of manufacturing the semiconductor device, subsequent to the step of FIG. 45.

First, after performing the processes described with reference to FIGS. 8 to 11 of the first embodiment, the resist pattern PR2 is formed over the main surface of the substrate 1Sub (semiconductor wafer), as shown in FIG. 44. By ion implanting, for example, boron difluoride ($BF_2$) or boron (B), the p-type semiconductor region 4 is formed. Subsequently, the resist pattern PR2 is removed; and, after that, as shown in FIG. 45, the insulating film 23, which is made of, for example, silicon oxide or silicon nitride and having a thickness of about 20 nm, is formed on the main surface of the substrate 1Sub. After that, a resist pattern PR5, which is the same as the resist pattern PR2 used at the time of forming the p-type semiconductor region 4, is formed on the insulating film 23. By using the resist pattern PR5 as an etching mask and etching the insulating film 23, as shown in FIG. 46, the pattern of the insulating film 23 is formed. The pattern of the insulating film 23 is formed so as to cover a part of the top surface of the insulating film 7, the surface of the side wall 8 on one side, and the top surface of the substrate 1Sub on the source region side of the memory cell.

Figure 47:
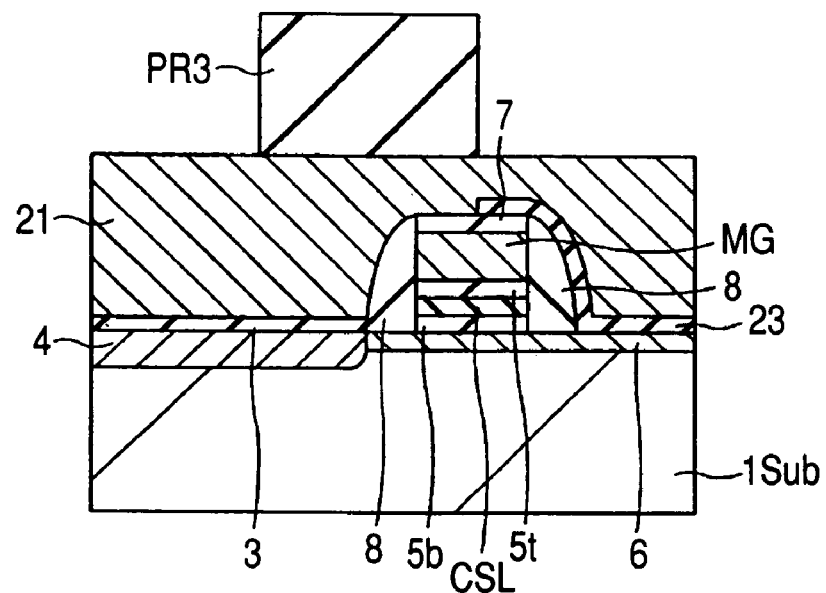
FIG. 47 is a cross section of the main portion during a step in the process of manufacturing the semiconductor device, subsequent to the step of FIG. 46.
Figure 48:
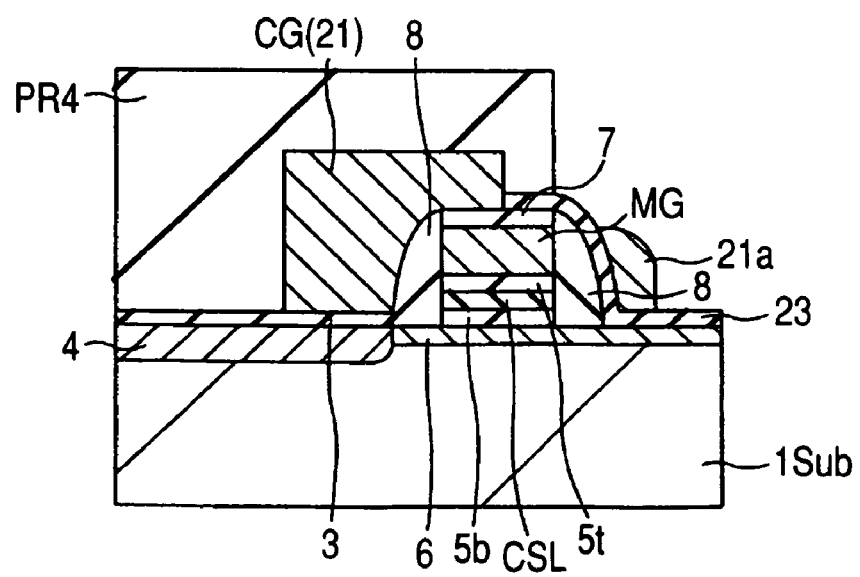
FIG. 48 is a cross section of the main portion during a step in the process of manufacturing the semiconductor device, subsequent to the step of FIG. 47.
Figure 49:
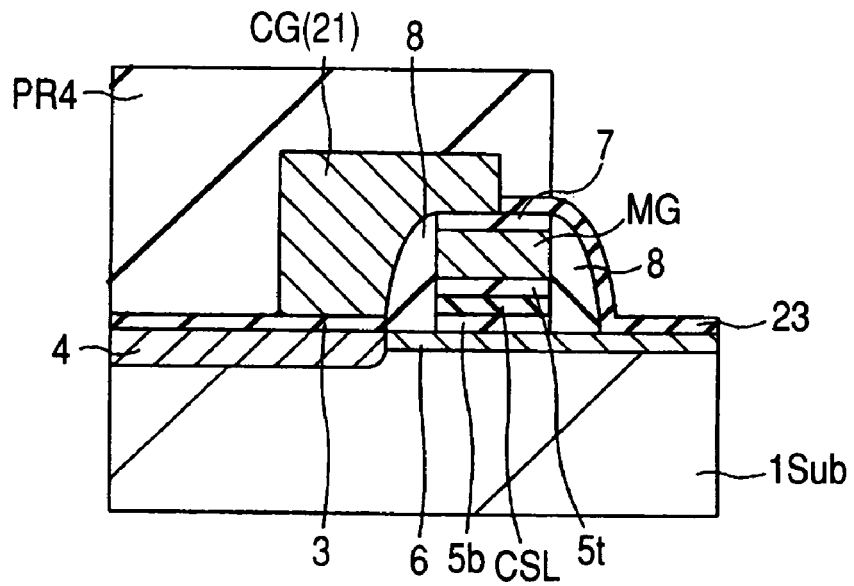
FIG. 49 is a cross section of the main portion during a step in the process of manufacturing the semiconductor device, subsequent to the step of FIG. 48.

Subsequently, as shown in FIG. 47, the gate insulating film 3 is formed on the main surface of the substrate 1Sub. On the gate insulating film 3, the conductive film 21, which is made of, for example, low-resistant polysilicon, is deposited by CVD. After that, the resist pattern PR3 for forming the control gate electrode is formed over the conductive film 21. By patterning the conductive film 21, while using the resist pattern PR3 as an etching mask, as shown in FIG. 48, the control gate electrode CG is formed. At this time, the conductive film 21a remains on a lower part side of the side surface of the side wall 8 on one side surface of the memory gate electrode MG. In the fifth embodiment, the conductive film 21a remains on the insulating film 23. The resist pattern PR4 for removing the conductive film 21a is formed over the main surface of the substrate 1Sub by a lithography technique. After that, the resist pattern PR4 is used as an etching mask and the etching process is performed, thereby removing the conductive film 21a, as shown in FIG. 49. In the fifth embodiment, the etch selectivity between polysilicon and the insulating film 23 is set to be high and the etching process is performed under the condition that polysilicon is easier to etch than the insulating film 23. Since the insulating film 23, which is thicker than the gate insulating film 3, is provided as the lower layer of the remaining conductive film 21a made of polysilicon (between the conductive film 21a and the substrate 1Sub), the main surface of the substrate 1Sub is protected and can be prevented from being etched. That is, roughness of the substrate 1Sub caused by removal of the remained conductive film 2a can be prevented. Therefore, a decrease in the drain current Ids of the memory cell of the split-gate electrode type can be prevented, so that high-speed operation (data high-speed reading) of the memory cell of the split-gate electrode type can be maintained.

Figure 50:
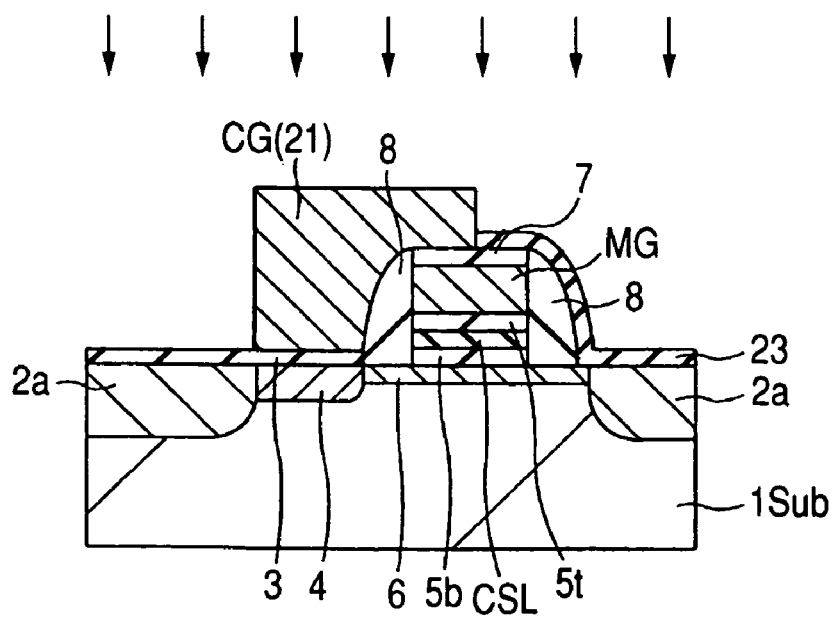
FIG. 50 is a cross section of the main portion during a step in the process of manufacturing the semiconductor device, subsequent to the step of FIG. 49.
Figure 51:
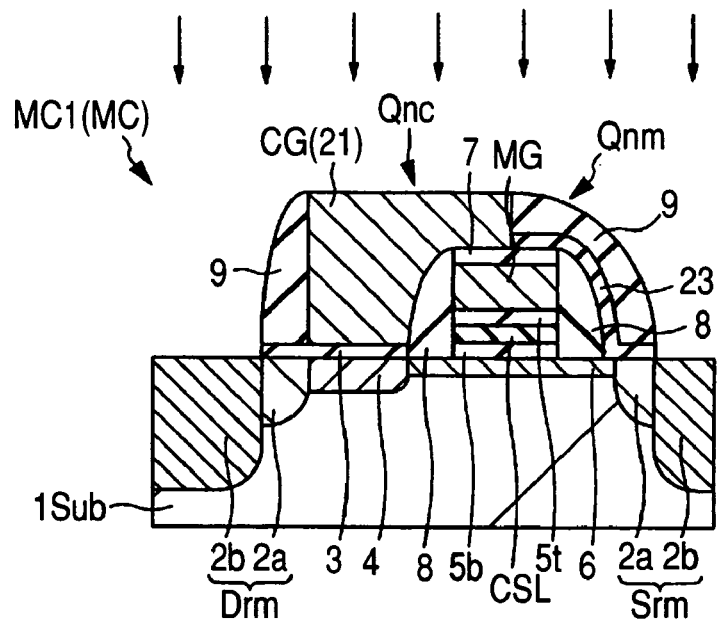
FIG. 51 is a cross section of the main portion during a step in the process of manufacturing the semiconductor device, subsequent to the step of FIG. 50.
Figure 52:
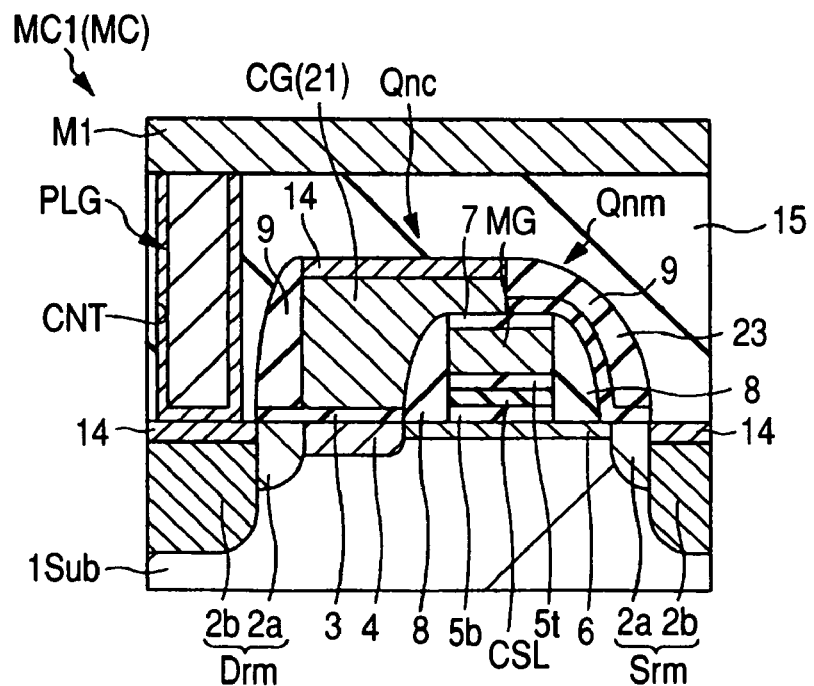
FIG. 52 is a cross section of the main portion during a step in the process of manufacturing the semiconductor device, subsequent to the step of FIG. 51.

After removal of the resist pattern PR4, as shown in FIG. 50, an impurity such as phosphorus, arsenic, and the like is ion implanted into the substrate 1Sub, thereby forming the $n^-$ type semiconductor region 2a so as to be self-aligned with the control gate electrode CG and the memory gate MG. Subsequently, as shown in FIG. 51, in a manner similar to the first embodiment, the side walls 9 are formed; and, after that, the $n^+$ type semiconductor region 2b is formed in the main surface of the substrate 1Sub so as to be self-aligned with the control gate electrode CG and the memory gate electrode MG. In such a manner, the drain region Drm and the source region Srm of the memory cell MC1 are formed to thereby form the nMISQnc transistor for selection and the nMISQnm transistor for memory. After that, as shown in FIG. 52, in a manner similar to the first embodiment, the silicide layer 14 is formed by the salicide process. By performing the process of depositing the insulating film 15, the process of forming the contact hole CNT, the process of forming the plug PLG, and the process of forming the first wiring line M1, the semiconductor device is manufactured.

The fifth embodiment may be combined with the first and second embodiments. Specifically, the dent 13 is formed in the main surface of the substrate 1Sub, and, after that, the p-type semiconductor region 4 is formed. Subsequently, the insulating film 23 is deposited and the control gate electrode CG is formed.

The fifth and fourth embodiments may be combined with each other. In this case, each of the insulating films 19 and 23 may be deposited to achieve the respective objects. Alternately, the insulating film 23 for protection may be used as the insulating film 19 for a spacer at the time of forming the p-type semiconductor region 4 of the fourth embodiment. To be more specific, after performing the processes of FIGS. 8 to 11, the insulating film 23 is deposited over the main surface of the substrate 1Sub, and, further, an impurity is implanted in a manner similar to the fourth embodiment to form the p-type semiconductor region 4. The subsequent processes are similar to those described with reference to FIG. 45 and subsequent diagrams. In this case, as compared with the case of depositing the insulating film 23 for protection and the insulating film 19 for a spacer separately, the process of manufacturing the semiconductor device can be reduced, the manufacturing time of the semiconductor device can be shortened, and the cost can be reduced.

Sixth Embodiment

As a sixth embodiment, which represents a modification of the fifth embodiment, a case where the insulating film 23 for protection is formed by a gate insulating film of another MIS transistor on the same substrate will be described. In the sixth embodiment, the process can be commonly used, so that the manufacturing time of the semiconductor device can be shortened and the cost can be reduced.

FIGS. 53 to 61 are cross sections each showing a main portion of the substrate 1Sub in a process of manufacturing a semiconductor device of the sixth embodiment. The left part of each diagram shows the cross section of the main portion of the memory region, and the right part shows the cross section of the main portion of the formation region of a high-withstand-voltage nMIS for a peripheral circuit.

Figure 53:
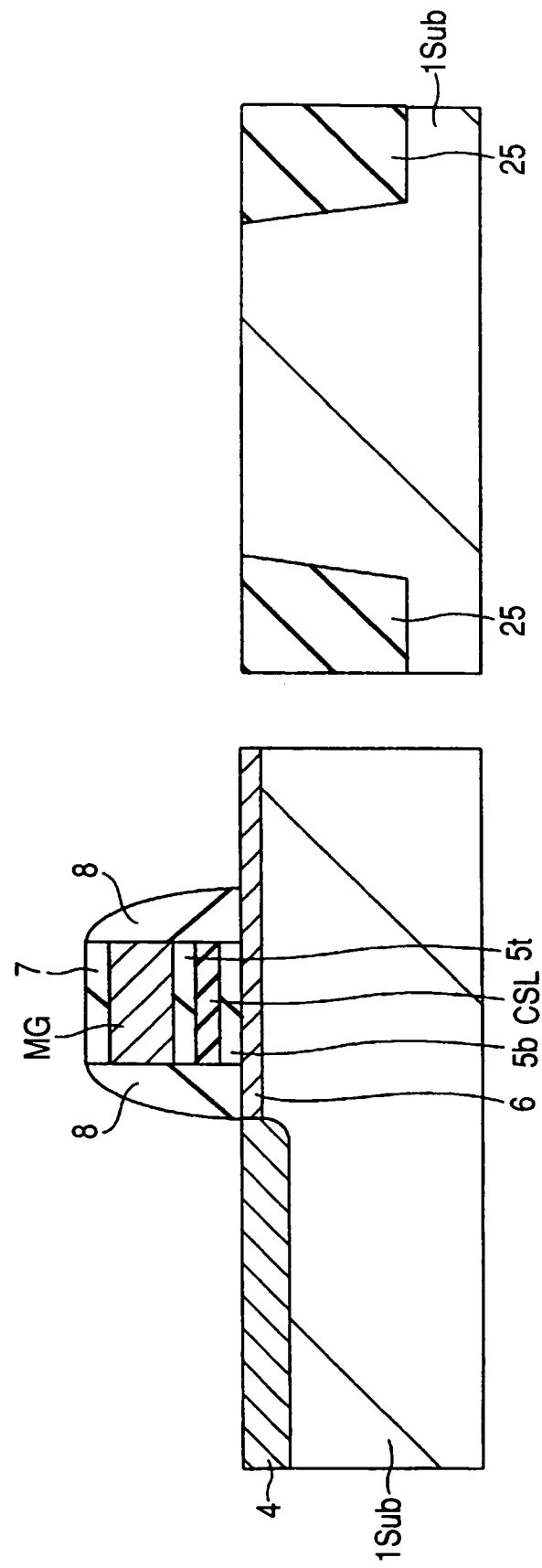
FIG. 53 is a cross section of a main portion during a step in the process of manufacturing a semiconductor device representing another embodiment of the invention.

FIG. 53 is a cross section of a main portion of the substrate 1Sub (semiconductor wafer) obtained by performing the process described with reference to FIG. 44 after the processes illustrated in FIGS. 8 to 11. In the right part of FIG. 53, for example, isolation parts 25, each having a groove shape and called a SGI (Shallow Groove Isolation), are formed in the main surface of the substrate 1Sub. The isolation parts 25 are formed by burying, for example, a groove formed in the substrate 1Sub with a silicon oxide film. By the isolation parts 25, an active region is specified.

Figure 54:
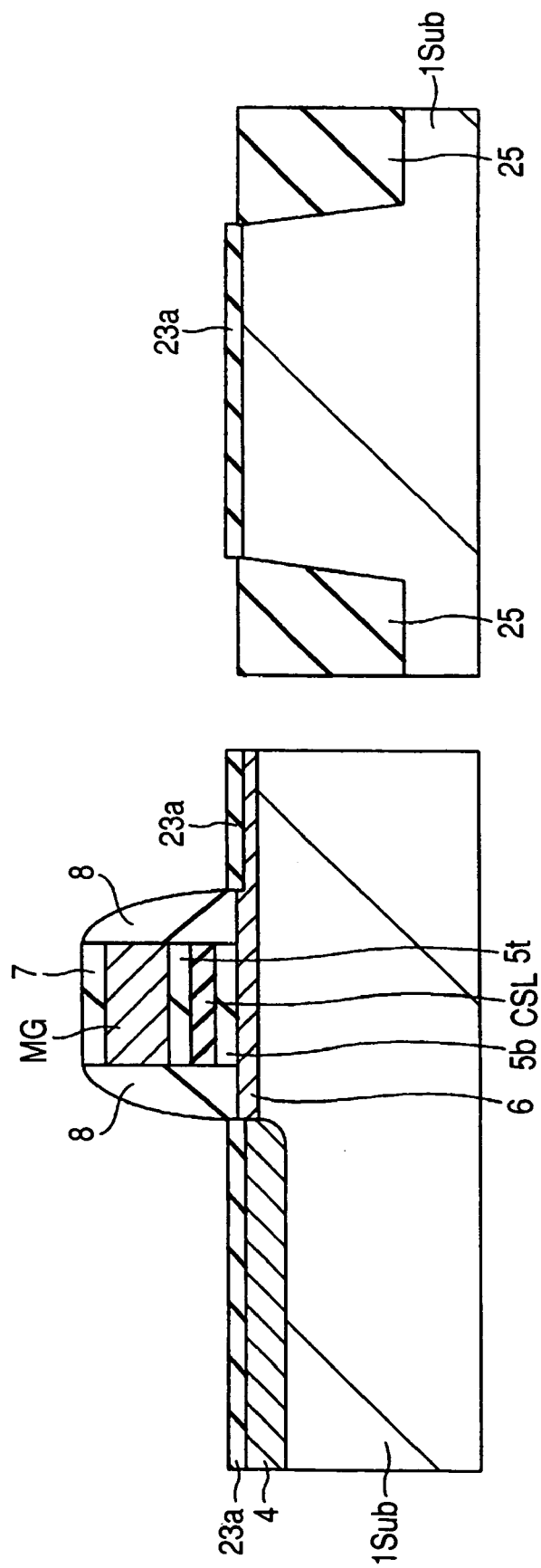
FIG. 54 is a cross section of the main portion during a step in the process of manufacturing the semiconductor device, subsequent to the step of FIG. 53.
Figure 55:
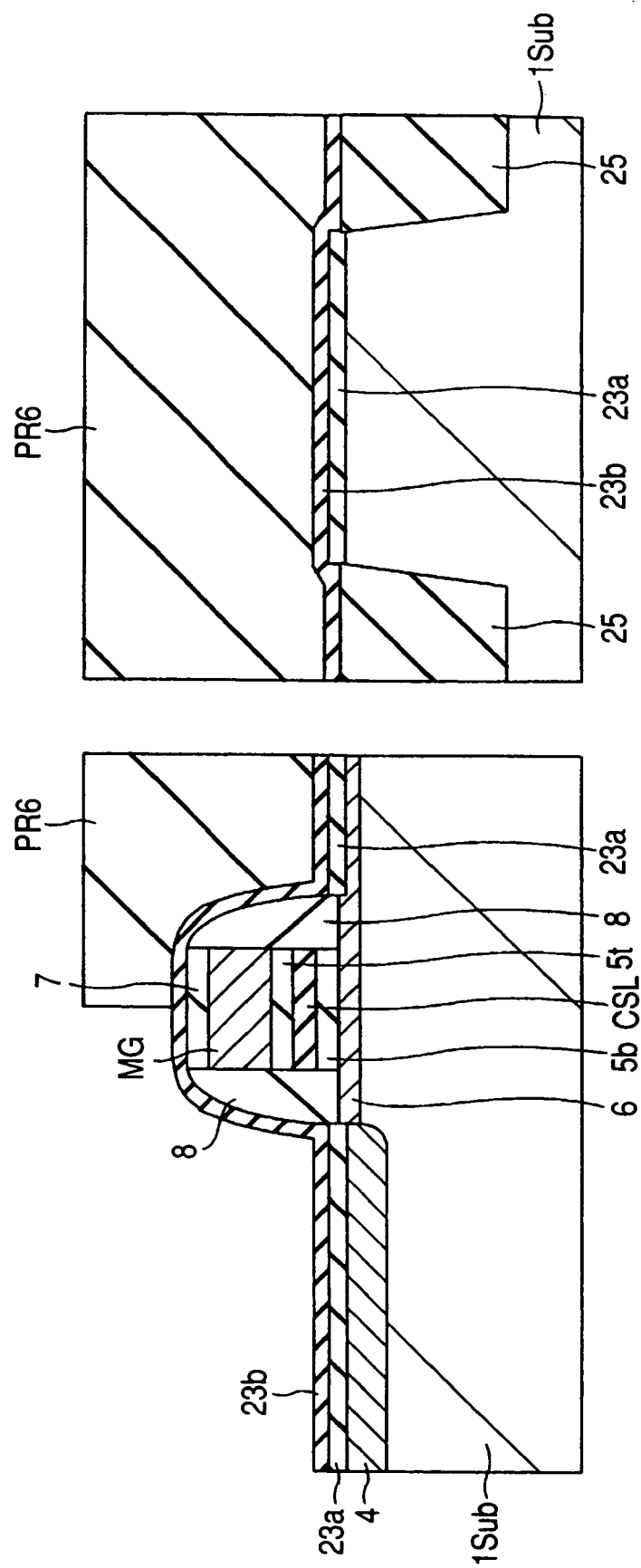
FIG. 55 is a cross section of the main portion during a step in the process of manufacturing the semiconductor device, subsequent to the step of FIG. 54.
Figure 56:
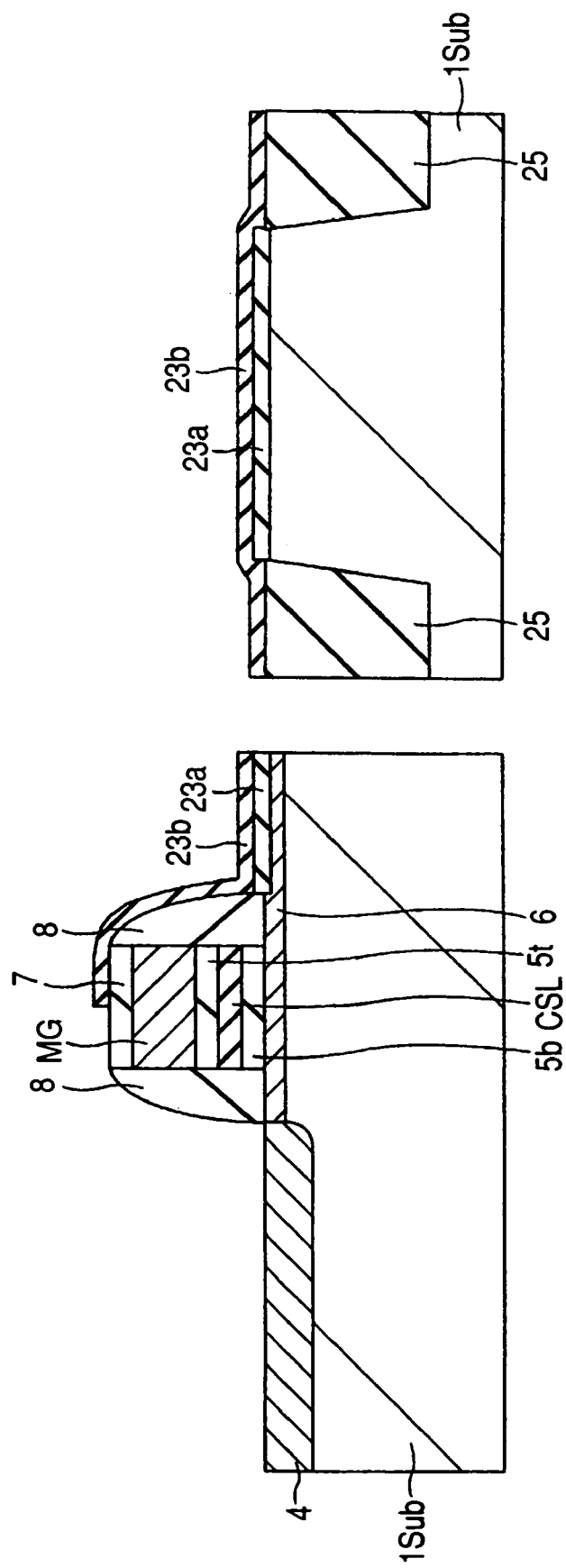
FIG. 56 is a cross section of the main portion during a step in the process of manufacturing the semiconductor device, subsequent to the step of FIG. 55.

First, by performing an oxidizing process on the substrate 1Sub, as shown in FIG. 54, a gate insulating film 23a having a high-withstand-voltage nMIS is formed on the main surface of the substrate 1Sub. The gate insulating film 23a has, for example, a thickness of about 2 to 8 nm and is made of silicon oxide. The gate insulating film 23a is formed not only in the region for forming the high-withstand-voltage nMIS, but also over the main surface of the substrate 1Sub of the memory region. Subsequently, as shown in FIG. 55, an insulating film 23b having a thickness of about 13 nm and made of silicon oxide is deposited by CVD and the like over the main surface of the substrate 1Sub, and, after that, an annealing process is performed to improve the film quality of the insulating film 23b. The insulating films 23a and 23b become the gate insulating films of the high-withstand-voltage nMIS. By depositing the insulating film 23b, the gate insulation withstand voltage of the high-withstand-voltage nMIS can be improved. After that, over the main surface of the substrate 1Sub, a resist pattern PR6, from which the region for forming the nMIS for selection in the memory region is exposed and which covers the region for forming the high-withstand-voltage nMIS, is formed by a lithography technique. The resist pattern PR6 is used as an etching mask and an etching process is performed, thereby patterning the insulating films 23a and 23b, as shown in FIG. 56. In the region for forming the nMIS for selection of the memory region, the insulating film 23a is removed, and the main surface of the substrate 1Sub is exposed. Obviously, the dent 13 may be formed after that by partly etching the main surface of the substrate 1Sub in the region for forming the nMIS transistor for selection in a manner similar to the first embodiment.

Figure 57:
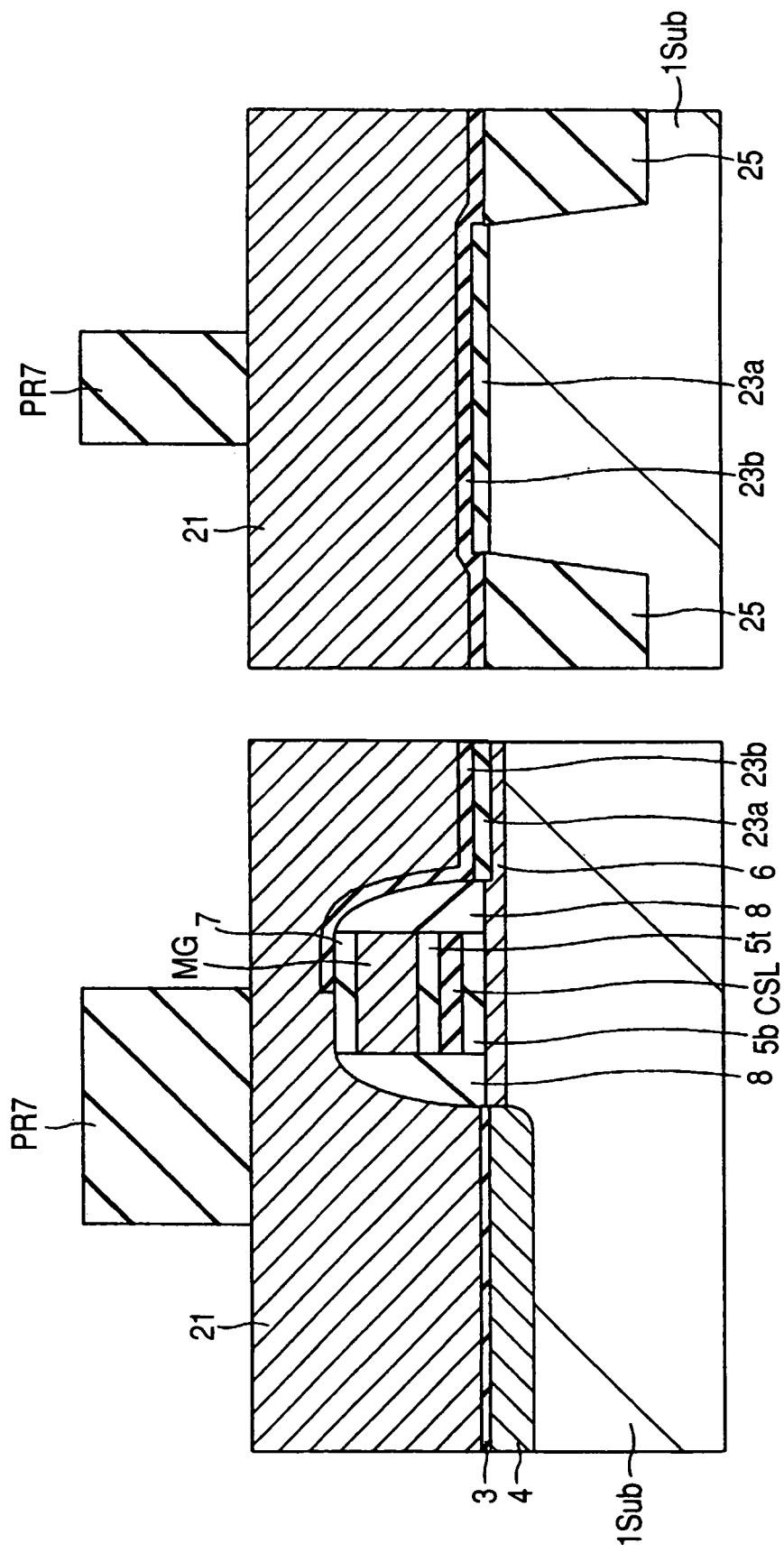
FIG. 57 is a cross section of the main portion during a step in the process of manufacturing the semiconductor device, subsequent to the step of FIG. 56.
Figure 58:
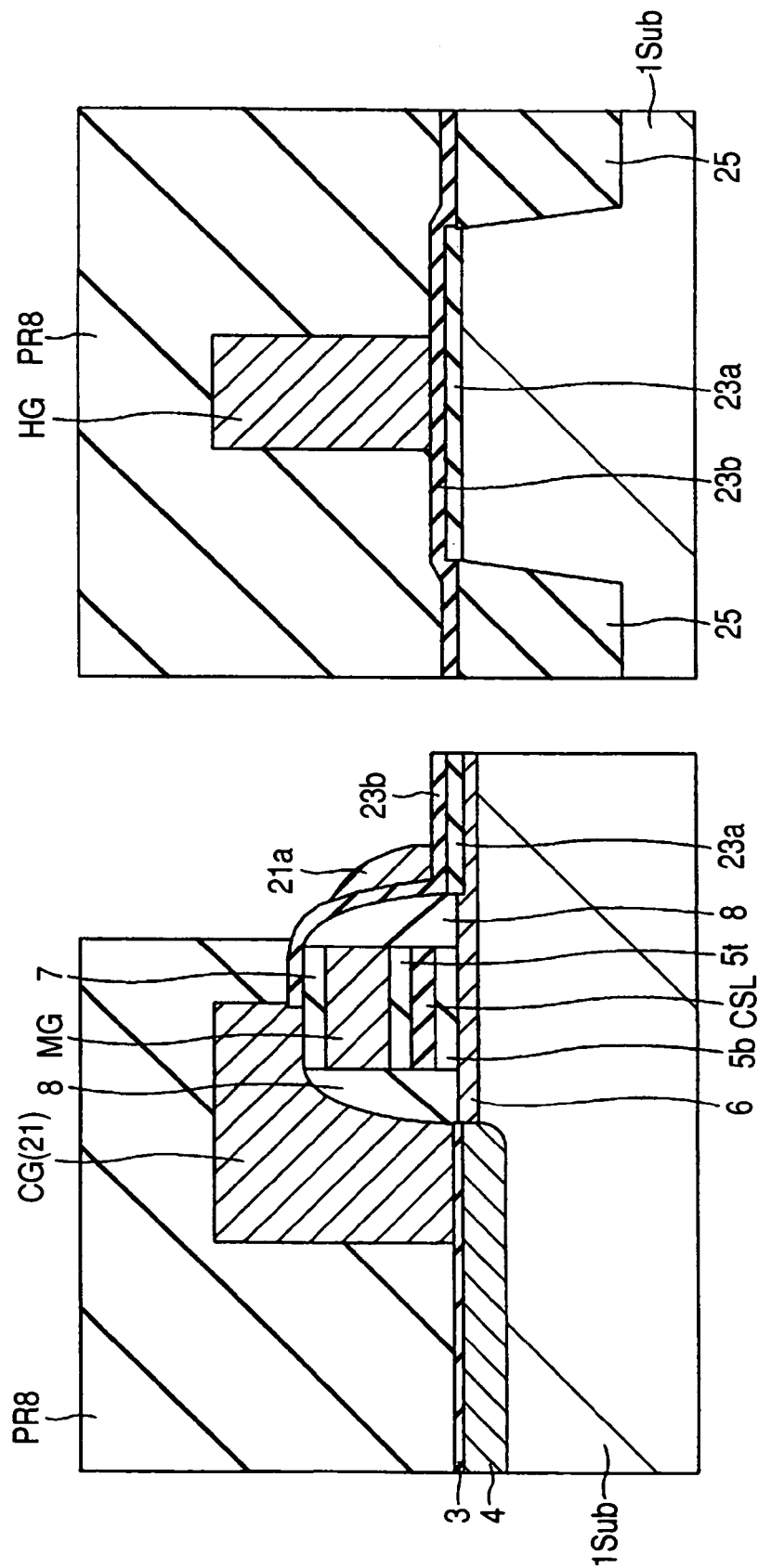
FIG. 58 is a cross section of the main portion during a step in the process of manufacturing the semiconductor device, subsequent to the step of FIG. 57.
Figure 59:
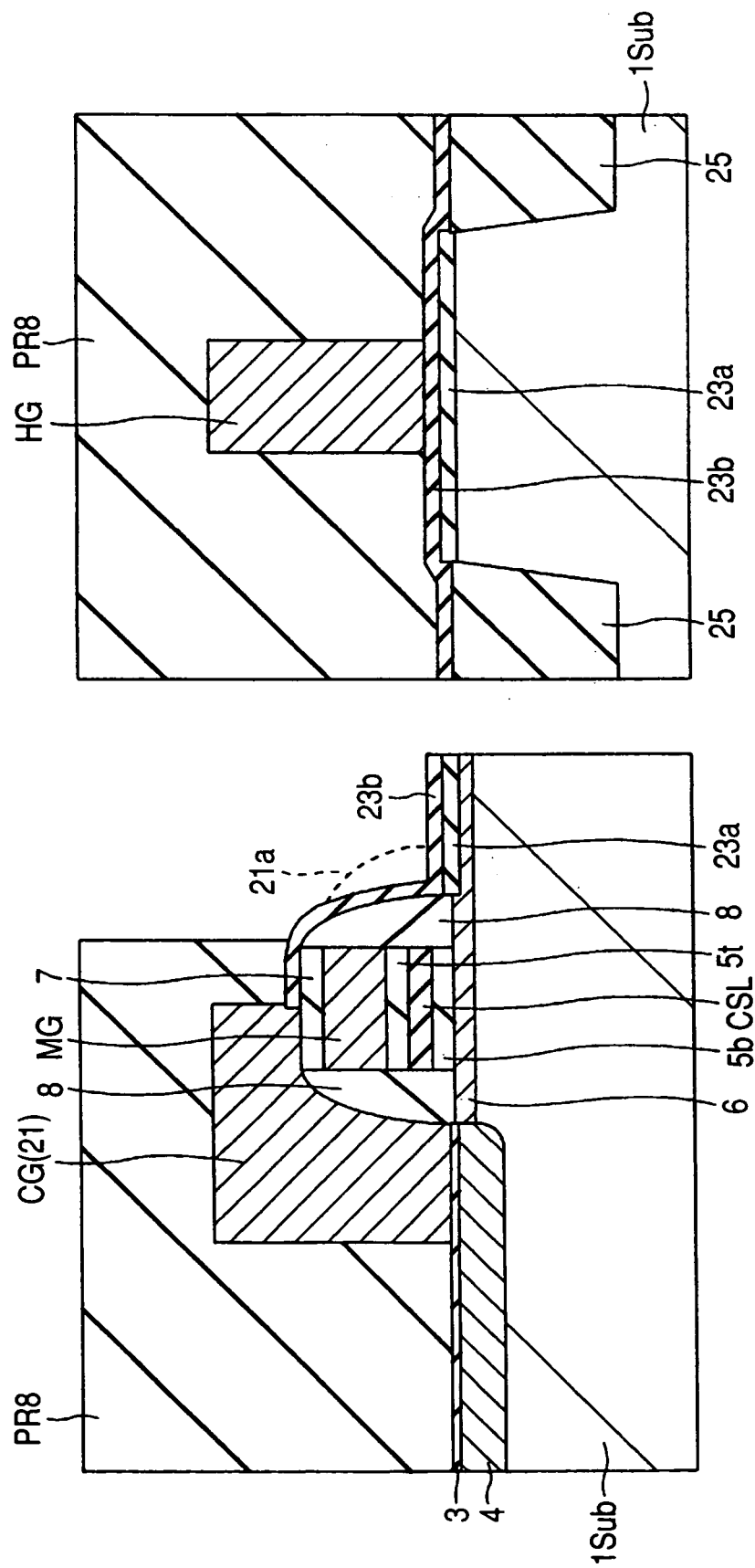
FIG. 59 is a cross section of the main portion during a step in the process of manufacturing the semiconductor device, subsequent to the step of FIG. 58.

Subsequently, as shown in FIG. 57, by performing an oxidizing process on the substrate 1Sub, the gate insulating film 3, which is made of, for example, silicon oxide, is formed over the main surface of the substrate 1Sub. The gate insulating film 3 becomes a gate insulating film of a low-withstand-voltage MIS, such as an nMIS for selection. The gate insulating film 3 is thinner than the gate insulating films 23a and 23b of the high-withstand-voltage nMIS and has a thickness of, for example, about 2 to 5 nm. Subsequently, the conductive film 21, which is made of, for example, low-resistive polysilicon, is deposited over the main surface of the substrate 1Sub by CVD and the like, and, after that, a resist pattern PR7 is formed by a lithography technique. The resist pattern PR7 is a pattern covering the control gate electrode formation region of the memory region and the gate electrode formation region of the high-withstand-voltage nMIS transistor and exposing the other part. After that, the resist pattern PR7 is used as an etching mask, and the conductive film 21 is patterned by the etching process, thereby forming the control gate electrode CG of the nMIS for selection of the memory cell and a gate electrode HG of the high-withstand-voltage nMIS of the peripheral circuit, as shown in FIG. 58. At this time, the conductive film 21a remains on the lower part of the side surface of the side wall 8 of one side surface of the memory gate electrode MG. In the fifth embodiment, the conductive film 21a remains on the insulating films 23a and 23b. To remove the conductive film 21a, a resist pattern PR8, from which the conductive film 21a is exposed and which covers the other region, is formed over the main surface of the substrate 1Sub. The resist pattern PR8 is used as an etching mask and an etching process similar to the process of removing the conductive film 21a in the fifth embodiment is performed, thereby removing the conductive film 21a, as shown in FIG. 59. In such a manner, the stacked film consisting of the insulating films 23a and 23b, which is thicker than the gate insulating film 3, is provided as a lower layer of the remained conductive film 21a made of polysilicon (between the conductive film 21a and the substrate 1Sub). Thus, the main surface of the substrate 1Sub is protected and can be prevented from being etched. Therefore, the drain current Ids of the memory cell of the split-gate electrode type can be prevented from being decreased, so that high-speed operation (high-speed data reading) of the memory cell of the split-gate electrode type can be maintained.

Figure 60:
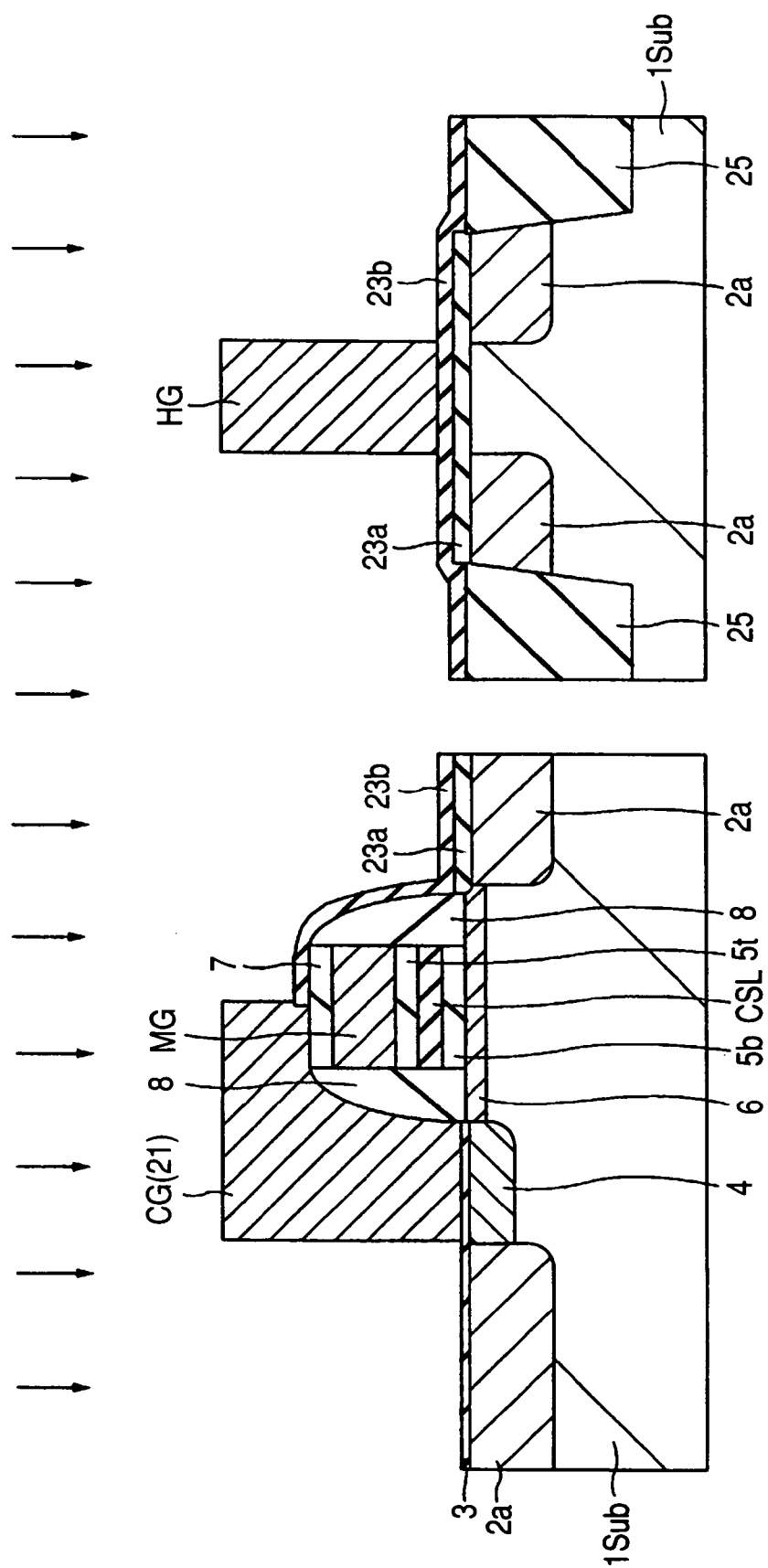
FIG. 60 is a cross section of the main portion during a step in the process of manufacturing the semiconductor device, subsequent to the step of FIG. 59.
Figure 61:
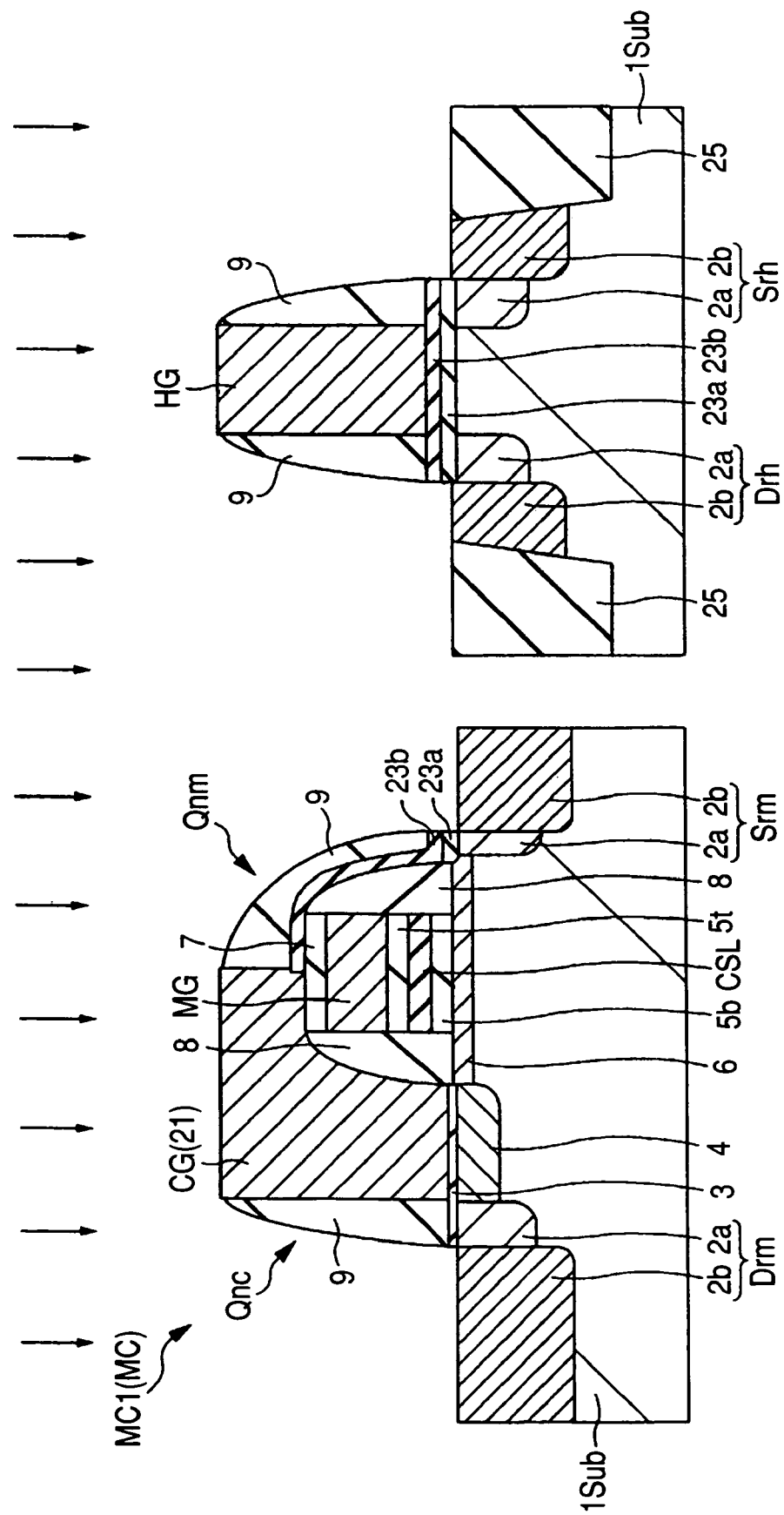
FIG. 61 is a cross section of the main portion during a step in the process of manufacturing the semiconductor device, subsequent to the step of FIG. 60.

The resist pattern PR8 is removed, and, as shown in FIG. 60, while leaving the insulating films 23a and 23b, for example, arsenic is implanted into the substrate 1Sub by ion implantation and the like, thereby simultaneously forming n⁻ type semiconductor regions 2a for the memory cell and the high-withstand-voltage nMIS. Subsequently, an insulating film made of, for example, silicon oxide is deposited over the main surface of the substrate 1Sub by CVD and the like and then etched back by anisotropic dry etching, thereby simultaneously forming the side walls 9 on the side surfaces of the control gate electrode CG and the memory gate electrode MG and the side surfaces of the gate electrode HG of the high-withstand-voltage nMIS. At this time, the insulating films 23a and 23b exposed from the side walls 9 are also removed, as shown in FIG. 61. After that, for example, by implanting phosphorus into the substrate 1Sub by an ion implantation method and the like, the n+ type semiconductor regions 2b for the memory cell and for the high-withstand-voltage nMIS are simultaneously formed. In such a manner, the drain region Drm and the source region Srm of the memory cell MC1 and a drain region Drh and a source region Srh of the high-withstand-voltage nMISQnh transistor are simultaneously formed.

As described above, in the sixth embodiment, by forming the insulating films 23a and 23b for protection by the gate insulating films 23a and 23b of the high-withstand-voltage nMISQnh transistor, the process can be commonly used. Thus, the manufacturing time of the semiconductor device can be shortened and the cost can be reduced.

In the sixth embodiment, the case of forming the insulating film for protection used at the time of removing the remaining conductive film 21a by the stacked film of the insulating film 23a formed by the oxidizing method and the insulating film 23b formed by the CVD has been described. Alternately, the insulating film for protection may be formed by one of the insulating films 23a and 23b.

Seventh Embodiment

In the case of forming the insulating film for protection in the fifth and sixth embodiments by CVD, the gate electrode formed first in the memory cell is covered with the insulating film for protection, so that a silicide layer cannot be formed on the gate electrode.

In the seventh embodiment, the silicide layer is formed in a contact hole part in which a line, such as a first wiring line, comes into contact and is connected, in the gate electrode formed first. With this configuration, the contact resistance between the gate electrode formed first and the wiring, such as the first wiring line, can be reduced.

Figure 62:
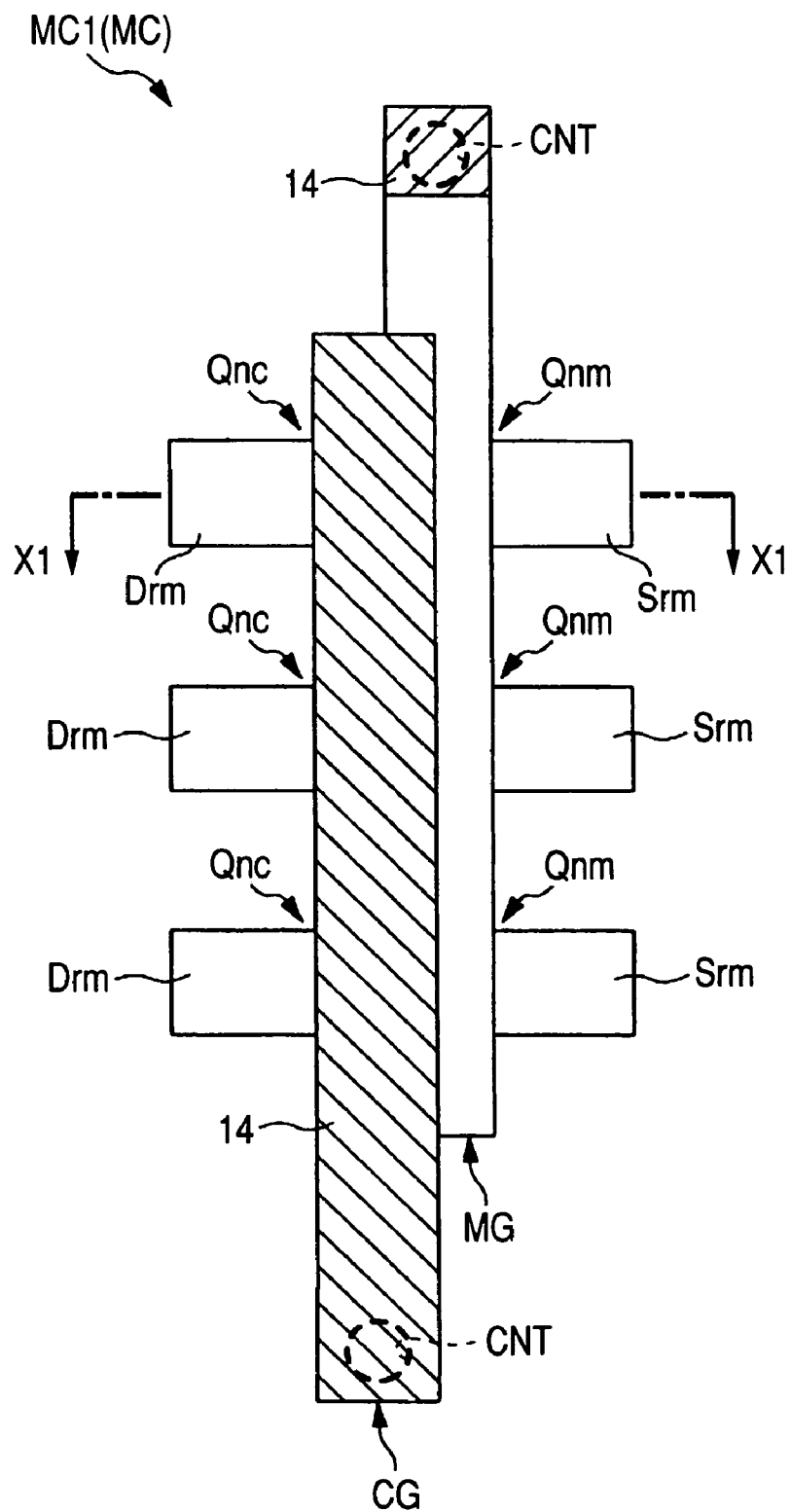
FIG. 62 is a plan view of a main portion of an example of a memory region in a semiconductor device representing another embodiment of the invention.

FIG. 62 is a plan view of a main portion of the memory region showing a specific example of the seventh embodiment. The cross section taken along line X1—X1 of FIG. 62 corresponds to cross sections of the left part of FIGS. 44 to 52 of the fifth embodiment and FIGS. 53 to 61 of the sixth embodiment. Over the top surface of the control gate electrode CG and the memory gate electrode MG, a portion in which the silicide layer 14 is formed by the salicide process is hatched. The silicide layer 14 is formed over the entire top surface of the control gate electrode CG, which is formed later. On the other hand, the silicide layer 14 is formed only in the region in which the contact hole CNT is disposed in the top surface of the memory gate electrode MG, which is formed first. With this configuration, the contact resistance between the plug PLG in the contact hole CNT and the memory gate electrode MG can be reduced. The contact hole CNT is electrically connected to the first wiring line.

To form such a configuration, in the processes described with reference to FIGS. 45 and 46, the pattern shape of the resist pattern PR5 of FIG. 45 is formed so that the insulating film 23 for protection in the region in which the contact hole CNT is arranged is also exposed. By use of an etching process, the portion of the insulting film 23 for protection and the portion of the insulating film 7 in the region in which the contact hole CNT of the memory gate electrode MG is arranged are also removed. After the process described with reference to FIG. 51, the salicide process is performed in a state where the top surface of the control gate electrode CG and the region in which the contact hole CNT of the memory gate electrode MG is arranged are exposed, thereby forming the silicide layer 14 in the region where the contact hole CNT is disposed over the entire top surface of the control gate electrode CG and the top surface of the memory gate electrode MG. Such a method is similarly employed also in the case of applying the features of the seventh embodiment to the sixth embodiment.

As a method of forming the silicide layer 14, a high-refractory metal film, such as a cobalt (Co) film, a titanium (Ti) film, a nickel (Ni) film, and the like, is formed over the entire main surface of the substrate 1Sub by sputtering and is subjected to heat treatment to make the polysilicon film and the high refractory metal film of the control gate electrode CG and the memory gate electrode MG react with each other. After that, an unreacted high-refractory metal film is removed, and the silicide layer 14 serving as a metal/semiconductor reaction layer is formed.

The seventh embodiment and the fifth and sixth embodiments can also be applied to the split-gate type memory cells of FIGS. 4 and 5.

Eighth Embodiment

As an eighth embodiment, an example of solving another problem which has been found for the first time by the inventors of the present invention in connection with a split-gate electrode type memory cell will be described. The problem is that the width (dimension in the shorter side) of the charge storage layer CSL is larger than that of the memory gate electrode, and, as a result, it becomes difficult to perform an erasing operation.

Figure 63:
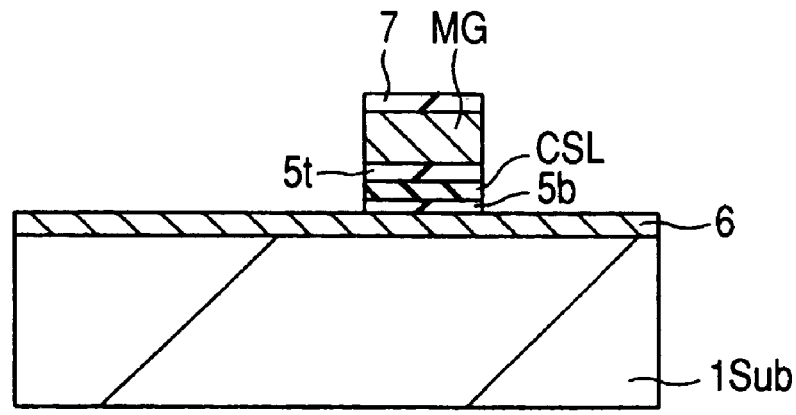
FIG. 63 is a cross section of a main portion during a step in the process of manufacturing a semiconductor device, illustrating another problem which occurs in a process of forming the memory cell of FIG. 1.
Figure 64:
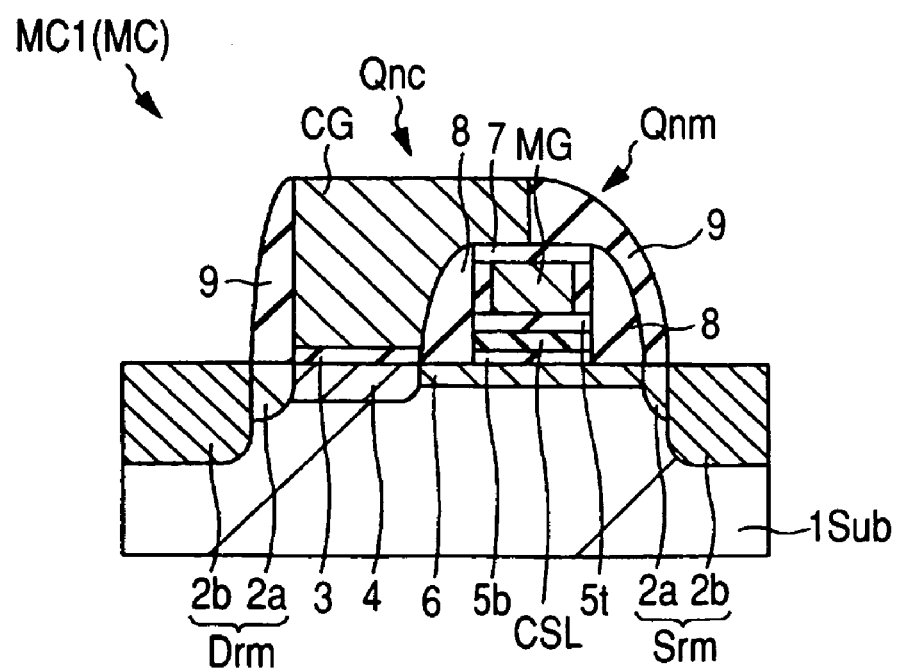
FIG. 64 is a cross section of a main portion during a step in the process of manufacturing the semiconductor device, subsequent to the step of FIG. 63.
Figure 65:
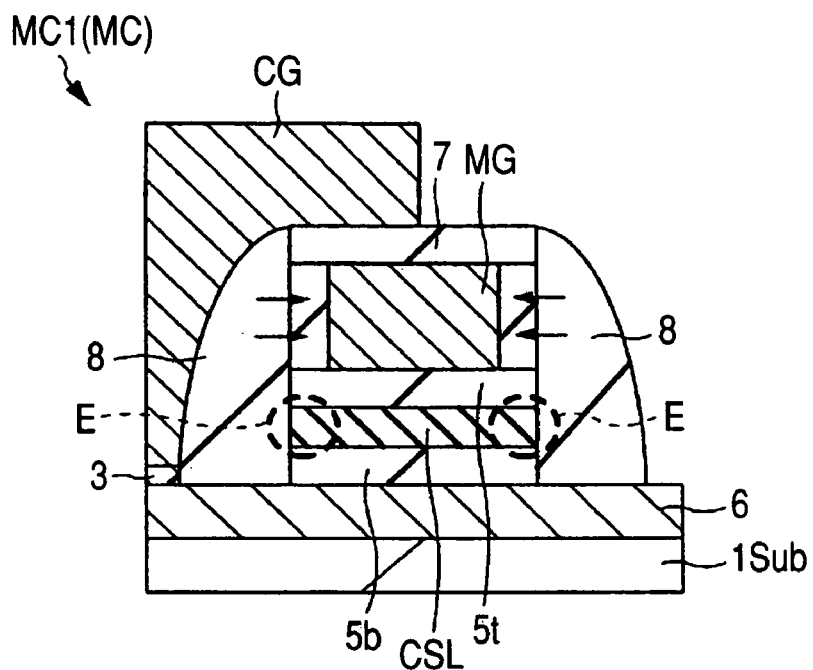
FIG. 65 is an enlarged cross section of the main portion of FIG. 64.

The problem will be described first with reference to FIGS. 63 to 65. FIG. 63 is a cross section of a main portion of the substrate 1Sub after the process of forming the memory gate electrode MG is performed. In the process, usually, the memory gate electrode MG, which is made of low-resistant polysilicon and the like, is formed by dry etching, and, after that, the charge storage layer CSL is selectively etched by wet etching. In this case, etching is performed in a state where the end portion in the width direction (the direction along the main surface of the substrate 1Sub, the shorter side) of the memory gate electrode MG and an end portion in the width direction of the charge storage layer CSL almost match each other. However, when the following oxidizing process is performed in such a state, as shown in FIGS. 64 and 65, both end portions in the width direction of the memory gate electrode MG are oxidized (refer to the arrows in FIG. 65), whereas the charge storage layer CSL is not oxidized and remains since it is made of silicon nitride. As a result, the substantial width (dimension in the short side) of the memory gate electrode MG becomes smaller than that of the charge storage layer CSL, and both end portions in the width direction of the charge storage layer CSL are projected to the outside in the width direction of the memory gate electrode MG. The physical distance of the projected portions E at both ends of the charge storage layer CSL from the memory gate electrode MG becomes long so that the projected portions E are not easily influenced by the electric field from the memory gate electrode MG. Consequently, at the time of an erasing operation in the memory cell MC, a problem occurs in that it is difficult to move charges stored in the projected portions E at both ends of the charge storage layer CSL. The problem occurs irrespective of the direction of movement of the charges of the charge storage layer CSL in the erasing operation of the memory cell MC. Specifically, in the embodiment, the erasing operation is performed by moving electrons to the memory gate electrode MG. However, in a memory cell in which electrons are moved to the substrate 1Sub, a similar problem occurs. This problem occurs also in the memory cells of FIGS. 4 and 5.

In the eighth embodiment, therefore, a process of over-etching the charge storage layer so that the charge storage layer becomes smaller than the memory gate electrode in an upper part is provided. By this process, a part of the charge storage layer can be prevented from being projected to the outside of the memory gate electrode finally. That is, a part by which data erasing (extraction of charges) becomes difficult is not formed in the charge storage layer. Therefore, the operating speed (data erasing speed) of the memory cell of the split-gate electrode type can be improved. Since the rate of occurrence of a poor erasing operation can be reduced, the yield of the semiconductor device can be improved. A specific example will be described with reference to cross sections each showing a main portion of the substrate 1Sub of the memory region in the process of manufacturing the semiconductor device, with reference to FIGS. 66 to 70.

Figure 66:
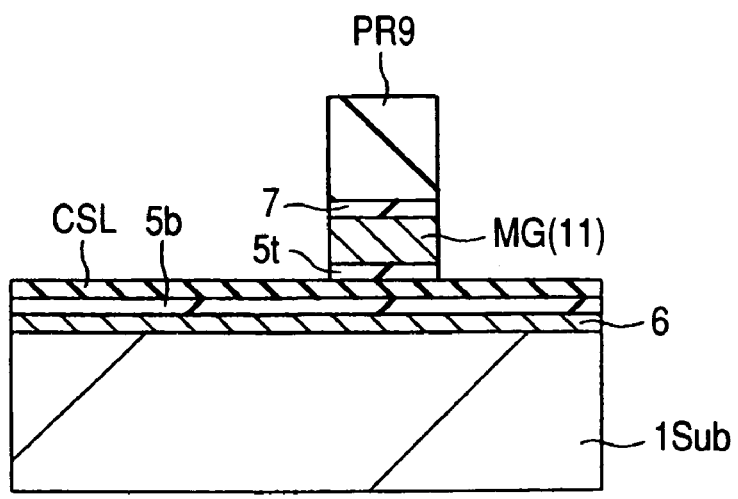
FIG. 66 is a cross section of a main portion during a step of the process of manufacturing a semiconductor device representing another embodiment of the invention.

First, in the process of forming the memory gate electrode of the memory cell, it is difficult to simultaneously etch the charge storage layer (silicon nitride) and the memory gate electrode (polysilicon), so that the etching process is performed in two stages. Specifically, after the processes described with reference to FIGS. 8 and 9 of the first embodiment, by performing dry etching using a resist pattern PR9 as an etching mask, the memory gate electrode MG and the insulating film 5t are patterned, as shown in FIG. 66. At this time, the etch selectivity between polysilicon and silicon nitride is set to be high and the etching process is performed under the condition that polysilicon is etched more easily.

Figure 67:
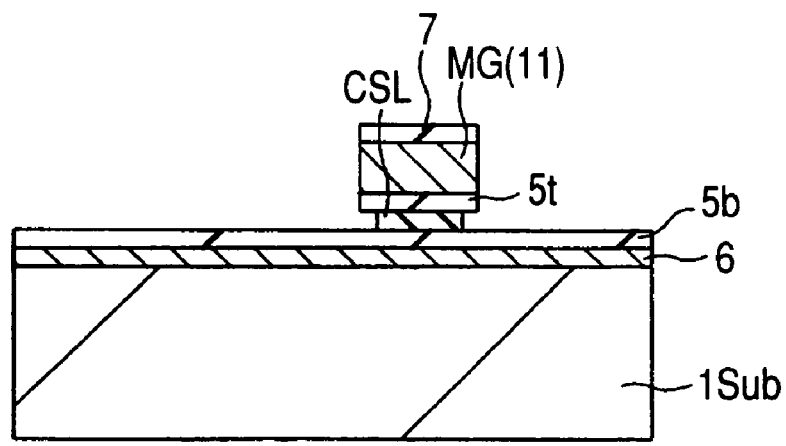
FIG. 67 is a cross section of the main portion during a step in the process of manufacturing the semiconductor device, subsequent to the step of FIG. 66.

Subsequently, the resist pattern PR9 is removed and a wet etching process using hot phosphoric acid and the like is performed on the substrate 1Sub, thereby selectively etching the charge storage layer CSL, as shown in FIG. 67. In the eighth embodiment, an over-etching process is performed so that exposed side surfaces at both ends in the width direction of the charge storage layer CSL are positioned on the inside of the exposed side surfaces at both ends in the width direction of the memory gate electrode MG. By this process, an inconvenience can be prevented such that the side surfaces at both ends in the width direction of the charge storage layer CSL are positioned on the outside of the side surfaces at both ends in the width direction of the memory gate electrode due to oxidation of the side surface parts at both ends in the width direction of the memory gate electrode MG in the oxidizing process performed after the over-etching process. A side etching amount (undercut amount or over-etching amount) of the charge storage layer CSL can be changed by adjusting time of wet etching using hot phosphoric acid.

Figure 68:
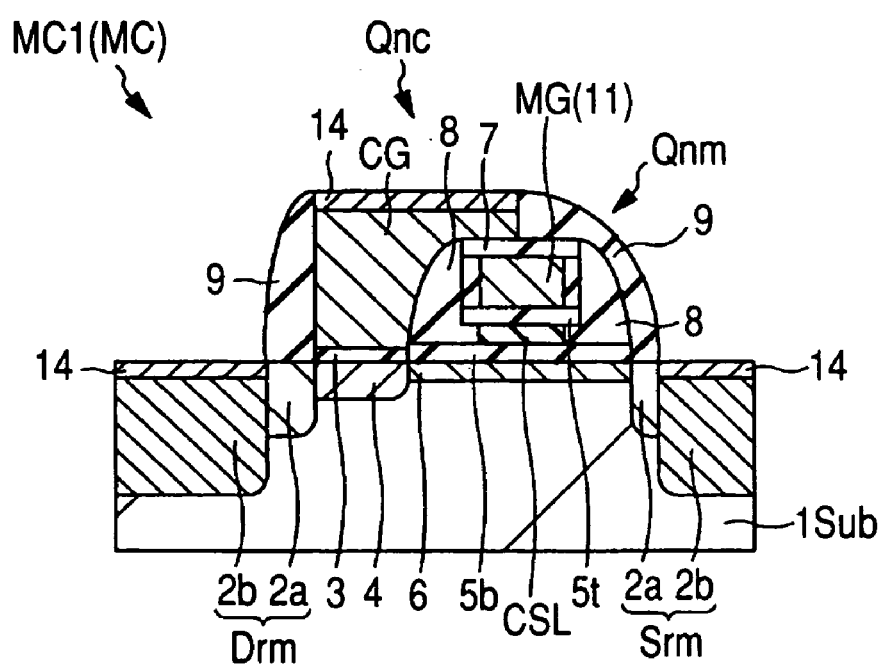
FIG. 68 is a cross section of the main portion during a step in the process of manufacturing the semiconductor device, subsequent to the step of FIG. 67.
Figure 69:
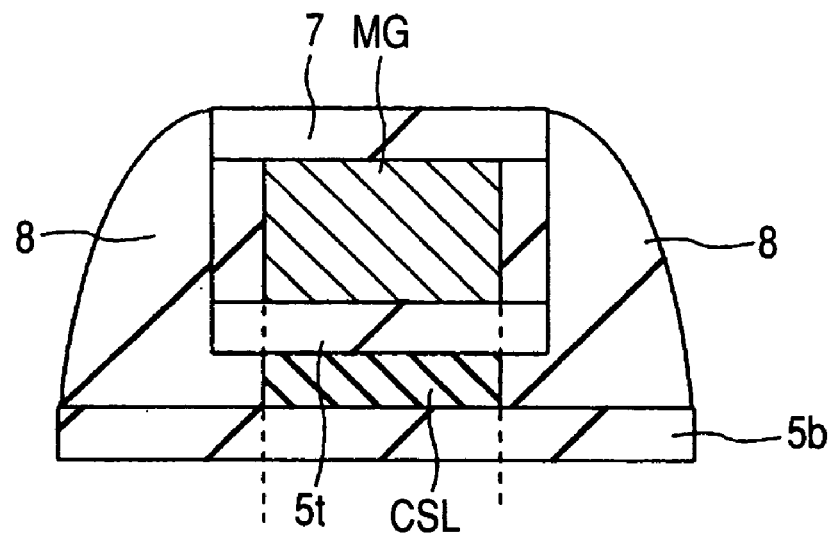
FIG. 69 is an enlarged cross section of the main portion of the memory cell in the semiconductor device of FIG. 68.

After that, by performing processes similar to those described in connection with the first embodiment, the memory cell MC1 of the split-gate type is formed, as shown in FIGS. 68 and 69. FIG. 69 is an enlarged cross section of the main portion of FIG. 68. Also, in the case of the eighth embodiment, as shown in FIGS. 68 and 69, the side surface portions of the memory gate electrode MG are oxidized by the oxidizing process after patterning of the charge storage layer CSL, and the dimension in the width direction of the memory gate electrode MG is slightly smaller than a design value. In the eighth embodiment, as described above, the dimension in the width direction of the charge storage layer CSL is set to be small in consideration of the fact that the memory gate electrode MG is reduced by oxidation, so that the side surfaces at both ends in the width direction of the charge storage layer CSL almost coincide with the side surfaces at both ends in the width direction of the memory gate electrode MG and are not projected to the outside of the memory gate electrode MG. Consequently, in the erasing operation of the memory cell MC1 of the split-gate type, a portion from which electrons are not easily extracted does not exist in the charge storage layer CSL, so that the data erasing speed can be improved. Since the portion from which electrons are not easily extracted does not exist in the charge storage layer CSL, the rate of occurrence of a poor erasing operation can be decreased and the yield of the semiconductor device can be improved.

Although the case where the portions at both ends in the width direction of the charge storage layer CSL finally almost coincide with those in the width direction of the memory gate electrode MG has been described above, in connection with the eighth embodiment, it suffices if the charge storage layer CSL is not projected to the outside of the memory gate electrode MG. As shown in the enlarged cross section of the main portion of the memory cell of FIG. 70, the invention does not eliminate a structure in which the width of the charge storage layer CSL is finally smaller than that of the memory gate electrode MG, and the portions at both ends in the width direction of the charge storage layer CSL are positioned on the inside of the portions at both ends in the width direction of the memory gate electrode MG. In the case of this structure, the entire area as seen in plan view of the charge storage layer CSL is included in the entire area as seen in plan view of the memory gate electrode MG. Consequently, the reliability of extraction of charges at the time of erasing can be improved.

Ninth Embodiment

As a ninth embodiment, which represents a modification of the eighth embodiment, an example of a case of applying the method of the eight embodiment to the method of forming the memory cell MC2 of the split-gate electrode type of FIG. 4 will be described.

Figure 71:
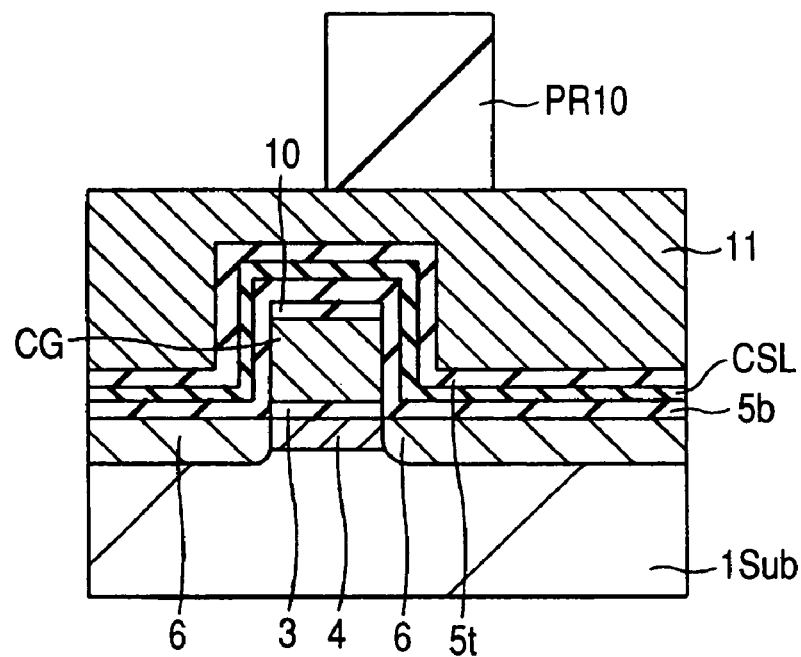
FIG. 71 is a cross section of a main portion during a step in the process of manufacturing a semiconductor device representing another embodiment of the invention.
Figure 72:
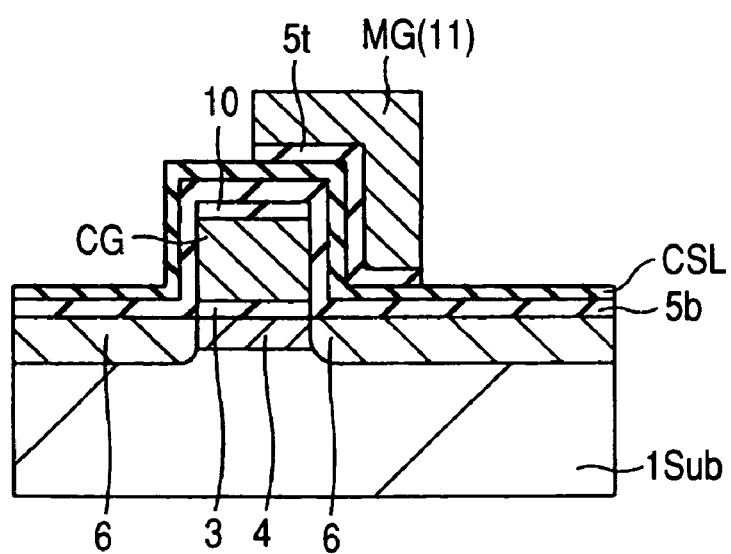
FIG. 72 is a cross section of the main portion during a step in the process of manufacturing the semiconductor device, subsequent to the step of FIG. 71.

First, after the processes described with reference to FIGS. 23 to 25, the n-type semiconductor region 6 is formed in the substrate 1Sub so as to be self-aligned by using the control electrode CG as a mask, as shown in FIG. 71. Subsequently, the insulating film 5b, charge storage layer CSL, insulating film 5t, and conductive film 11 are deposited in order on the substrate 1Sub by CVD and the like, and, after that, a resist pattern PR10 for forming the memory gate electrode is formed by a lithography technique. The resist pattern PR10 is used as an etching mask, and the conductive film 11 and the insulating film 5t exposed from the resist pattern PR10 are etched in a manner similar to the eighth embodiment. After that, the resist pattern PR10 is removed, and, as shown in FIG. 72, the memory gate electrode MG and the insulating film 5t are patterned.

Figure 73:
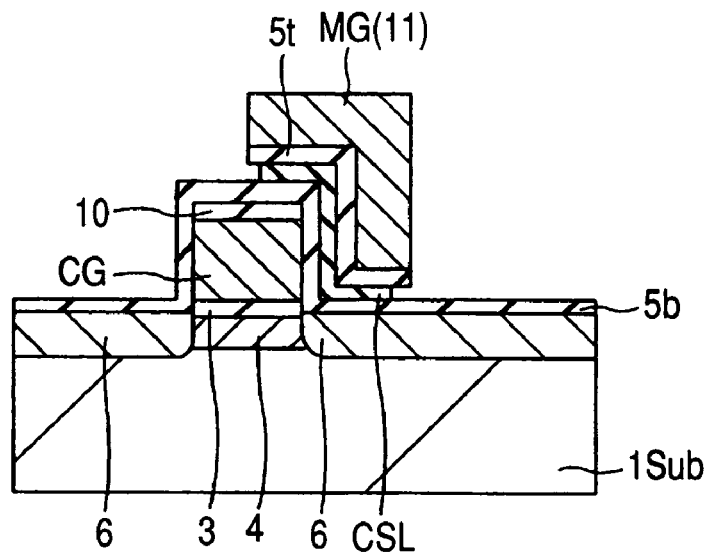
FIG. 73 is a cross section of the main portion during a step in the process of manufacturing the semiconductor device, subsequent to the step of FIG. 72.

Subsequently, in a manner similar to the eighth embodiment, the charge storage layer CSL is selectively etched by the wet etching process, thereby patterning the charge storage layer CSL, as shown in FIG. 73. At this time, also in the ninth embodiment, an over-etching process is performed so that both exposed side surfaces of the charge storage layer CSL are positioned on the inside of the exposed side surfaces of the memory gate electrode MG. Thus, in a manner similar to the eighth embodiment, an inconvenience can be prevented such that the side surfaces at both ends in the width direction of the charge storage layer CSL are positioned on the outside of the side surfaces at both ends in the width direction of the memory gate electrode MG.

Figure 70:
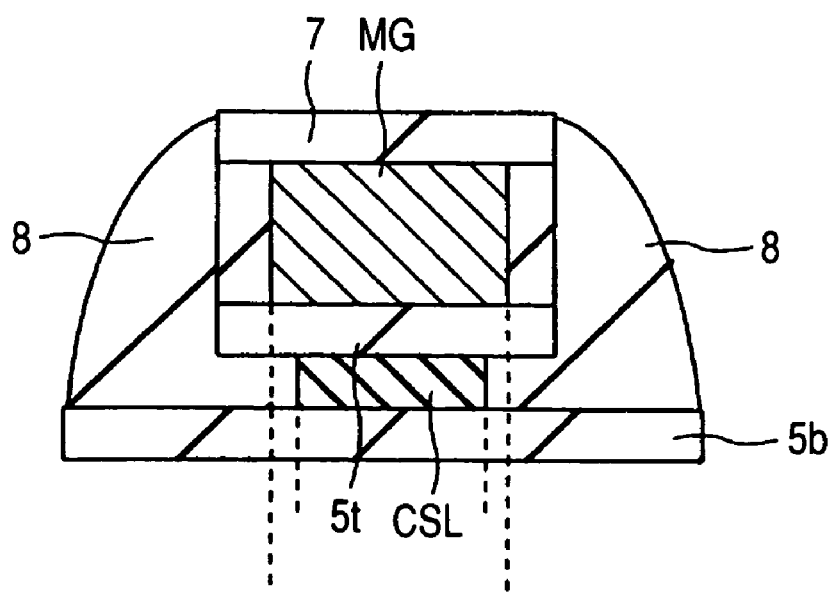
FIG. 70 is an enlarged cross section of a main portion of a memory cell in a semiconductor device representing another embodiment of the invention.
Figure 74:
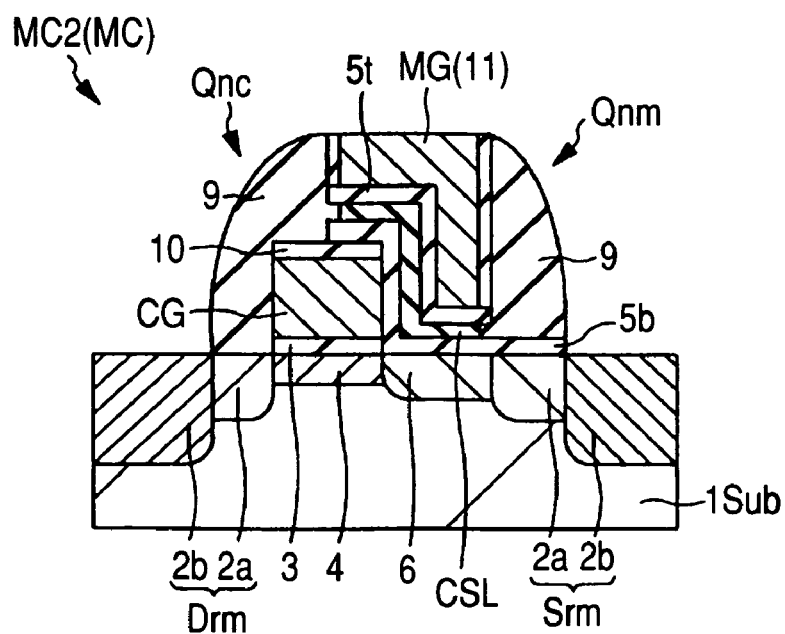
FIG. 74 is a cross section of the main portion during a step in the process of manufacturing the semiconductor device, subsequent to the step of FIG. 73.

After that, by performing processes similar to those described in connection with the third embodiment, as shown in FIG. 74, a memory cell MC2 of the split-gate electrode type is formed. Also, in the case of the ninth embodiment, as shown in FIG. 74, the side surface parts of the memory gate electrode MG are oxidized by the oxidizing process after patterning the charge storage layer CSL, and the dimension in the width direction of the memory gate electrode MG becomes slightly smaller than the design value. However, also in the ninth embodiment, the dimension in the width direction of the charge storage layer CSL is set to be smaller in consideration of the above phenomenon. Thus, finally, the side surfaces at both ends in the width direction of the charge storage layer CSL almost coincide with those at both ends in the width direction of the memory gate electrode MG, and they are not projected to the outside of the memory gate electrode MG. With this configuration, at the time of the erasing operation of the memory cell MC2 of the split-gate type, the data erasing speed can be improved in a manner similar to the eighth embodiment. The rate of occurrence of a poor erasing operation can be reduced, and the yield of the semiconductor device can be improved. Obviously, also in the ninth embodiment, portions at both ends of the charge storage layer CSL may be finally positioned on the inside of the both ends of the memory gate electrode MG, as shown in FIG. 70.

Tenth Embodiment

As a tenth embodiment, which represents a modification of the eighth embodiment, an example of applying the method of the eighth embodiment to the method of forming a memory cell MC3 of the split-gate electrode type of FIG. 5 will be described.

Figure 75:
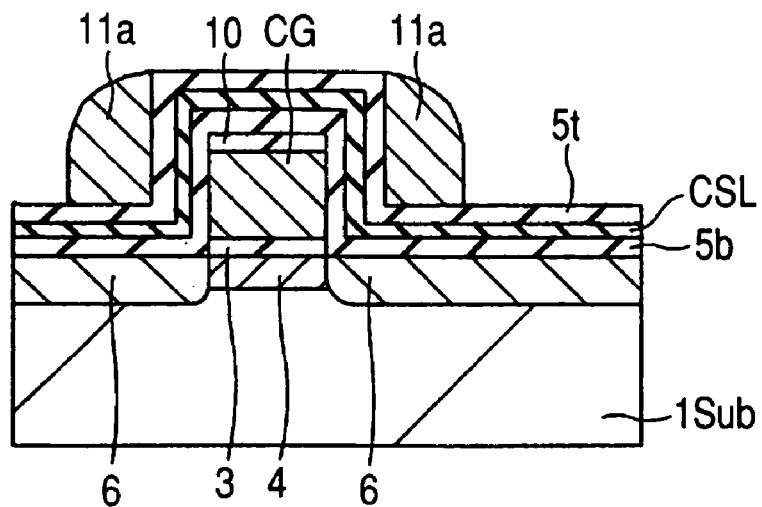
FIG. 75 is a cross section of a main portion during a step in the process of manufacturing a semiconductor device representing another embodiment of the invention.
Figure 76:
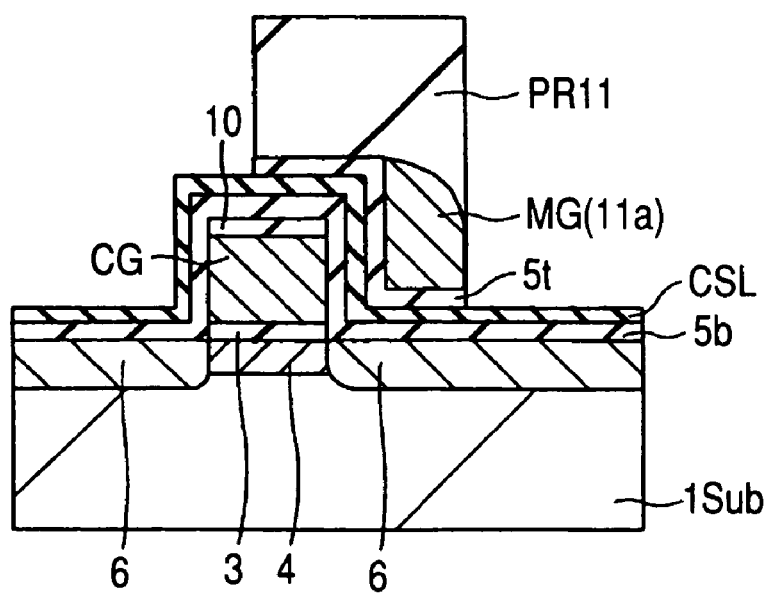
FIG. 76 is a cross section of the main portion during a step in the process of manufacturing the semiconductor device, subsequent to the step of FIG. 75.

First, in a manner similar to the ninth embodiment, processes up to the process of depositing the conductive film 11 of FIG. 71 are performed. After that, the conductive film 11 is etched back by an anisotropic dry etching process, thereby forming side walls 11a of the conductive film 11 on the side surface sides of the control gate electrode CG, as shown in FIG. 75. Subsequently, as shown in FIG. 76, a resist pattern PR11 for forming the memory gate electrode MG is formed on the main surface of the substrate 1Sub by a lithography technique. The resist pattern PR11 is used as an etching mask, and the conductive film 11a and the insulating film 5t exposed from the etching mask are etched in a manner similar to the eighth and ninth embodiments, thereby patterning the memory gate electrode MG (11a) and the insulating film 5t.

Figure 77:
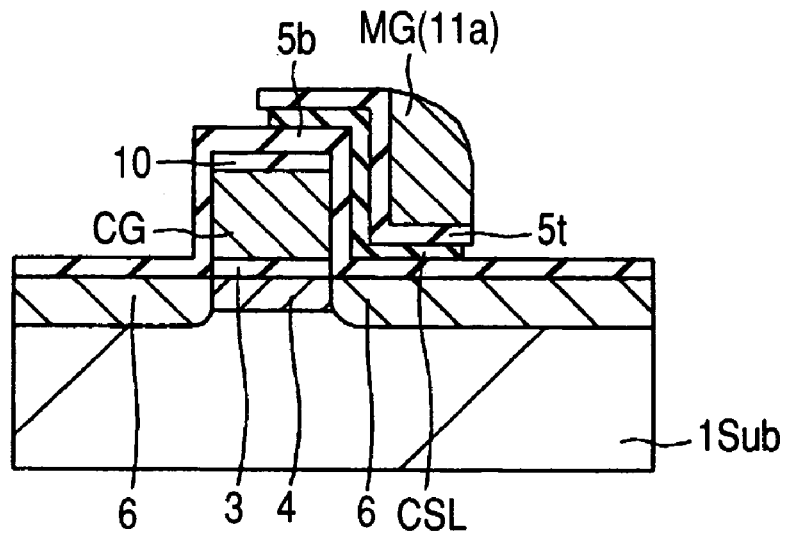
FIG. 77 is a cross section of the main portion during a step in the process of manufacturing the semiconductor device, subsequent to the step of FIG. 76.

The resist pattern PR11 is removed, and, after that, the charge storage layer CSL is selectively etched by a wet etching process in a manner similar to the eighth and ninth embodiments, thereby patterning the charge storage layer CSL, as shown in FIG. 77. In the tenth embodiment, an over-etching process is performed so that the exposed side surfaces of the charge storage layer CSL are positioned below the insulating film 5t and recessed from the insulating film 5t. With this configuration, an inconvenience such that one side surface in the width direction of the charge storage layer CSL is positioned on the outside of one side surface in the width direction of the memory gate electrode MG can be prevented in a manner similar to the eighth and ninth embodiments.

Figure 78:
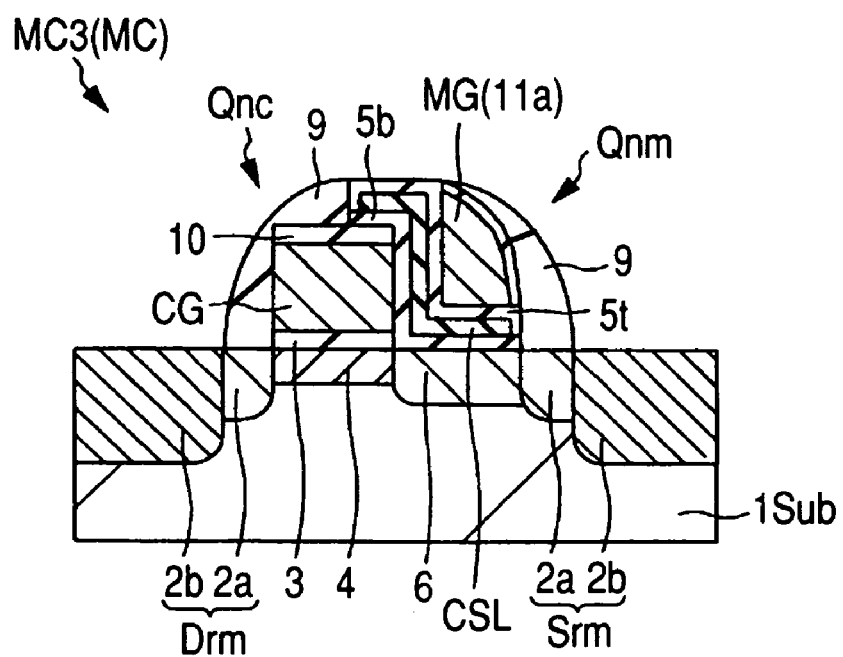
FIG. 78 is a cross section of the main portion during a step in the process of manufacturing the semiconductor device, subsequent to the step of FIG. 77.

After that, by performing processes similar to those described in connection with the third embodiment, the memory cell MC3 of the split-gate type is formed, as shown in FIG. 78. Also, in the case of the tenth embodiment, as shown in FIG. 78, the surface portion of the memory gate electrode MG is oxidized by the oxidizing process performed after patterning of the charge storage layer CSL and the dimension in the width direction of the memory gate electrode MG becomes slightly smaller than the design value. However, also in the tenth embodiment, the dimension in the width direction of the charge storage layer CSL is reduced in consideration of the phenomenon. Thus, the side surface at one end in the width direction of the charge storage layer CSL finally almost coincides with the side surface in the width direction of the memory gate electrode MG and is not projected to the outside of the memory gate electrode MG. Therefore, at the time of the erasing operation of the split-gate type memory cell MC3, the data erasing speed can be increased like that of the eighth and ninth embodiments. The rate of occurrence of a poor erasing operation can also be reduced, and the yield of the semiconductor device can be improved. Also, in the tenth embodiment, as described with reference to FIG. 70, the side surface at one end of the charge storage layer CSL may finally be positioned on the inner side of the side surface at one end of the memory gate electrode MG.

Eleventh Embodiment

As an eleventh embodiment, an example of solving another problem which has been found for the first time by the inventors of the present invention, in a split-gate type memory cell, will be described. The problem is that, when the impurity concentration in the memory gate electrode is high, the data erase time is long.

Figure 79:
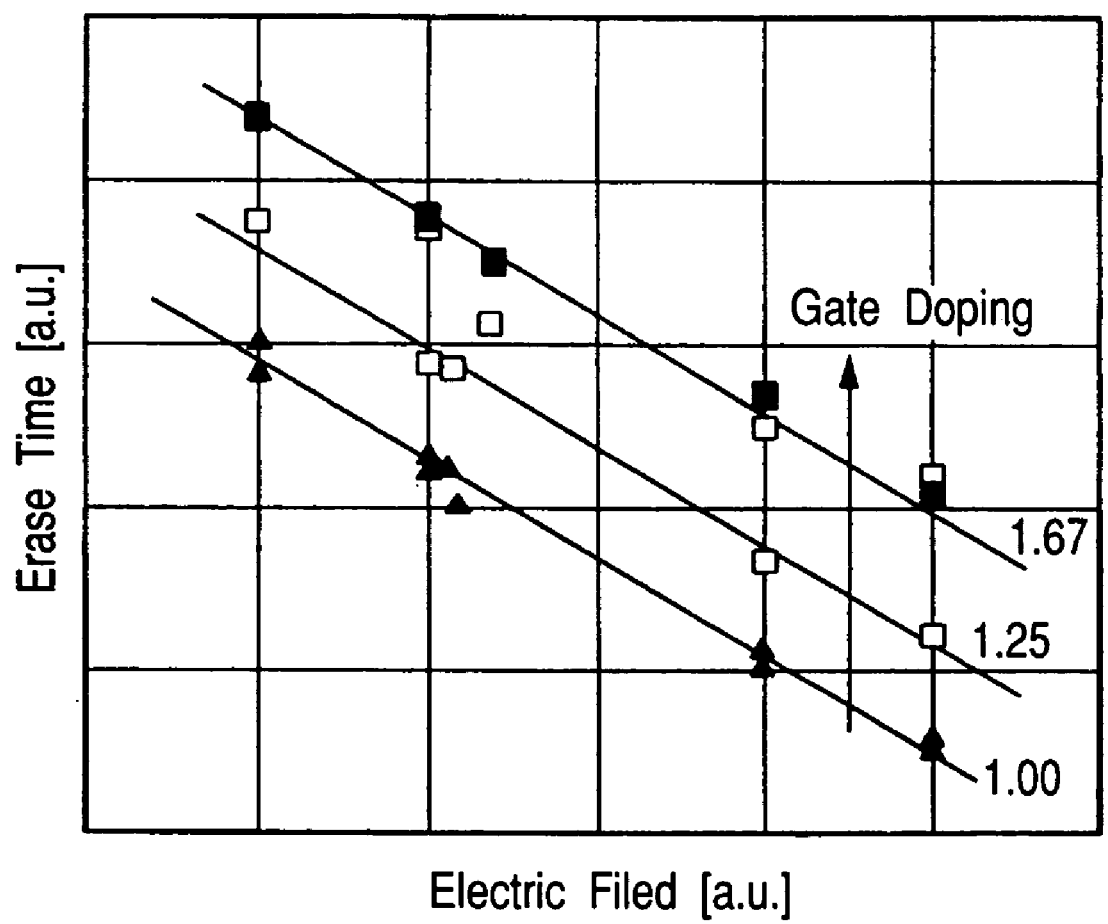
FIG. 79 is a diagram illustrating another problem which occurs in the process of forming the memory cell of FIG. 1 and is a graph showing the dependency on the impurity concentration in a memory gate electrode in an erasing operation.
Figure 80:
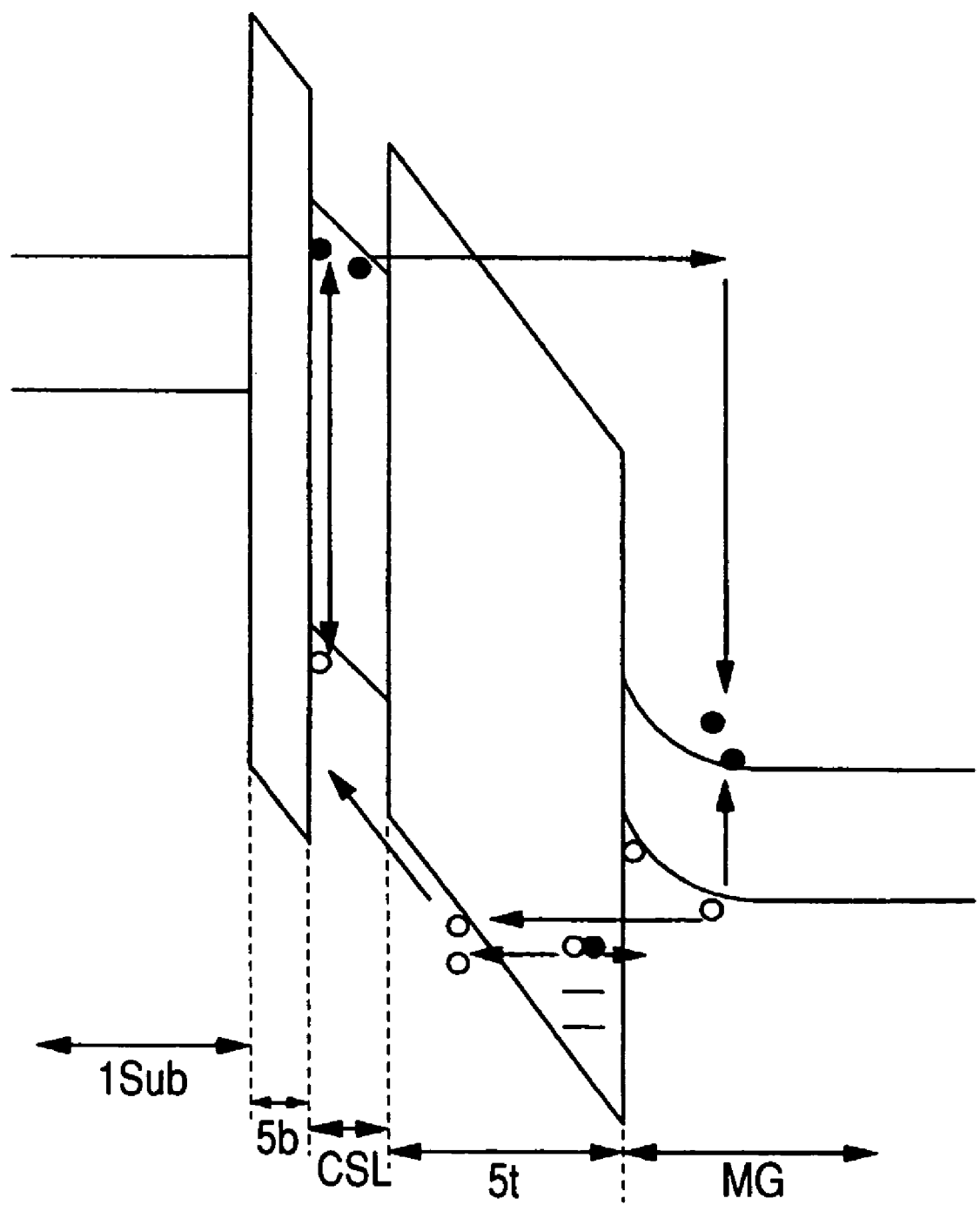
FIG. 80 is a diagram showing an energy band of a memory gate electrode and a charge storage layer near the memory gate electrode.

FIG. 79 shows dependency of the erase characteristics of the memory cell of the split-gate electrode type on the impurity concentration of the memory gate electrode. The material of the memory gate electrode is, for example, n-type low-resistant polysilicon. Charges contributing to data storage are electrons. As shown by the arrow in FIG. 79, it is understood that, as the concentration of impurity ions implanted into the memory gate electrode increases, the erase speed decreases. The reason why such a phenomenon occurs is estimated to be that, in the case of the erasing method of extracting electrons contributing to data storage to the memory gate electrode side, both an effect produced by the extraction of electrons and an effect produced by re-combination with positive holes injected from the memory gate electrode side exert an influence on the erasing operation. FIG. 80 is an energy band diagram. Blank circles indicate positive holes and painted circles indicate electrons. It is considered that the erase speed changes when positive holes injected from the memory gate electrode MG are recombined with electrons extracted from the charge storage layer CSL to generate electron-hole pairs, when the electrons in the charge storage layer CSL flow to the memory gate electrode MG side via a defect level in the insulating film 5t near the memory gate electrode MG (tunnel phenomenon), and the like. Therefore, by depleting the interface with the insulating film 5t of the memory gate electrode MG, the erase speed can be controlled.

As a specific example, the memory gate electrode MG in the memory cell MC in any of the first to tenth embodiments is made of n-type polysilicon and the concentration of the n-type impurity in the memory gate electrode MG is decreased. Alternately, the memory gate electrode MG in the memory cell MC in any of the first to tenth embodiments is made of n-type polysilicon, and the impurity concentration, in the interface region with the insulating film 5*t*, of the memory gate electrode MG is set to be lower than that in another region in the same memory gate electrode MG. Specifically, impurity concentration variations are created intentionally in the memory gate electrode MG, and the impurity concentration in a region (first region) on the charge storage layer CSL side of the memory gate electrode MG is relatively lower than that in the other region (second region). With such a configuration, by both actions of extraction of electrons in the charge storage layer CSL and recombination of positive holes injected from the memory gate electrode MG side with electrons contributing to data storage, data is erased. Thus, the erase speed can be increased. In this case as well, the rate of occurrence of a poor erasing operation can be lowered, so that the yield of the semiconductor device can be improved.

The inventors herein have examined and found that the concentration of the n type impurity in the whole memory gate electrode MG or in the interface region with the insulating film 5*t* is, for example, about $1 \times 10^{18}/cm^3$ to $2 \times 10^{20}/cm^3$, preferably, $8 \times 10^{19}/cm^3$ to $1.5 \times 10^{20}/cm^3$. When the concentration is lower than the lower limit value, a problem in another operation, including erasing, occurs, such as depletion or an increase in the resistance of the memory gate electrode MG. When the concentration is higher than the upper limit value, a problem in the erasing operation occurs.

In a general memory cell of the split-gate electrode type MONOS structure, as examined by the inventors herein, the memory gate electrode is formed in the same process for forming the gate electrode of another MIS transistor as a component of a peripheral circuit and the like. Consequently, the concentration of the n-type impurity contained in the memory gate electrode is, for example, $2.5 \times 10^{20}/cm^3$ or higher and is higher than that in the eleventh embodiment. In contrast, in the eleventh embodiment, the memory gate electrode MG and the gate electrode of the other MIS are formed separately. The impurity concentration of the memory gate electrode MG is set to be low, as described above. More specifically, a polysilicon film, which is doped with an n-type impurity of relatively low concentration, which becomes the memory gate electrode MG, and a polysilicon film, which is doped with an n-type impurity of relatively high concentration, which becomes the gate electrode of the other MIS, are formed separately by CVD and then patterned. Obviously, it is also possible to simultaneously pattern the memory gate electrode MG and the gate electrode of the other MIS on the same substrate and dope the gate electrode side of the other MIS with n-type impurity by ion implantation and the like in a post process to make the concentration of the n-type impurity in the gate electrode of the other MIS relatively high. The film forming method by ion implantation has an advantage in that control of the impurity concentration in the gate electrode of the other MIS is easier as compared with the case of forming the polysilicon films separately by CVD. In any case, in the eleventh embodiment, the concentration of the n-type impurity in the memory gate electrode MG of the memory cell MC and that of the n-type impurity in the gate electrode of the other MIS formed in the same substrate are intentionally to be different from each other. The concentration of the n-type impurity in the memory gate electrode MG is intentionally set to be lower than that of the n-type impurity in the gate electrode of the other MIS.

Similarly, by setting the memory gate electrode MG of the memory cell MC to the p type in the first to tenth embodiments, the erasing speed can be increased by an action similar to the above. The inventors herein have examined and found that in the case where the memory gate electrode MG is of the p type, the concentration of the p-type impurity in the memory gate electrode MG is, for example, preferably about $1 \times 10^{18}/cm^3$ or higher. Therefore, in the case where there is an MIS having the p-type gate electrode as another MIS formed on the same substrate, the concentration of the p-type impurity in the memory gate electrode MG in the memory cell MC may be intentionally set to be higher than that of the p-type impurity in the p-type gate electrode in the other MIS.

Twelfth Embodiment

As a twelfth embodiment, the case where the impurity concentration is intentionally varied in the same memory gate electrode MG, as described in connection with the eleventh embodiment, and the impurity concentration in a region on the charge storage layer CSL side of the memory gate electrode MG is relatively low, will be described.

Figure 81:
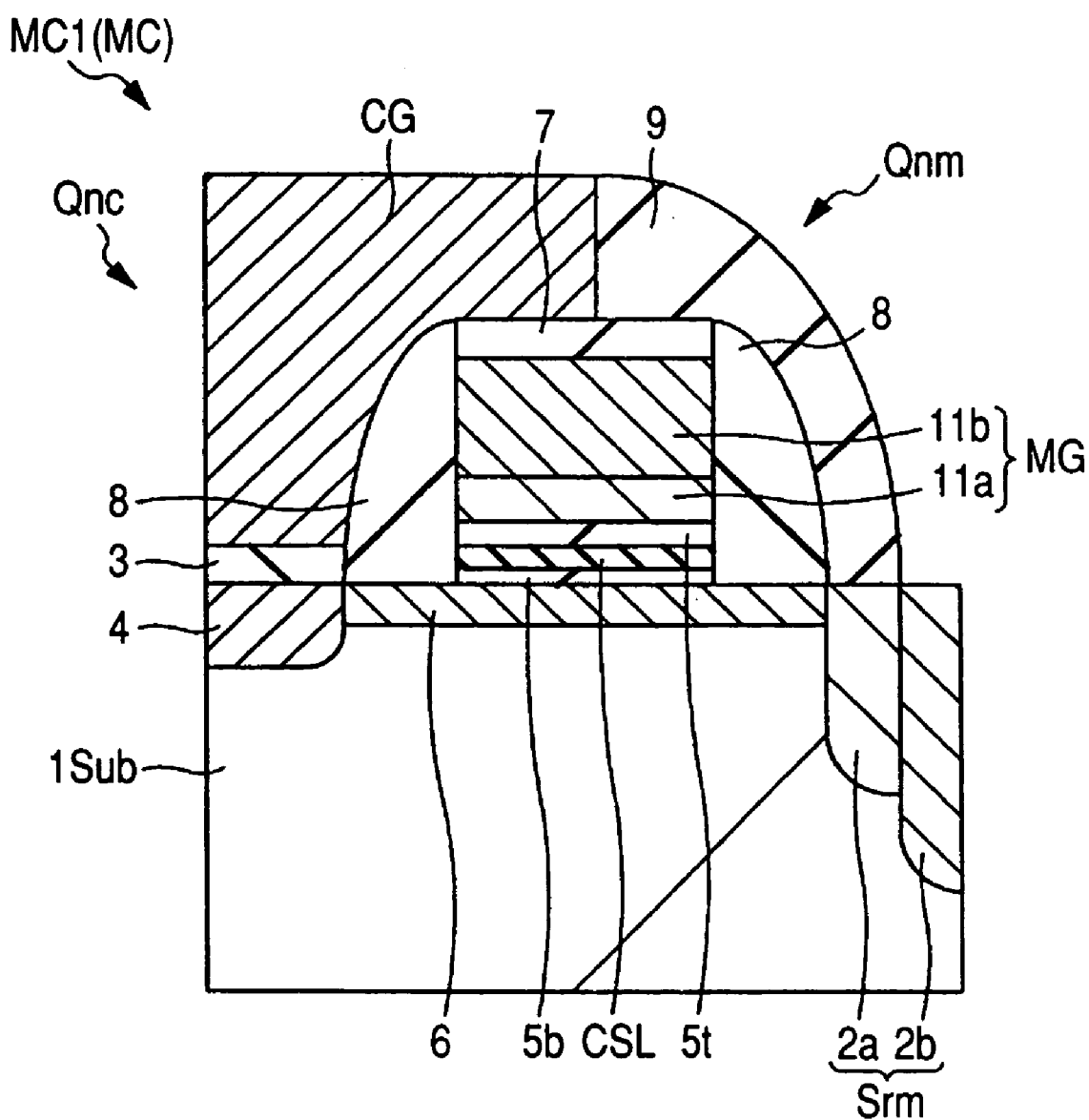
FIG. 81 is a cross section of a main portion of a semiconductor device representing another embodiment of the invention.

FIG. 81 shows an example of a cross section of a main portion of the memory cell MC1 of the twelfth embodiment. In this case, the memory gate electrode MG has a stacked structure consisting of conductive layers 11*a* and 11*b*. Each of the conductive layers 11*a* and 11*b* is made of low-resistive n-type polysilicon. The impurity concentration is intentionally varied. The concentration of the n-type impurity of the lower layer, that is, the conductive layer (first region) 11*a* which is in contact with the insulating film 5*t* is lower than that of the n-type impurity in the upper conductive layer (second region) 11*b*. With this configuration, the erase speed can be increased in a manner similar to the eleventh embodiment. In addition, the yield of the semiconductor device can also be improved. Further, in the twelfth embodiment, although the case where the whole memory gate electrode MG is made of an n-type impurity of low concentration has been described in connection with the eleventh embodiment, since the conductive layer 11*b* having a high impurity concentration is provided for the memory gate electrode MG, the resistance of the memory gate electrode MG and the contact resistance with a wiring can also be reduced.

Such conductive layers 11*a* and 11*b* can be formed by, for example, the following first and second methods. The first method is a method of depositing the conductive films 11*a* and 11*b* separately by CVD. To be more specific, in the process of depositing the conductive film 11, as described with reference to FIG. 9 and the like, the conductive films 11*a* and 11*b* are deposited in order. At this time, the concentration of the n-type impurity in each of the conductive films 11*a* and 11*b* is adjusted. After that, the insulating film 7 is deposited on the conductive film 11*b* and the stacked film is patterned in a manner similar to the above, thereby forming the memory gate electrode MG. The second method is a method of forming an impurity concentration distribution by the ion implantation method. Specifically, as described with reference to FIG. 9 and the like, the conductive film 11 is deposited, and, at the time of implanting the n-type impurity by the ion implantation method and the like into the conductive film 11, by changing the parameters, such as the ion implantation energy and dose, the conductive films 11*a* and 11*b* having different n-type impurity concentrations are formed in the conductive film 11. After that, the insulating film 7 is deposited on the conductive film 11 and the stacked film is patterned in a manner similar to the above, thereby forming memory gate electrode MG. In the case of employing the ion implantation method, the impurity concentration and formation position of each of the conductive layers 11a and 11b can be easily controlled, so that the conductive layers 11a and 11b can be formed more ideally.

Also, in the twelfth embodiment, the conductive layers 11a and 11b may be made of p-type low-resistant polysilicon. In this case, the concentration of the p-type impurity of the conductive film 11a, which serves as the lower layer in contact with the insulating film 5t, is set to be higher than that of the p-type impurity of the conductive film 11b, which serves as an upper layer.

Thirteenth Embodiment

A thirteen embodiment, which represents a modification of the twelfth embodiment, will be described.

Figure 82:
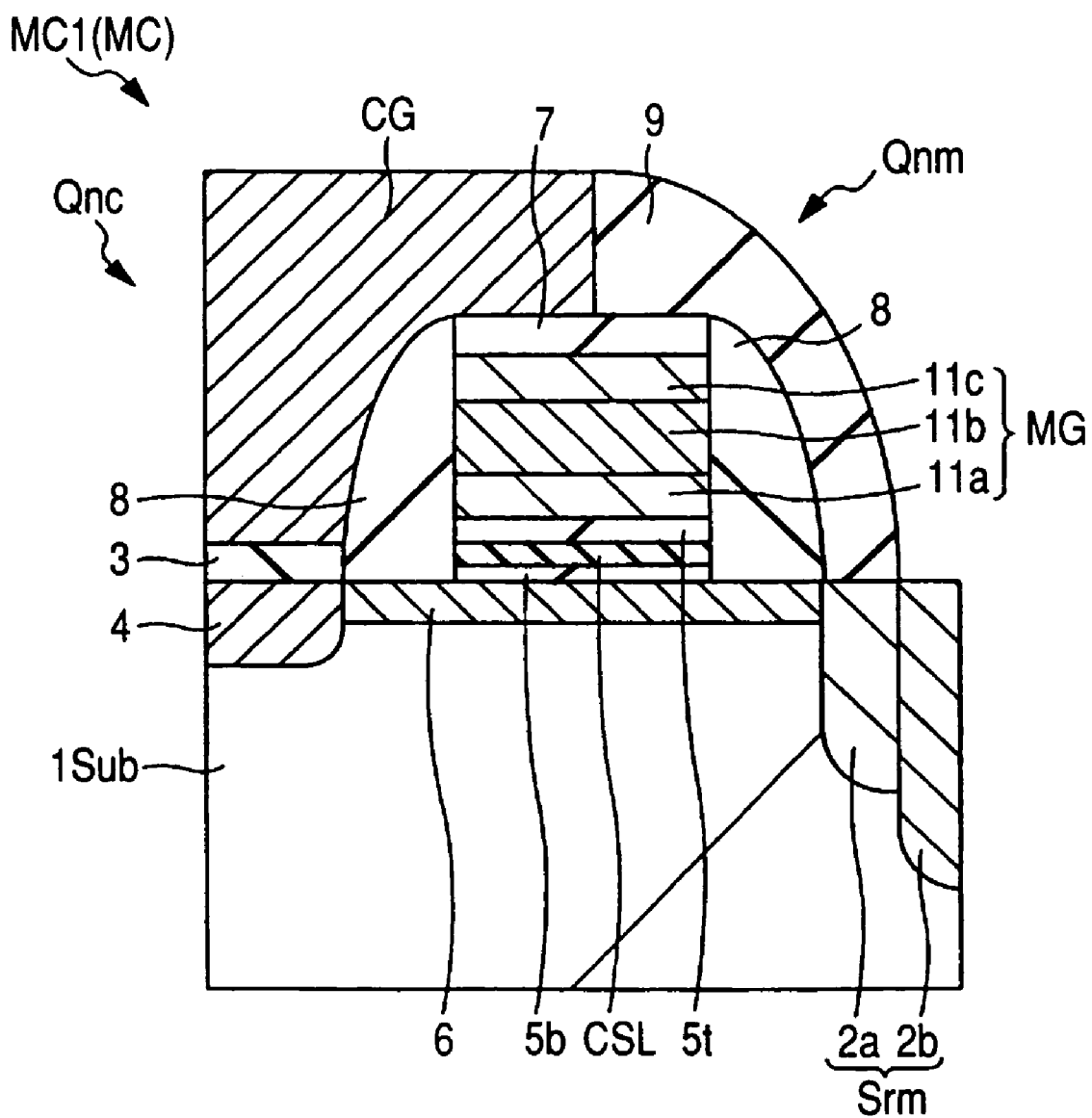
FIG. 82 is a cross section of a main portion of a semiconductor device representing another embodiment of the invention.

FIG. 82 shows an example of the cross section of a main portion of the memory cell MC1 of the thirteenth embodiment. In this case, the memory gate electrode MG has a stacked configuration of three conductive layers 11a, 11b, and 11c. The conductive layers 11a, 11b, and 11c are made of n-type low-resistant polysilicon and the impurity concentrations of the conductive layers 11a, 11b, and 11c are intentionally made different from each other. The concentration of the n-type impurity of the conductive layer (first region) 11a of the lowest layer (that is, the layer which is in contact with the insulating film 5t) and the conductive layer 11c as the uppermost layer is lower than that of the n-type impurity of the intermediate conductive layer (second region) 11b. The concentrations of the n-type impurities in the conductive films 11a and 11c may be the same or different from each other. With this arrangement, the erase speed can be increased in a manner similar to the eleventh and twelfth embodiments. In addition, the yield of the semiconductor device can also be improved.

The reason why the concentration of the uppermost conductive layer 11c is set to be low is to avoid a case where, when the polysilicon layer of high concentration exists as the uppermost layer, a water mark remains in the surface of the polysilicon layer of high concentration after a cleaning process, or abnormal oxidation occurs in the polysilicon layer of high concentration. In short, in the thirteenth embodiment, by lowering the impurity concentration of the uppermost conductive layer 11c, inconveniences in the process of manufacturing the semiconductor device can be avoided, so that the reliability and yield of the semiconductor device can be improved.

Since the method of forming the conductive layers 11a, 11b, and 11c is the same as that in the twelfth embodiment, the description thereof will not be repeated.

Also, in the thirteenth embodiment, the conductive layers 11a, 11b, and 11c may be made of the p-type low-resistant polysilicon. In this case, the concentration of the p-type impurity in the conductive film 11a, which serves as a lower layer, which is in contact with the insulating film 5t is set to be higher than that of the p-type impurity in the conductive films 11b and 11c, which serve as upper layers.

Fourteenth Embodiment

A fourteenth embodiment, which represents a modification of the twelfth embodiment, will be described.

Figure 83:
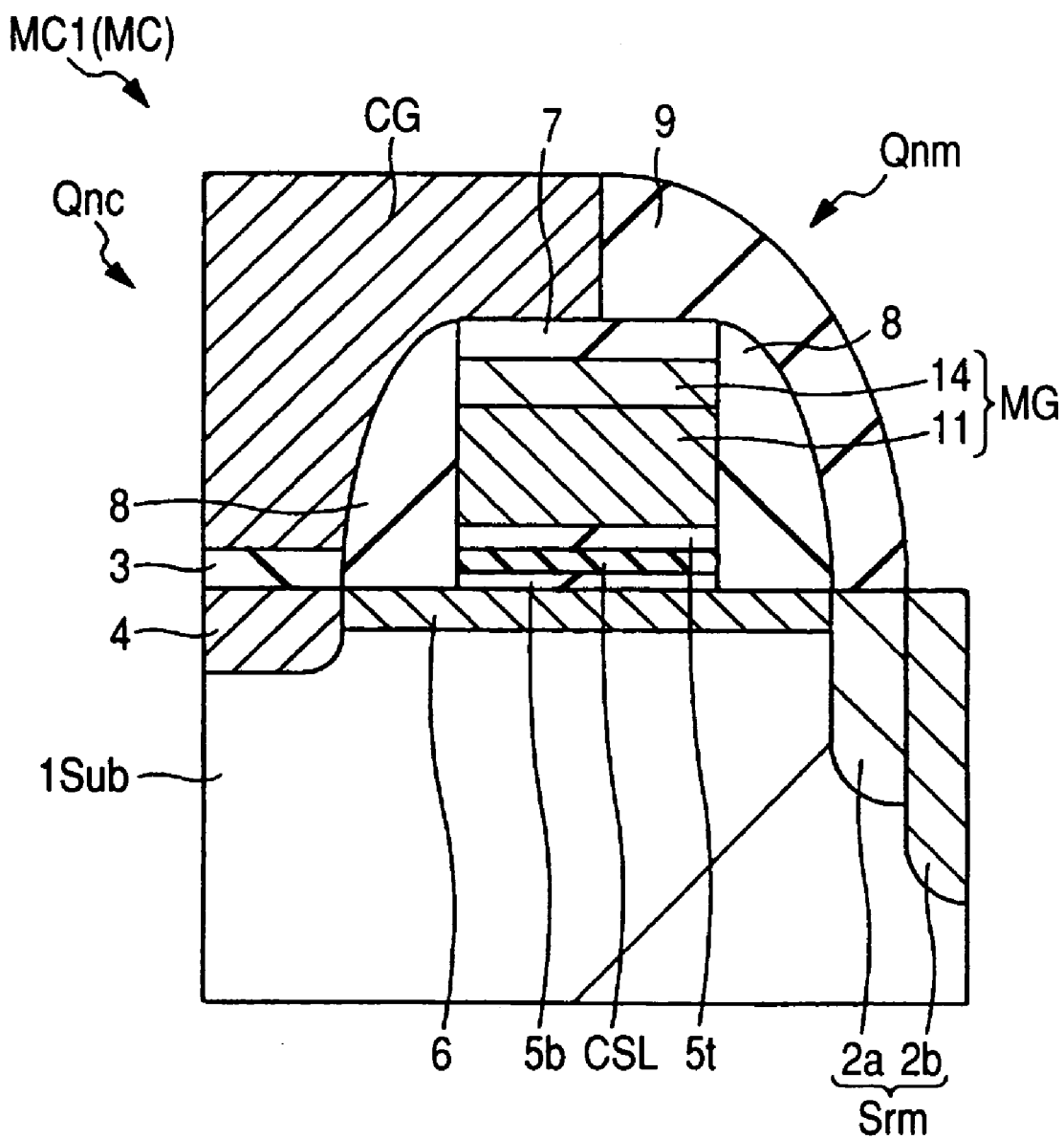
FIG. 83 is a cross section of a main portion of a semiconductor device representing another embodiment of the invention.

FIG. 83 shows an example of the cross section of a main portion of the memory cell MC1 of the fourteenth embodiment. In this case, the memory gate electrode MG has a stacked structure, consisting of the conductive layer 11 and the silicide layer 14. The conductive film 11 is made of, for example, n-type low-resistant polysilicon and the concentration of the n-type impurity of the conductive film 11 is set to be low, as described in connection with the eleventh and twelfth embodiments. The silicide layer 14 is made of, for example, cobalt silicide, tungsten silicide, and the like. Even when the concentration of the n-type impurity in the conductive film 11 is set to be low, as described in connection with the eleventh and twelfth embodiments, by providing the low-resistant silicide layer 14 on the conductive film 11, the total resistance of the memory gate electrode MG can be suppressed to a low level. Also, in the fourteenth embodiment, a structure in which the conductive film 11 may be made of p-type polysilicon and the silicide layer 14 is provided on the conductive film 11 may be employed.

Fifteenth Embodiment

A fifteenth embodiment, which represents a further modification of the twelfth embodiment, will be described.

Figure 84:
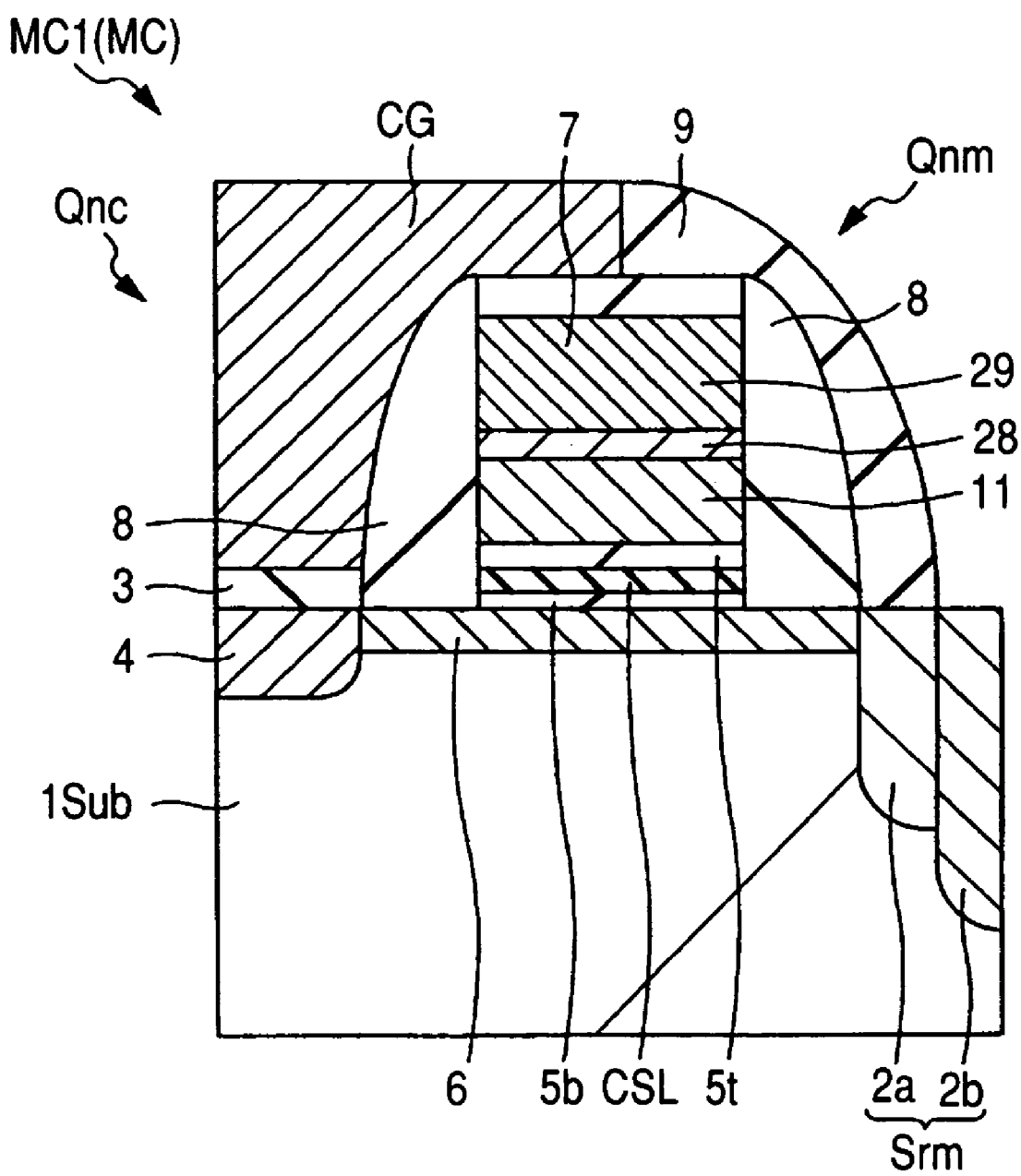
FIG. 84 is a cross section of a main portion of a semiconductor device representing another embodiment of the invention.

FIG. 84 shows an example of the cross section of a main portion of the memory cell MC1 of the fifteenth embodiment. In this case, the memory gate electrode MG has a stacked structure of three layers: the conductive film 11, a barrier metal layer 28, and a metal layer 29. The conductive film 11 is made of, for example, low-resistant polysilicon of the n type and the concentration of the n-type impurity is set to be low, as described in connection with the eleventh and twelfth embodiments. The barrier metal layer 28 is made of, for example, tungsten nitride (WN). The metal layer 29 is made of, for example, tungsten. Even when the concentration of the n-type impurity in the conductive film 11 is set to be low, as described in connection with the eleventh and twelfth embodiments, by providing the low-resistant metal layer 29 on the conductive film 11, the total resistance of the memory gate electrode MG can be largely lowered. Also, in the fifteenth embodiment, a structure in which the conductive film 11 is made of polysilicon of the p type and the metal layer 29 is provided over the conductive film 11 via the barrier metal layer 28 may be also employed.

Sixteenth Embodiment

As a sixteenth embodiment, an example of solving a further problem which has been found for the first time by the inventors herein, in the memory cell of the split-gate electrode type, will be described. The problem is that deterioration in the drain current of the memory cell easily occurs.

In the memory cell of the NOMOS structure using silicon oxynitride (SiON) as the material of the charge storage layer CSL or insulating film 5t, when the rewriting operation is performed in a state where the interface level is created by the erasing operation, there is a case where the drain current Ids of the memory cell decreases. Consequently, it is necessary to design the memory cell in consideration of current deterioration when the memory cell is turned on.

Specifically, in the sixteenth embodiment, in the memory cell of the split-gate electrode type in which data is erased by an operation of moving charges stored in the charge storage layer into the memory gate electrode side, the lowest write level is set to be higher than the initial threshold voltage Vth of the memory cell. With this arrangement, deterioration in the drain current accompanying writing and erasing of data can be allowed. Therefore, the number of rewrite compensation times of data of the memory cell can be increased, and the life of the memory cell can be improved.

Figure 85:
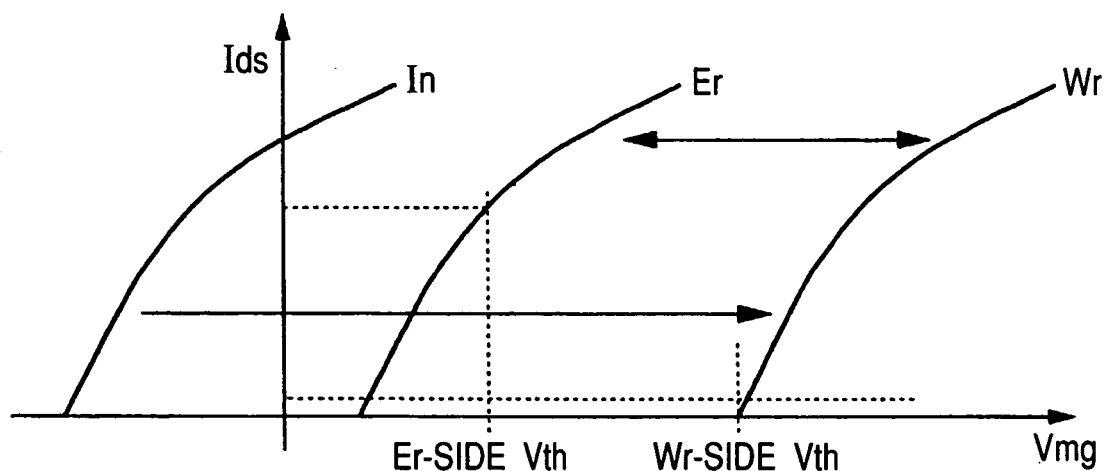
FIG. 85 is a diagram illustrating a write state and an erase state of a semiconductor device representing still another embodiment of the invention.

The structure of the memory cell of the sixteenth embodiment (including the reading, writing, and erasing operations) is the same as that described in connection with the first to fifteenth embodiments. FIG. 85 shows the write and erase states of the memory cell of the sixteenth embodiment. An initial state In is a state where the threshold voltage Vth is low. An erase state after the writing operation is performed once is not set to the same state as the initial state In but is set to a state higher than the initial state. In the case of multivalue storage, the state where the write level is the lowest is higher than the initial state In. In this method, even if the drain current Ids decreases due to degradation caused by rewriting and the like, because of a large allowance, degradation in the operation of the semiconductor device cannot be seen.

Although the invention achieved by the inventors has been specifically described herein on the basis of various embodiments, obviously, the invention is not limited to the foregoing embodiments, but can be variously modified without departing from the gist of the invention.

For example, the case of applying the invention to a memory cell having the MONOS structure has been described in connection with the first to sixteenth embodiments. The invention can also be applied to a memory cell of an MNOS (Metal Nitride Oxide Semiconductor) structure having a configuration in which a silicon oxide film, a silicon nitride film (or silicon oxynitride film) for storing charges, and a low-resistant polysilicon film (or the film having the polyside or polymetal structure as described above) are stacked in order on a substrate.

In the first to tenth embodiments, the case of a memory cell structure in which charges contributing to data storage are extracted to the memory gate electrode in the erasing operation has been described. However, the invention is not limited to this example and can also be applied to a memory cell structure in which charges contributing to data storage are extracted to the substrate side in the erasing operation.

In the first to sixteenth embodiments, a case where the charge storage layer is formed by a nitride film has been described. However, the invention is not limited to such a case and can also be applied to a configuration where, for example, a plurality of nano crystals formed in dots are provided in a silicon oxide film. The nano crystal is a part in which charges contributing to data are captured like a floating gate electrode in a general nonvolatile memory. Each of the nano crystals is formed by, for example, CVD. Since the nano crystals are formed so as to be physically spaced from each other (that is, there are discrete trap levels), even if a leakage path is created at the time of holding data, only a part of the charges is lost. Thus, the nano crystal has an excellent data retaining characteristic. Also, at the time of erasing and writing of data, characteristics are averaged by a number of nano crystals, so that the influences of structural variations, such as the diameter of a nano crystal and the insulating film and the random behavior are not easily exerted. Thus, the yield of a semiconductor device having the memory cell can be improved.

Obviously, each of the first to sixteenth embodiments may be combined with one or more of the other embodiments.

Although the case where the invention achieved by the inventors herein is applied to an IC card in the field of utilization as the background of the invention has been described above, the invention is not limited to such an example and can be applied to a memory provided in a mobile communication device such as a portable telephone or an information processor, such as a personal computer.

The effects obtained by a representative one of the aspects of the invention disclosed in the specification will be briefly described as follows.

In short, the electric characteristics of a semiconductor device having a nonvolatile memory cell including first and second field effect transistors, which are arranged so as to be adjacent to each other in a semiconductor substrate, can be improved.

The invention claimed is:

1. A semiconductor device having a nonvolatile memory cell including first and second field effect transistors which are adjacent to each other, comprising:
   (a) a first gate electrode as a gate electrode of said first field effect transistor, which is formed over a semiconductor substrate;
   (b) a first semiconductor region of a first conduction type formed in said semiconductor substrate below said first gate electrode;
   (c) a second gate electrode as a gate electrode of said second field effect transistor, which is formed over said semiconductor substrate; and
   (d) a second semiconductor region of a second conduction type opposite to the first conduction type formed in said semiconductor substrate below said second gate electrode,
   wherein a main surface of the semiconductor substrate in which said second semiconductor region is formed so as to be lower than a main surface of the semiconductor substrate in which said first semiconductor region is formed.

2. A semiconductor device having a nonvolatile memory cell including first and second field effect transistors which are adjacent to each other, comprising:
   (a) a first gate electrode as a gate electrode of said first field effect transistor, which is formed over a semiconductor substrate;
   (b) a first semiconductor region of a first conduction type formed in said semiconductor substrate below said first gate electrode;
   (c) a second gate electrode as a gate electrode of said second field effect transistor, which is formed over said semiconductor substrate via a gate insulating film; and
   (d) a second semiconductor region of a second conduction type opposite to the first conduction type formed in said semiconductor substrate below said second gate electrode,
   wherein an end portion of said second semiconductor region at the side of said second field effect transistor coincides with a position of an end portion of said second gate electrode at said first field effect transistor side and said gate insulating film or extends so as to be partly below a region of said second gate electrode and said gate insulating film.

3. The semiconductor device according to claim 1 or 2, wherein said first field effect transistor is a field effect transistor for a memory, said first semiconductor region is a region for forming a channel of said field effect transistor for a memory, and a charge storage layer for storing charges contributing to data storage is formed between a first gate electrode of said field effect transistor for a memory and a semiconductor substrate, and wherein said second field effect transistor is a field effect transistor for selecting a memory cell, and said second semiconductor region is a region for forming the channel of said field effect transistor for selecting a memory cell.

4. The semiconductor device according to claim 1 or 2,
wherein said first field effect transistor is a field effect transistor for a memory, and a charge storage layer for storing charges contributing to data storage is formed between a first gate electrode of said field effect transistor for a memory and the semiconductor substrate,
wherein said second field effect transistor is a field effect transistor for selecting a memory cell, and said first semiconductor region has functions of a region for forming the channel of said field effect transistor for a memory and semiconductor regions for a source and a drain of said field effect transistor for selecting a memory cell, and
wherein said second semiconductor region is a region for forming the channel of said field effect transistor for selecting a memory cell.

5. The semiconductor device according to claim 1 or 2,
wherein said first field effect transistor is a field effect transistor for a memory, said first semiconductor region is a region for forming the channel of said field effect transistor for a memory, and a charge storage layer for storing charges contributing to data storage is formed between a first gate electrode of said field effect transistor for a memory and the semiconductor substrate,
wherein said second field effect transistor is a field effect transistor for selecting a memory cell, and said second semiconductor region is a region for forming the channel of said field effect transistor for selecting a memory cell, and
wherein said charge storage layer includes discrete trap levels.

6. The semiconductor device according to claim 1 or 2,
wherein said first field effect transistor is a field effect transistor for a memory, said first semiconductor region is a region for forming the channel of said field effect transistor for a memory, and a charge storage layer for storing charges contributing to data storage is formed between a first gate electrode of said field effect transistor for a memory and a semiconductor substrate,
wherein said second field effect transistor is a field effect transistor for selecting a memory cell, and said second semiconductor region is a region for forming the channel of said field effect transistor for selecting a memory cell, and
wherein said charge storage layer is made of silicon nitride.

7. The semiconductor device according to claim 1 or 2,
wherein said first field effect transistor is a field effect transistor for a memory, said first semiconductor region is a region for forming the channel of said field effect transistor for a memory, and a charge storage layer for storing charges contributing to data storage is formed between a first gate electrode of said field effect transistor for a memory and the semiconductor substrate,
wherein said second field effect transistor is a field effect transistor for selecting a memory cell, and said second semiconductor region is a region for forming the channel of said field effect transistor for selecting a memory cell, and
wherein a second gate electrode of said field effect transistor for selecting a memory cell is provided over said first gate electrode of said field effect transistor for a memory.

8. The semiconductor device according to claim 1 or 2,
wherein said first field effect transistor is a field effect transistor for a memory, said first semiconductor region is a region for forming the channel of said field effect transistor for a memory, and a charge storage layer for storing charges contributing to data storage is formed between a first gate electrode of said field effect transistor for a memory and the semiconductor substrate,
wherein said second field effect transistor is a field effect transistor for selecting a memory cell, and said second semiconductor region is a region for forming the channel of said field effect transistor for selecting a memory cell, and
wherein the first gate electrode of said field effect transistor for a memory is provided over said second gate electrode of said field effect transistor for selecting a memory cell.

9. A semiconductor device having a nonvolatile memory cell including a charge storage layer for storing charges contributing to data storage between a gate electrode and a semiconductor substrate,
wherein a position of a side surface at an end in a width direction of said charge storage layer coincides with a position of a side surface at an end in a width direction of said gate electrode or is apart from the side surface at an end in the width direction of said gate electrode toward a center of said gate electrode.

10. A semiconductor device having a nonvolatile memory cell including a charge storage layer for storing charges contributing to data storage between a gate electrode and a semiconductor substrate,
wherein said charge storage layer is formed so that its whole region in plan view is included in a whole region of said gate electrode in plan view.

11. A semiconductor device having a nonvolatile memory cell including a charge storage layer for storing charges contributing to data storage between an n-type gate electrode and a semiconductor substrate,
wherein said n-type gate electrode has a first region near said charge storage layer and a second region as another region, and concentration of n-type impurity in said first region is lower than that of the n-type impurity in said second region.

12. A semiconductor device having a nonvolatile memory cell including a charge storage layer for storing charges contributing to data storage between an n-type gate electrode and a semiconductor substrate,
wherein concentration of n-type impurity in said n-type gate electrode is lower than that of the n-type impurity in a gate electrode of an n type in another field effect transistor provided over said semiconductor substrate.

13. A semiconductor device having a nonvolatile memory cell including a charge storage layer for storing charges contributing to data storage between an n-type gate electrode and a semiconductor substrate,
wherein concentration of n-type impurity in said n-type gate electrode is $1 \times 10^{18}/cm^3$ to $2 \times 10^{20}/cm^3$.

14. A semiconductor device having a nonvolatile memory cell including a charge storage layer for storing charges contributing to data storage between an n-type gate electrode and a semiconductor substrate,
wherein concentration of n-type impurity in said n-type gate electrode is $8 \times 10^{19}/cm^3$ to $1.5 \times 10^{20}/cm^3$.

15. The semiconductor device according to claim 9, 10, 11, 12, 13, or 14,
wherein said gate electrode is a memory gate electrode, a field effect transistor for selecting a memory cell is provided so as to be adjacent to said memory gate electrode, and charges in said charge storage layer are extracted to said memory gate electrode side, thereby erasing data.

16. A semiconductor device having a nonvolatile memory cell including a charge storage layer for storing charges contributing to data storage between an n-type gate electrode and a semiconductor substrate, wherein electrons in said charge storage layer are extracted to said gate electrode side and positive holes in said gate electrode are injected to the charge storage layer side and promoted to recombine with said electrons, thereby erasing data.

17. A semiconductor device having a nonvolatile memory cell including a charge storage layer for storing charges contributing to data storage between a gate electrode and a semiconductor substrate, wherein electrons in said charge storage layer are extracted to said gate electrode side, thereby erasing data, and said gate electrode is of a p type.

18. A semiconductor device having a nonvolatile memory cell in which data is erased by extracting charges stored in a charge storage layer to a gate electrode side, wherein the lowest write level is higher than an initial threshold voltage of said nonvolatile memory cell.

19. The semiconductor device according to claim 9, 10, 11, 12, 13, 14, 16, 17, or 18, wherein said charge storage layer includes discrete trap levels.

20. The semiconductor device according to claim 9, 10, 11, 12, 13, 14, 16, 17, or 18, wherein said charge storage layer is made of silicon nitride.

21. The semiconductor device according to claim 9, 10, 11, 12, 13, 14, 16, 17, or 18, wherein said gate electrode is a memory gate electrode, and a field effect transistor for selecting a memory cell is provided so as to be adjacent to said memory gate electrode.

22. The semiconductor device according to claim 9, 10, 11, 12, 13, 14, 16, 17, or 18, wherein said gate electrode is a memory gate electrode, a field effect transistor for selecting a memory cell is provided so as to be adjacent to said memory gate electrode, and wherein a control gate electrode of said field effect transistor for selecting a memory cell is provided over said memory gate electrode.

23. The semiconductor device according to claim 9, 10, 11, 12, 13, 14, 16, 17, or 18, wherein said gate electrode is a memory gate electrode, a field effect transistor for selecting a memory cell is provided so as to be adjacent to said memory gate electrode, and wherein said memory gate electrode is provided over a control electrode of said field effect transistor for selecting a memory cell.

24. The semiconductor device according to claim 9, 10, 11, 12, 13, 14, 16, 17, or 18, wherein said gate electrode is a memory gate electrode, a field effect transistor for selecting a memory cell is provided so as to be adjacent to said memory gate electrode, and wherein a first semiconductor region of a first conduction type provided in a semiconductor substrate below said memory gate electrode has a function of a region for forming a channel of a first field effect transistor for a memory having said memory gate electrode and a function of semiconductor regions for a source and a drain of said field effect transistor for selecting a memory cell.

25. The semiconductor device according to claim 9, 10, 11, 12, 13, 14, 16, 17, or 18, wherein a width of said gate electrode in a width direction of said gate electrode is larger than or equal to a width of said charge storage layer in the width direction of said gate electrode.

* * * * *